US009349805B2

(12) United States Patent
Ito et al.

(10) Patent No.: US 9,349,805 B2
(45) Date of Patent: May 24, 2016

(54) III-N DEVICE WITH DUAL GATES AND FIELD PLATE

(71) Applicant: Transphorm Japan, Inc., Yokohama, Kanagawa (JP)

(72) Inventors: Yuji Ito, Hachioji (JP); Yuko Matsui, Kodaira (JP); Yoshiyuki Kotani, Aizuwakamatsu (JP)

(73) Assignee: Transphorm Japan, Inc., Yokohama (JP)

( * ) Notice: Subject to any disclaimer, the term of this patent is extended or adjusted under 35 U.S.C. 154(b) by 14 days.

(21) Appl. No.: 14/167,843

(22) Filed: Jan. 29, 2014

(65) Prior Publication Data
US 2014/0353673 A1    Dec. 4, 2014

(30) Foreign Application Priority Data
May 30, 2013    (JP) .................................. 2013-114465

(51) Int. Cl.
H01L 29/66       (2006.01)
H01L 29/20       (2006.01)
H01L 29/778      (2006.01)
H01L 29/40       (2006.01)

(52) U.S. Cl.
CPC .......... *H01L 29/2003* (2013.01); *H01L 29/402* (2013.01); *H01L 29/66462* (2013.01); *H01L 29/7787* (2013.01)

(58) Field of Classification Search
CPC ............ H01L 29/66462; H01L 27/088; H01L 27/0605; H01L 29/778–29/8128; H01L 29/7831; H01L 29/2003; H01L 29/402; H01L 29/404; H01L 29/7787; H01L 29/7786
See application file for complete search history.

(56) References Cited

U.S. PATENT DOCUMENTS

| 8,502,323 | B2 * | 8/2013 | Chen ............................. 257/392 |
| 8,592,865 | B1 * | 11/2013 | Hughes ......................... 257/192 |
| 2002/0005528 | A1 * | 1/2002 | Nagahara ...................... 257/189 |
| 2008/0290372 | A1 * | 11/2008 | Makiyama ..................... 257/194 |
| 2009/0008679 | A1 * | 1/2009 | Saito ............................. 257/199 |
| 2010/0230717 | A1 * | 9/2010 | Saito ............................. 257/140 |
| 2010/0314666 | A1 * | 12/2010 | Saito et al. .................... 257/201 |
| 2011/0221011 | A1 * | 9/2011 | Bahat-Treidel et al. ...... 257/409 |
| 2012/0012858 | A1 * | 1/2012 | Inoue ............................. 257/76 |
| 2012/0018735 | A1 * | 1/2012 | Ishii .............................. 257/76 |

(Continued)

FOREIGN PATENT DOCUMENTS

JP    2002-009253 A    1/2002
JP    2008-219021 A    9/2008

*Primary Examiner* — Matthew Landau
*Assistant Examiner* — Grant Withers
(74) *Attorney, Agent, or Firm* — Fish & Richardson P.C.

(57) ABSTRACT

A semiconductor apparatus includes a substrate; a first semiconductor layer formed on the substrate and formed of a nitride semiconductor; a second semiconductor layer formed on the first semiconductor layer and formed of a nitride semiconductor; first and second gate electrodes, a source electrode, and a drain electrode formed on the second semiconductor layer; an interlayer insulation film formed on the second semiconductor layer; and a field plate formed on the interlayer insulation film. Further, the first gate electrode and the second gate electrode are formed between a region where the source electrode is formed and a region where the field plate is formed, an element isolation region is formed in the first and the second semiconductor layers which are between the first and the second gate electrodes, and the second gate electrode is electrically connected to the source electrode.

10 Claims, 95 Drawing Sheets

(56) References Cited

U.S. PATENT DOCUMENTS

| | | | |
|---|---|---|---|
| 2012/0187451 A1* | 7/2012 | Saito | 257/192 |
| 2013/0306980 A1* | 11/2013 | Niiyama et al. | 257/76 |
| 2014/0001557 A1* | 1/2014 | Mishra et al. | 257/367 |
| 2014/0061659 A1* | 3/2014 | Teplik et al. | 257/76 |
| 2014/0092638 A1* | 4/2014 | Nishimori et al. | 363/17 |
| 2014/0159050 A1* | 6/2014 | Yoon et al. | 257/76 |
| 2015/0021666 A1* | 1/2015 | Chen et al. | 257/194 |
| 2015/0034972 A1* | 2/2015 | Kuraguchi | 257/77 |
| 2015/0144955 A1* | 5/2015 | Cheng | 257/76 |
| 2015/0144957 A1* | 5/2015 | Lu et al. | 257/76 |
| 2015/0145004 A1* | 5/2015 | Inoue et al. | 257/192 |

\* cited by examiner

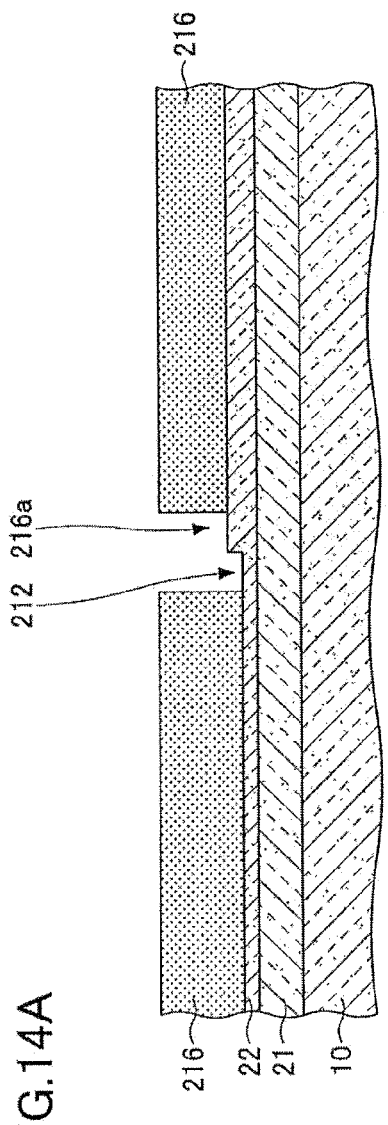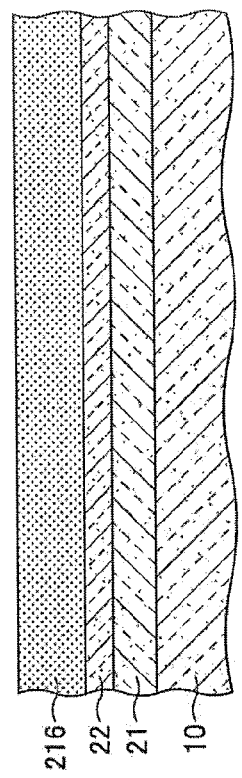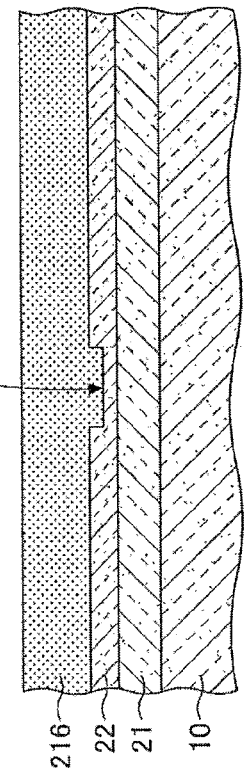

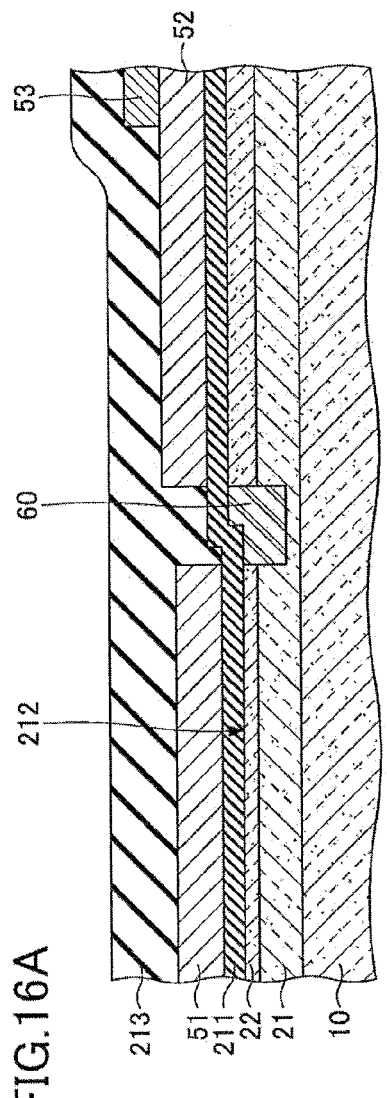
FIG.16A
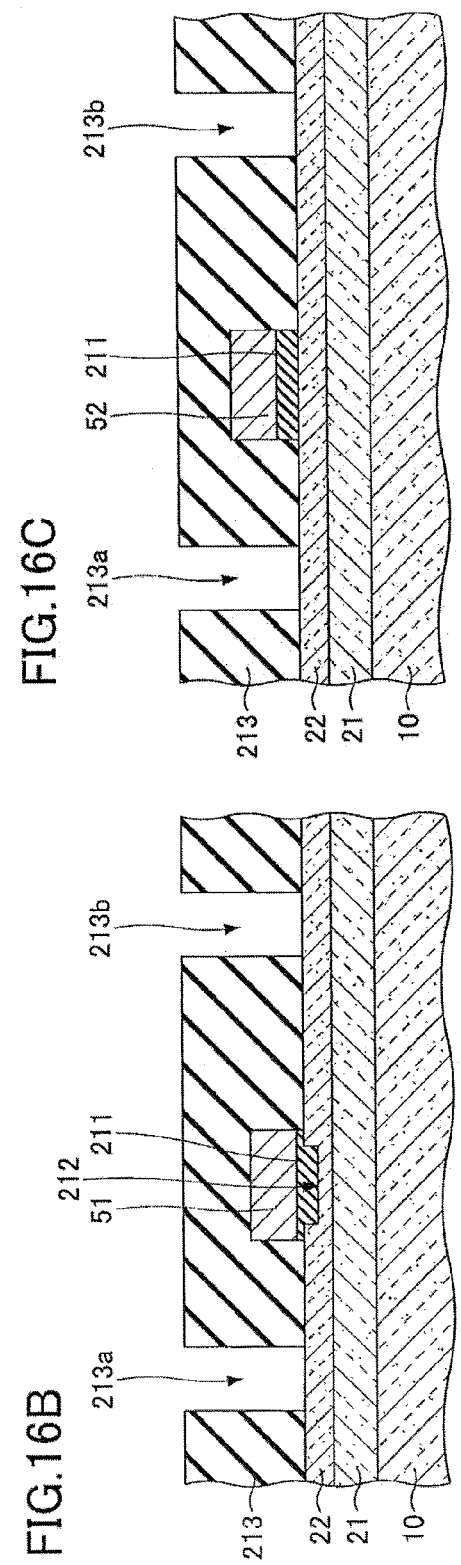
FIG.16C
FIG.16B

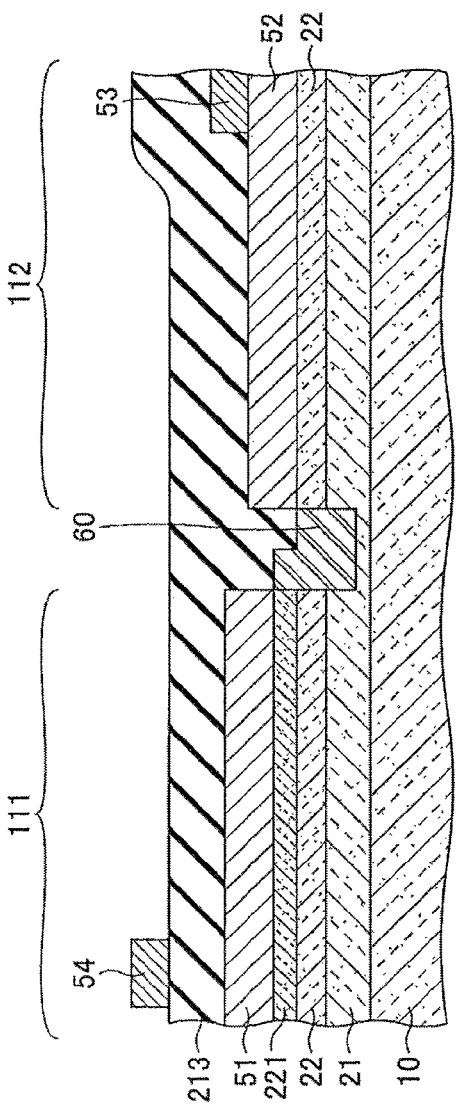
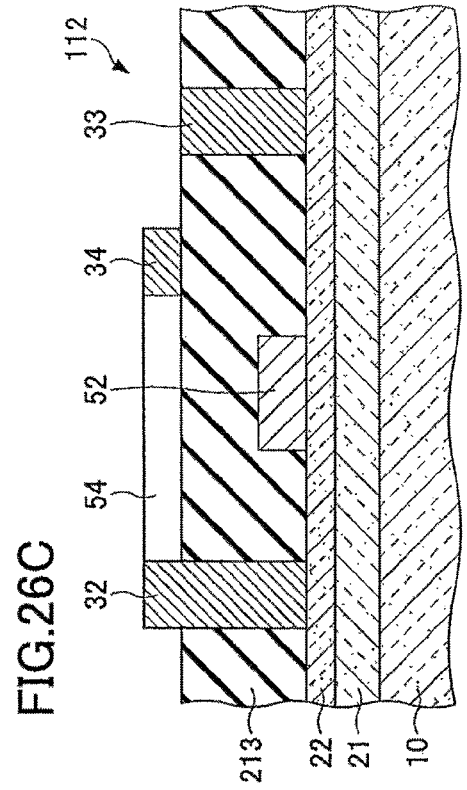
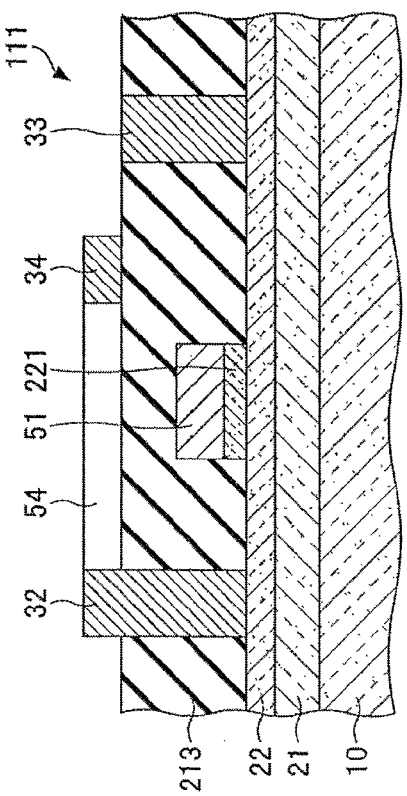
FIG.26A
FIG.26B
FIG.26C

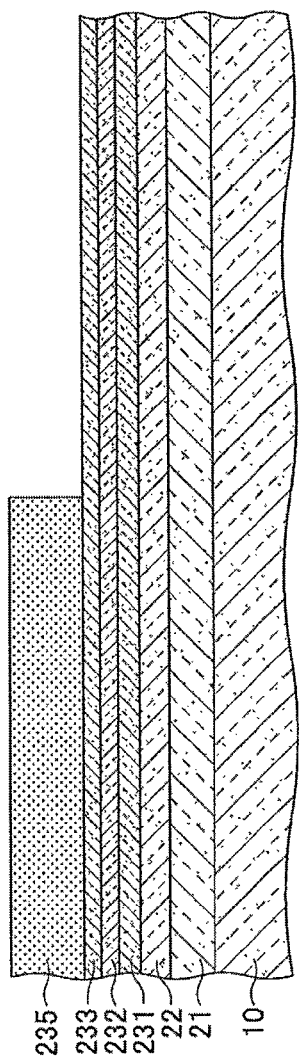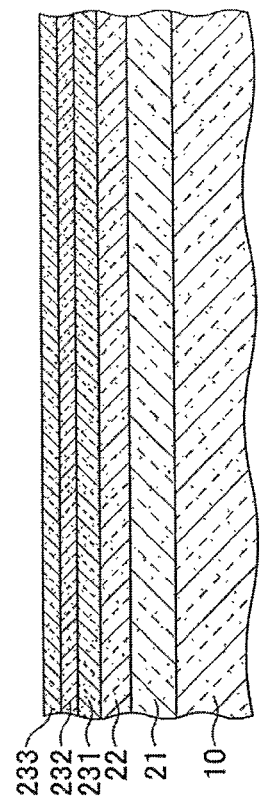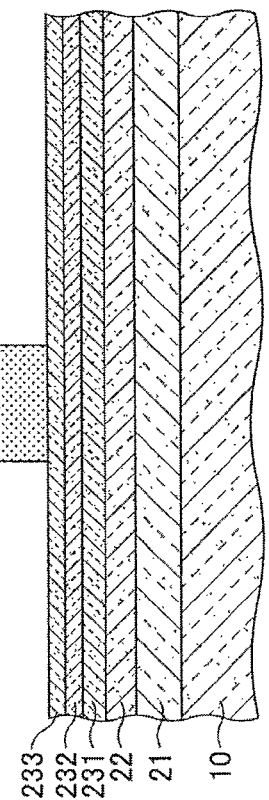

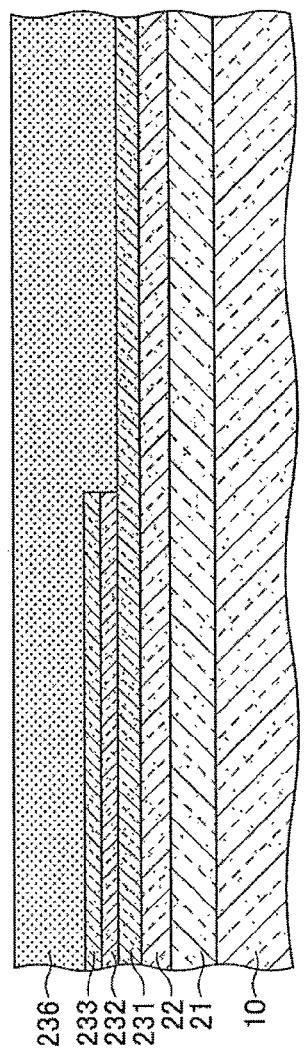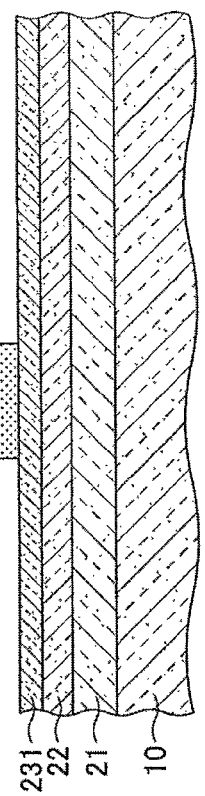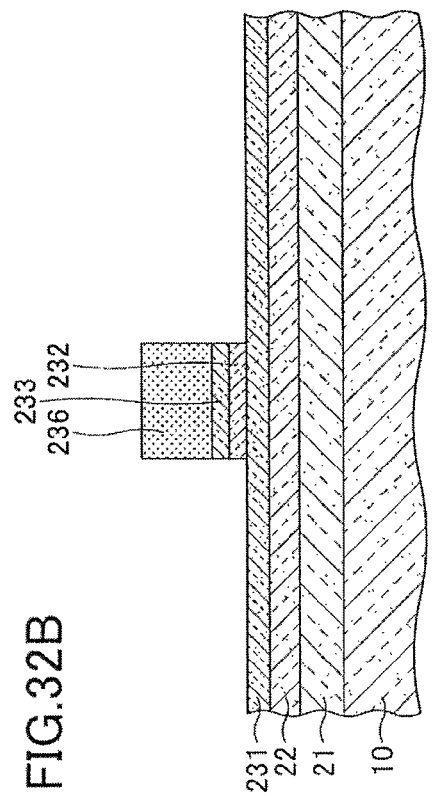
FIG.32A
FIG.32C
FIG.32B

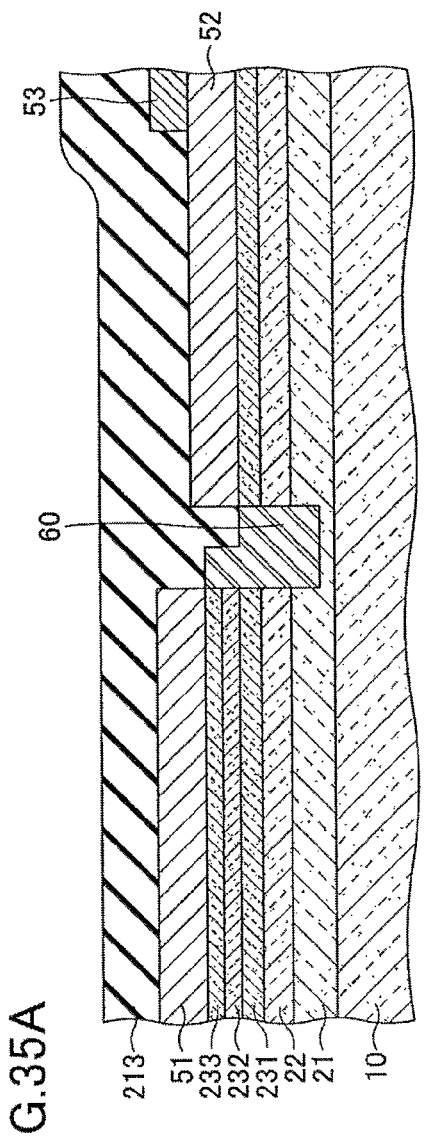
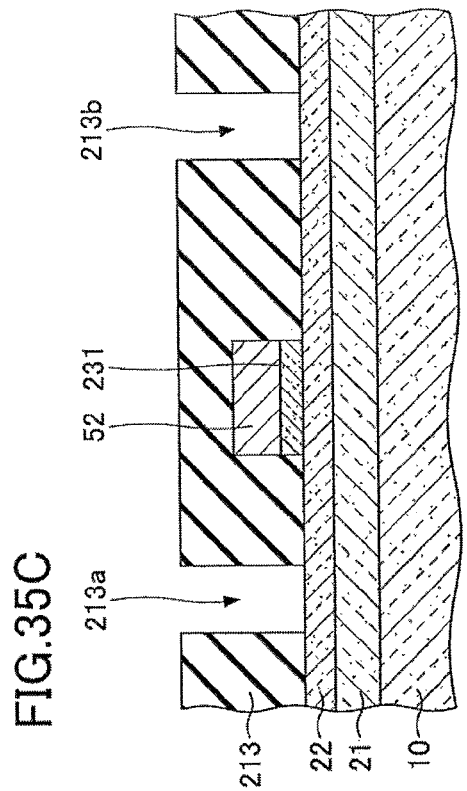
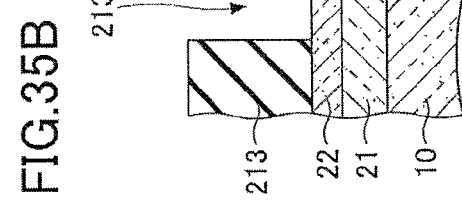

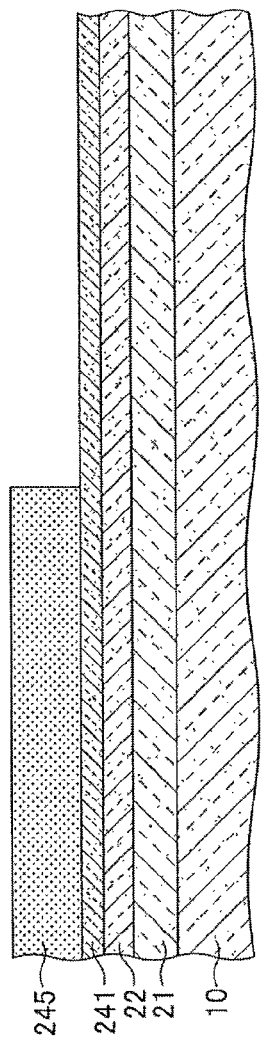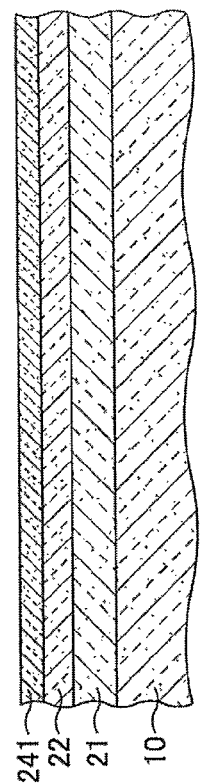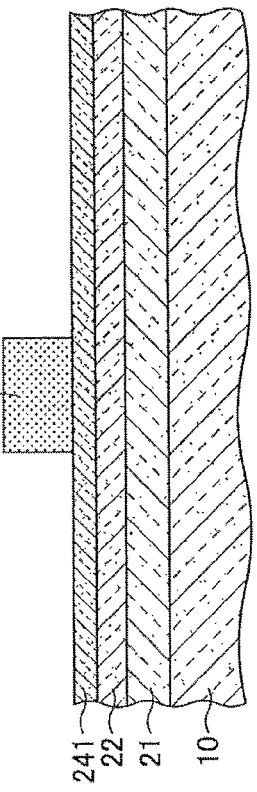
FIG.41A
FIG.41B
FIG.41C

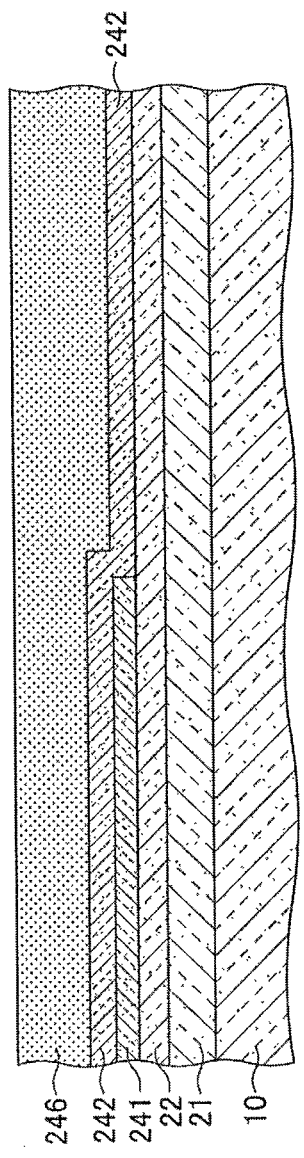
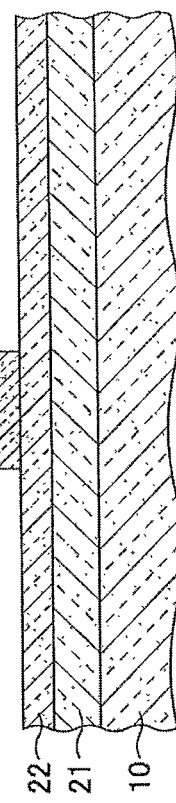
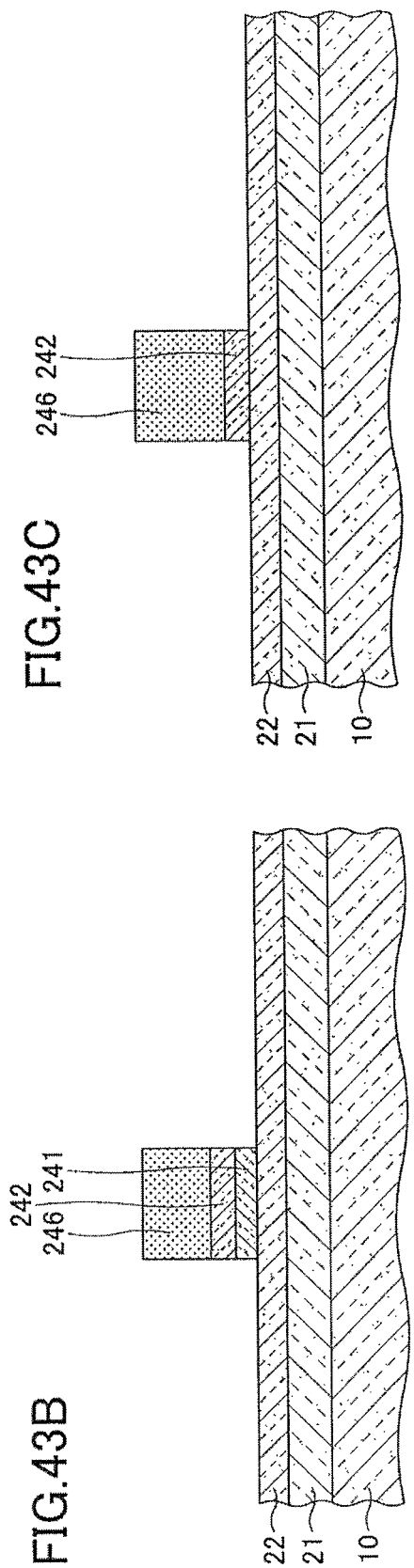
FIG.43A
FIG.43B
FIG.43C

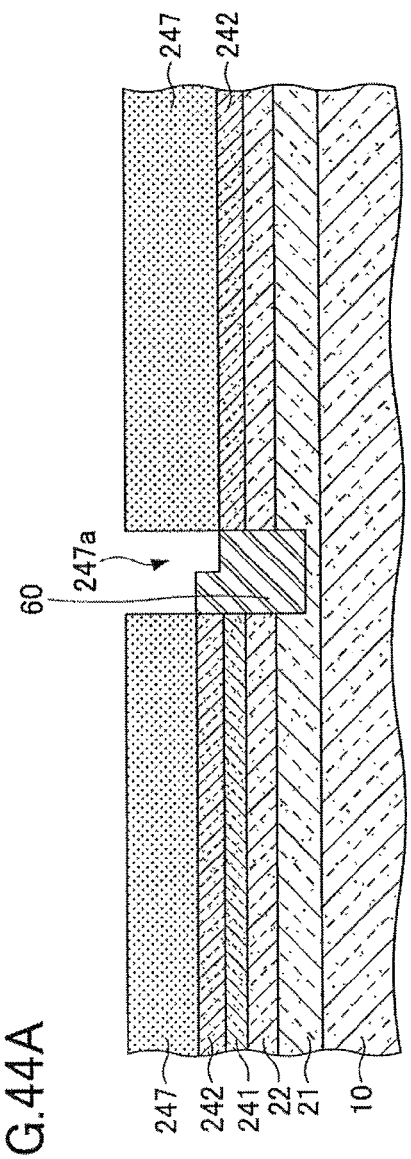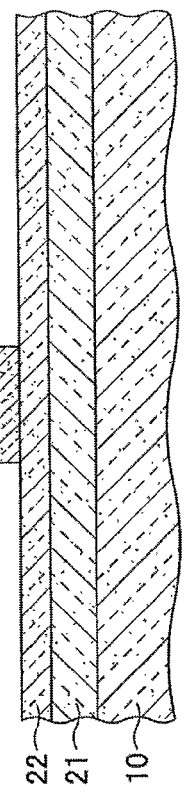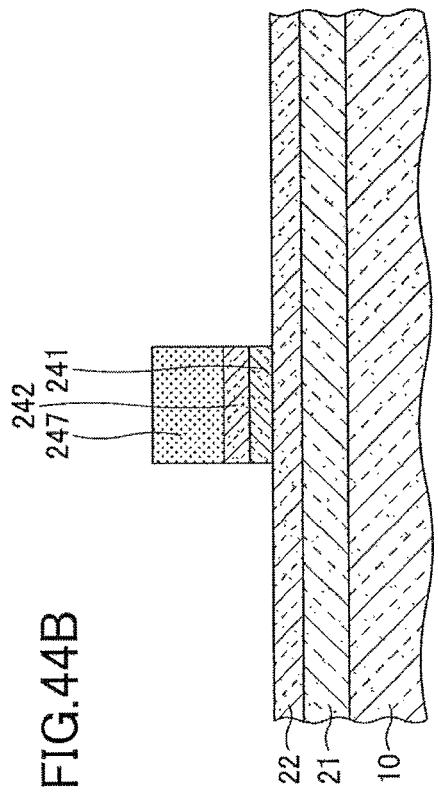

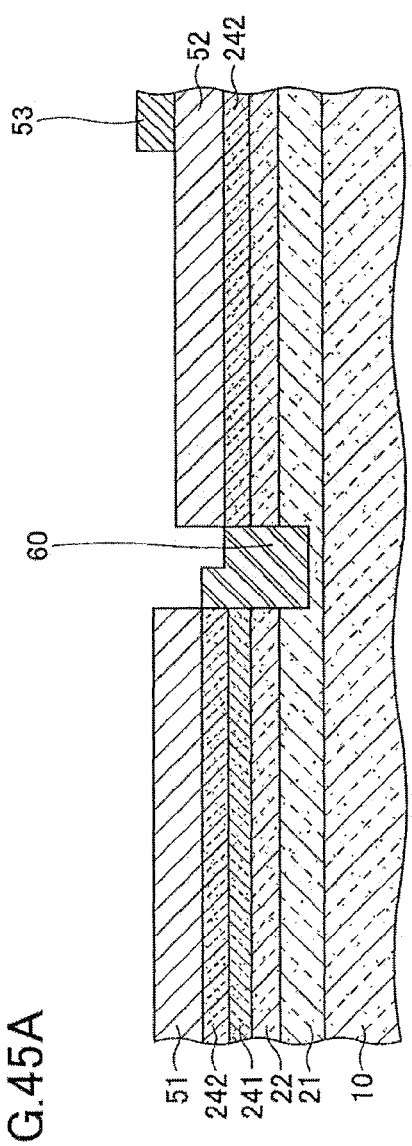
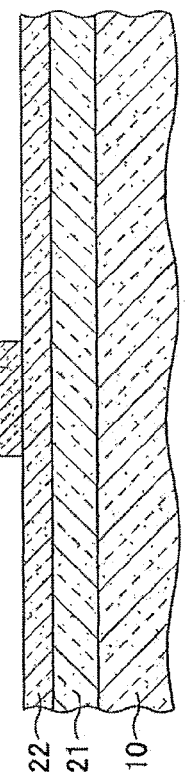
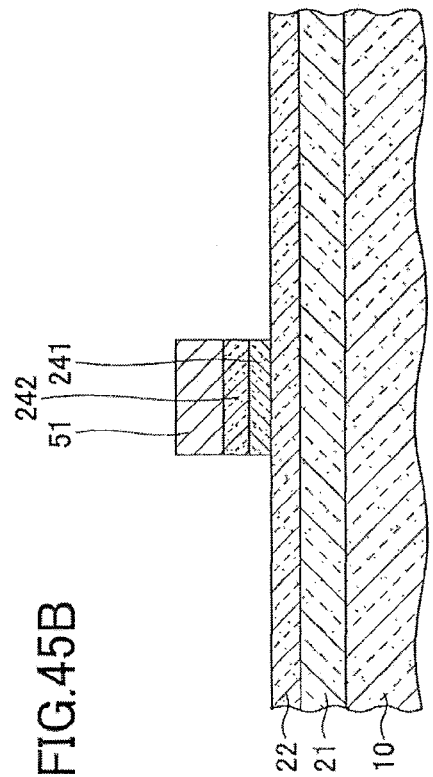

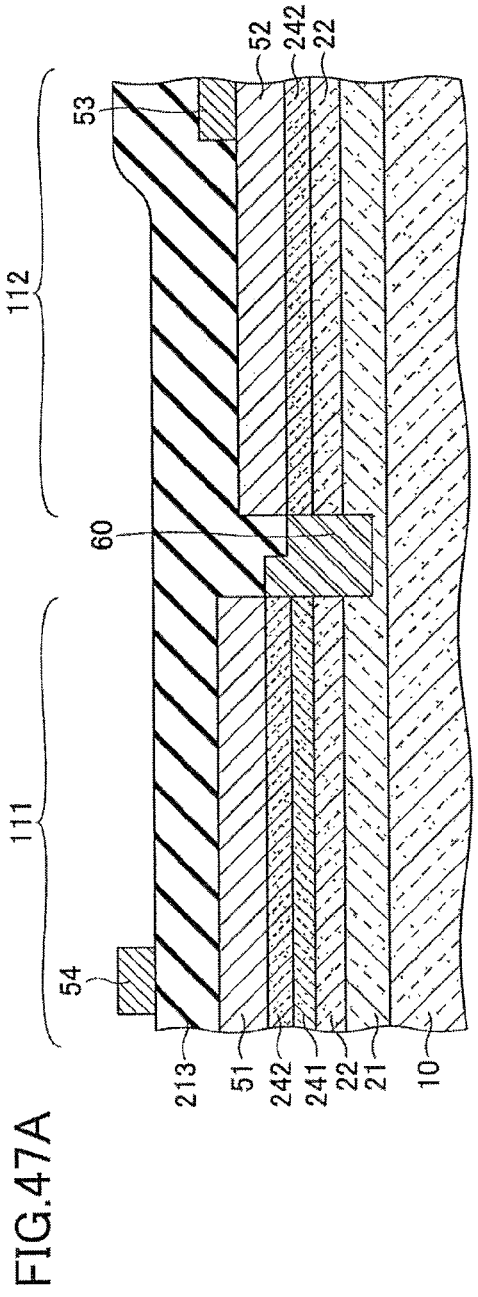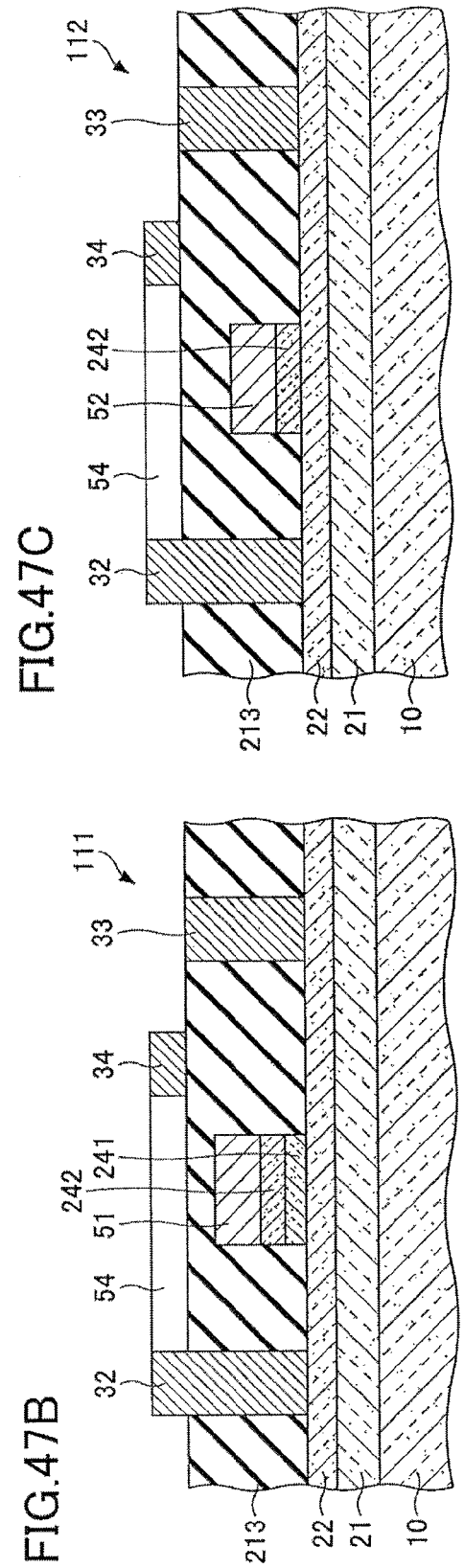

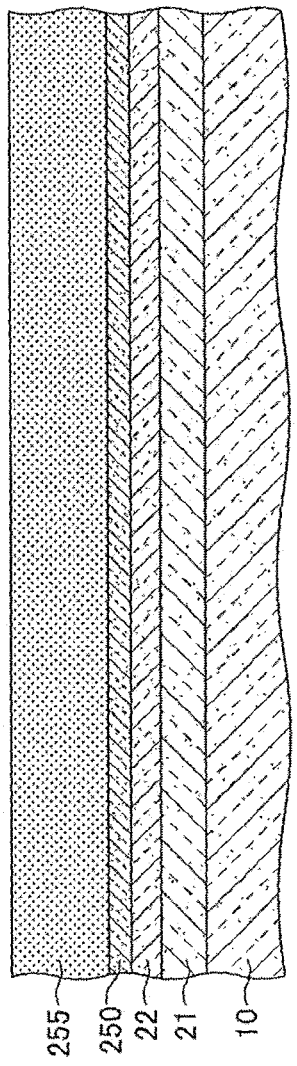
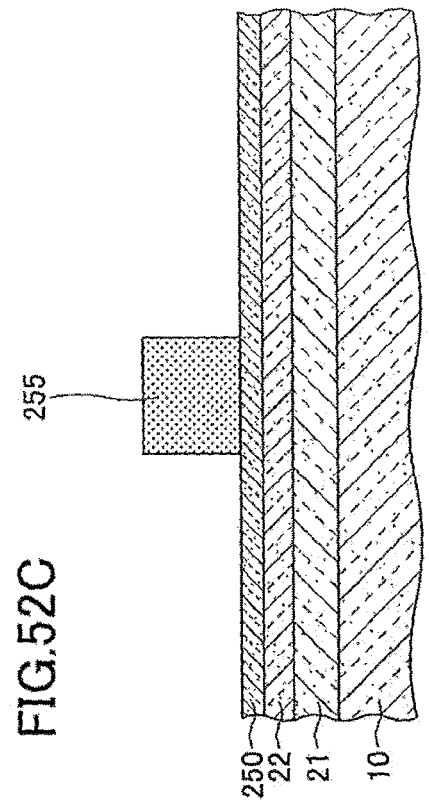
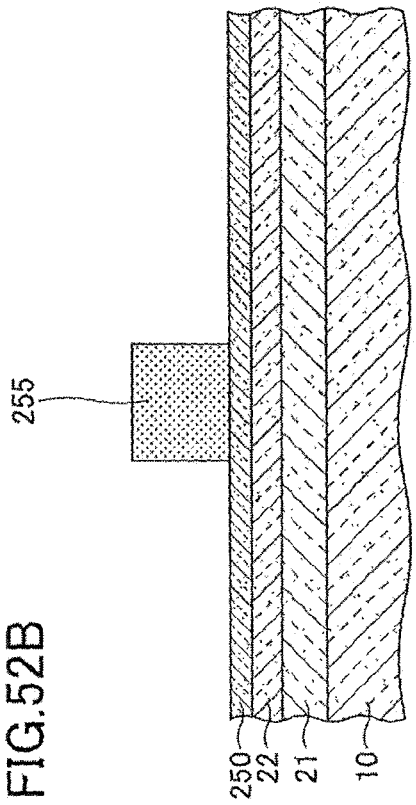
FIG.52A
FIG.52B
FIG.52C

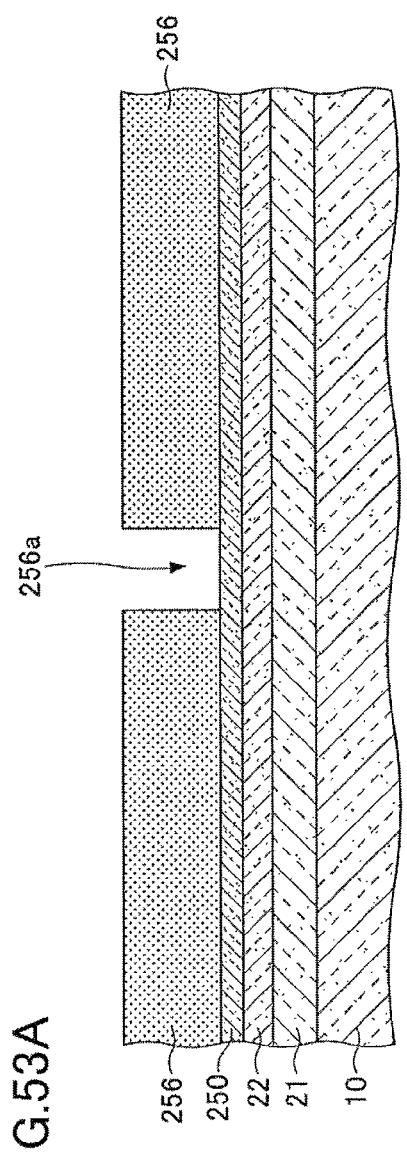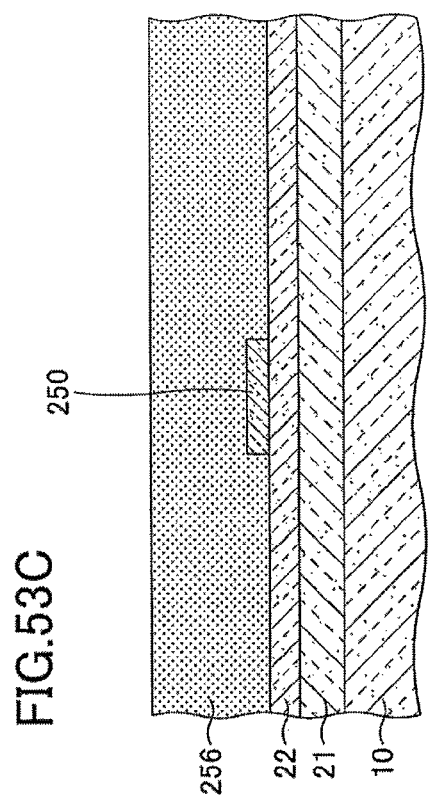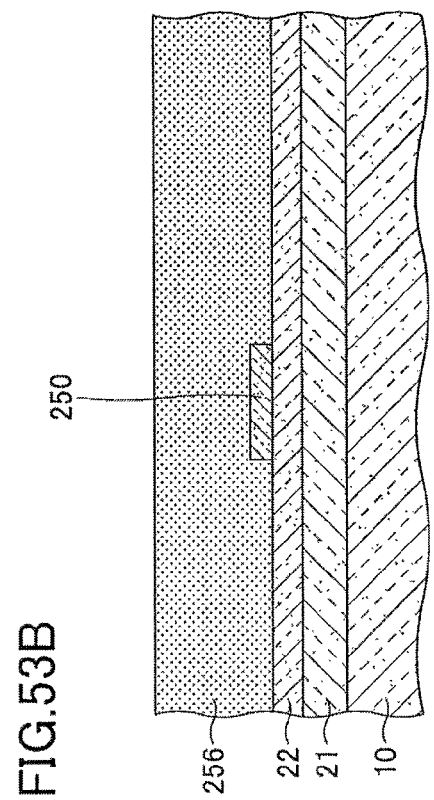
FIG.53A
FIG.53B
FIG.53C

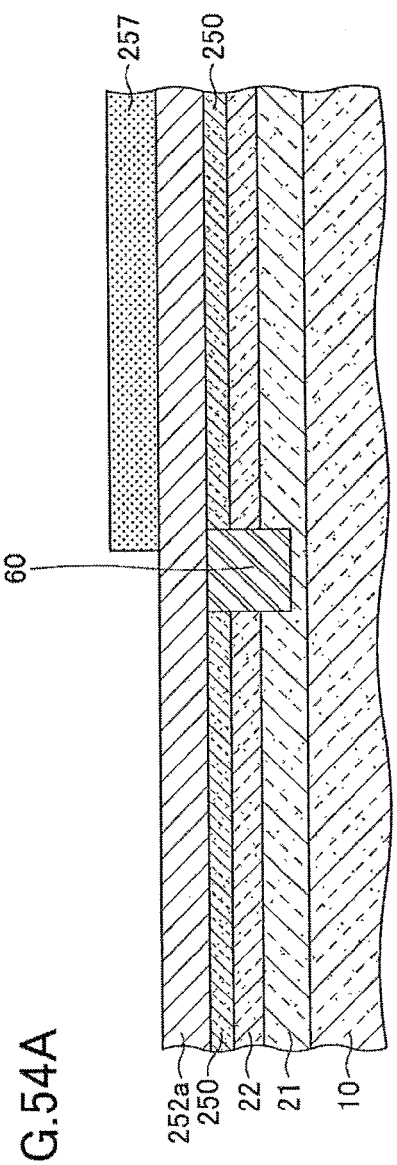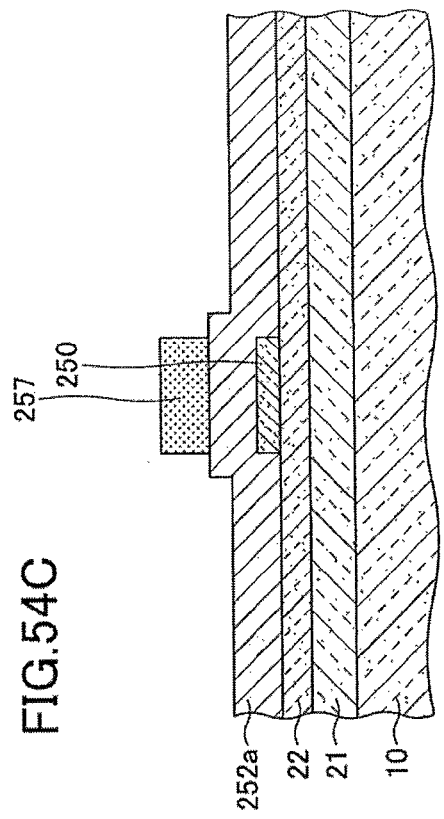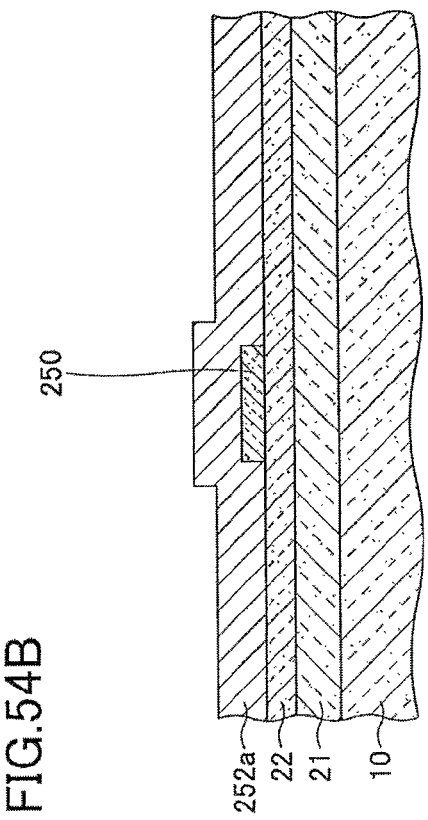

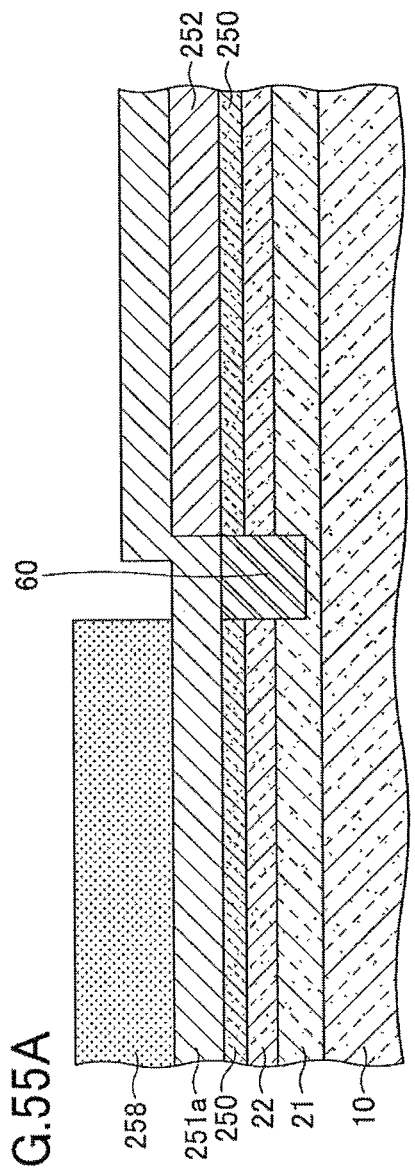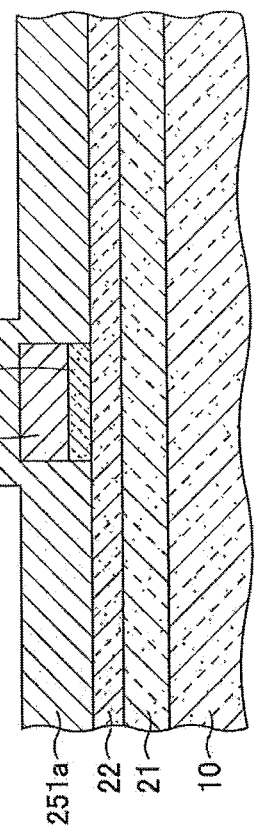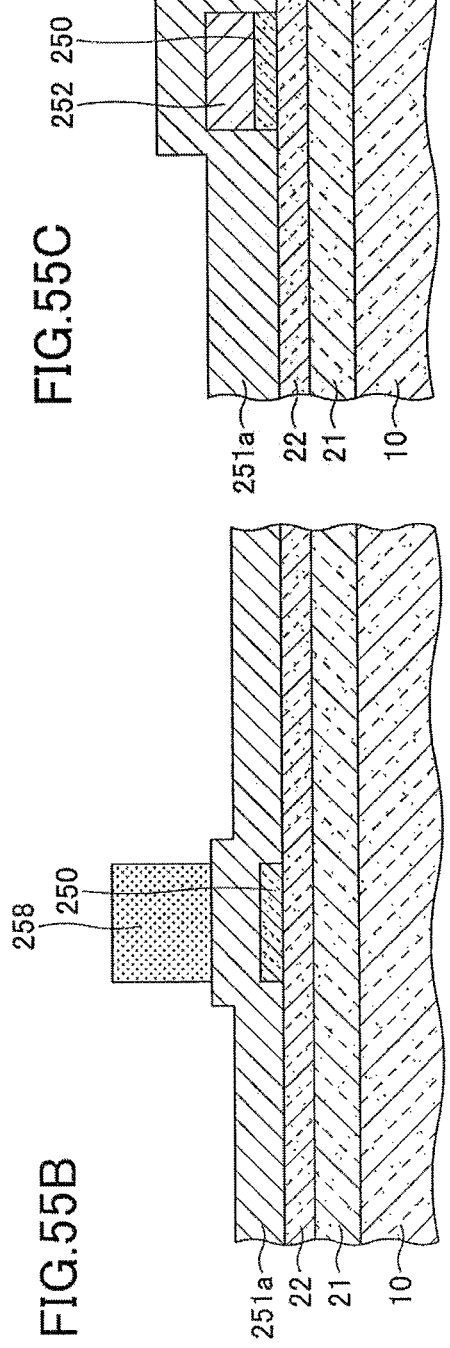

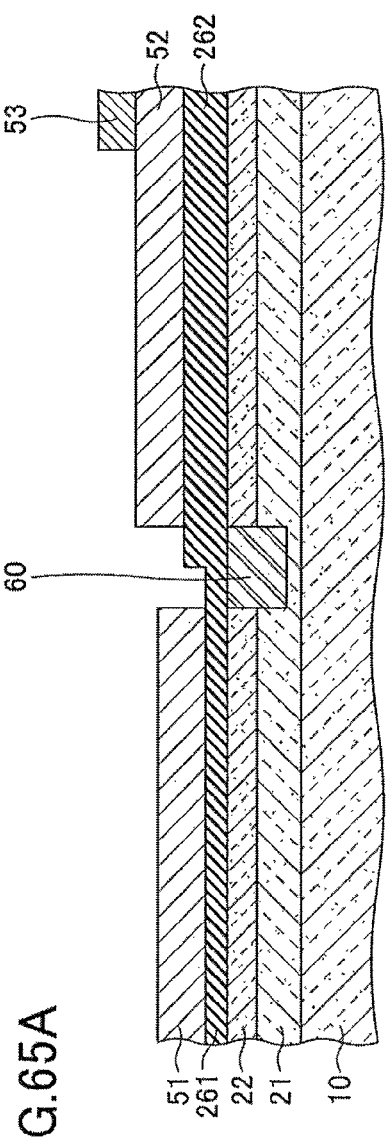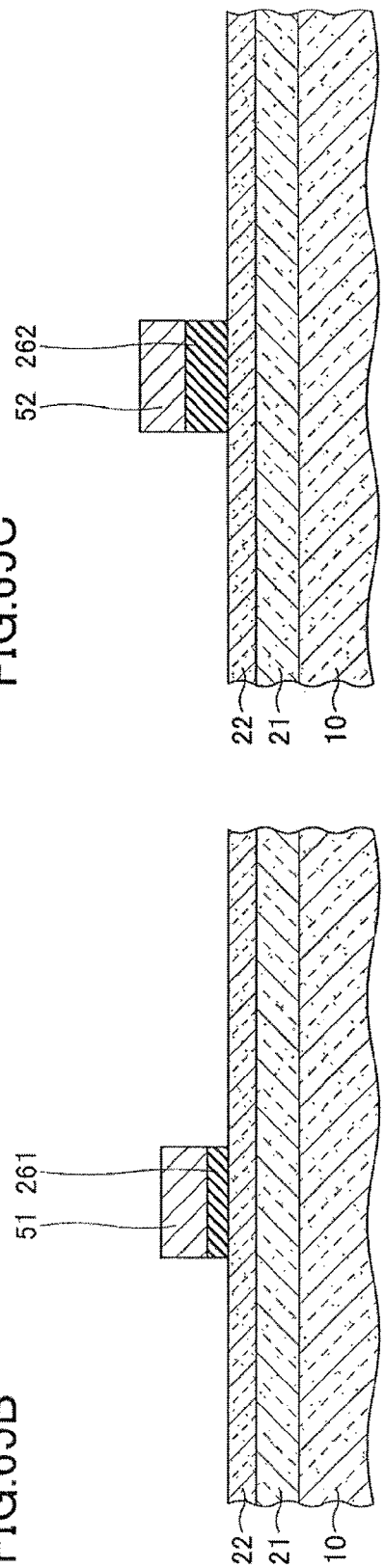
FIG.65A
FIG.65B
FIG.65C

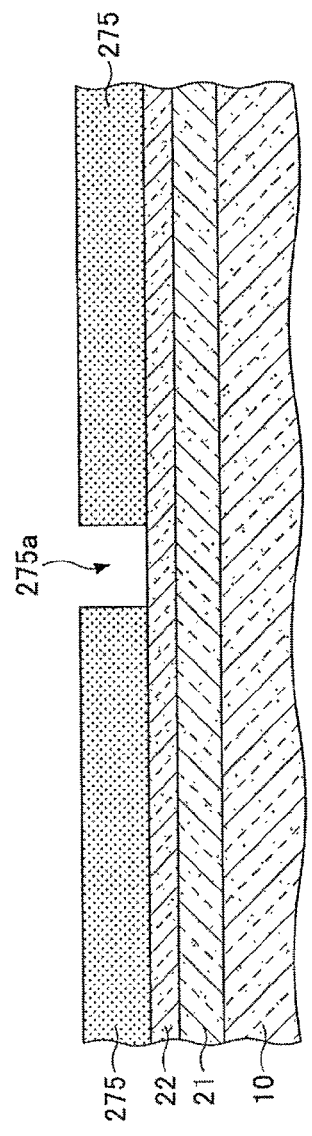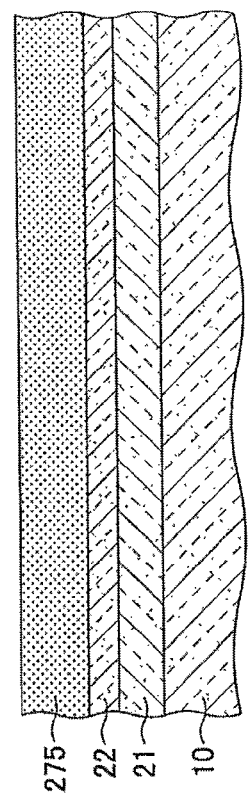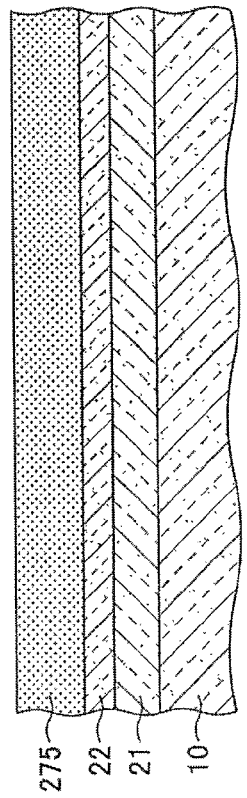

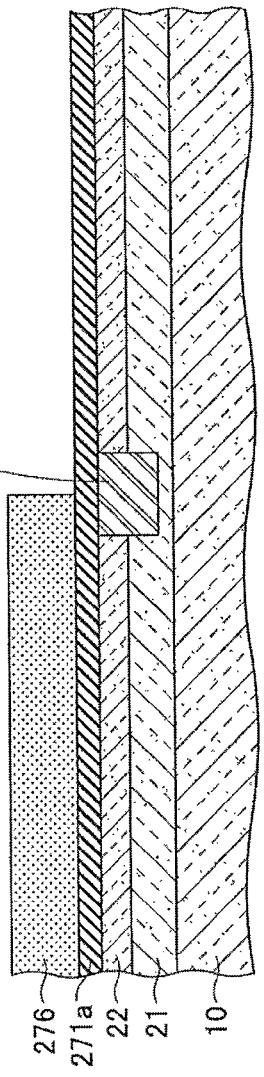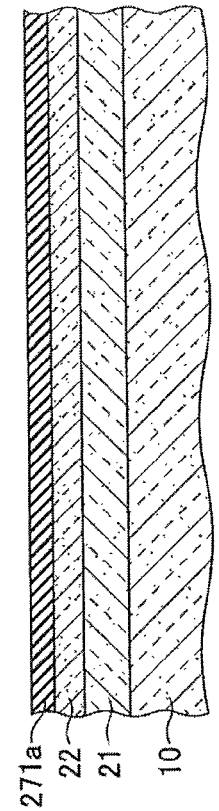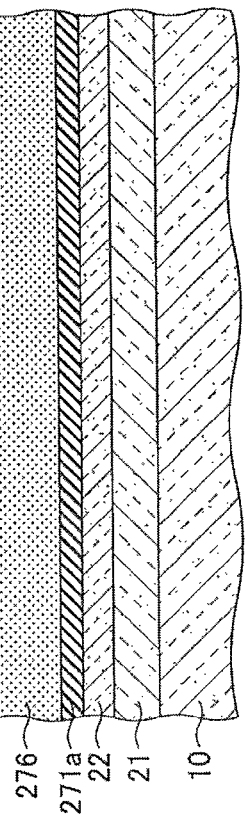

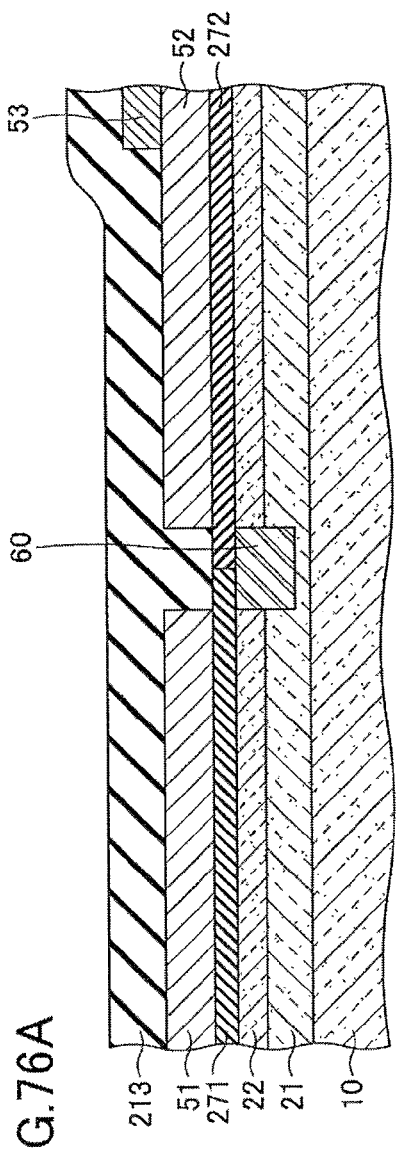
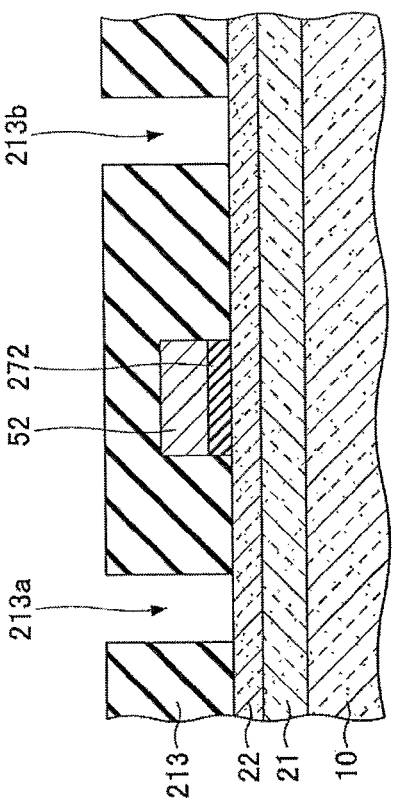
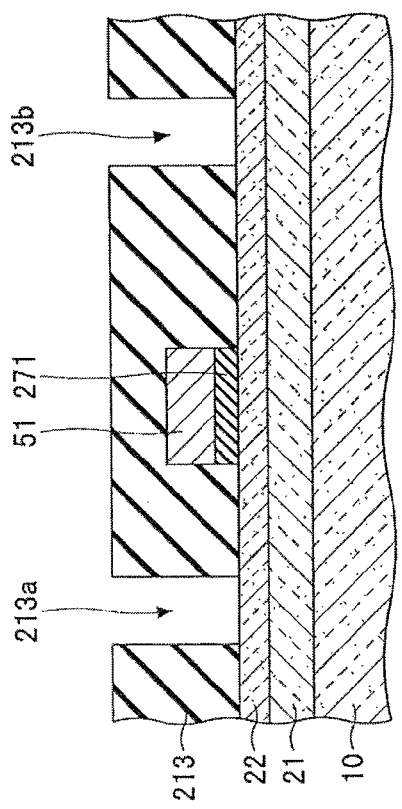

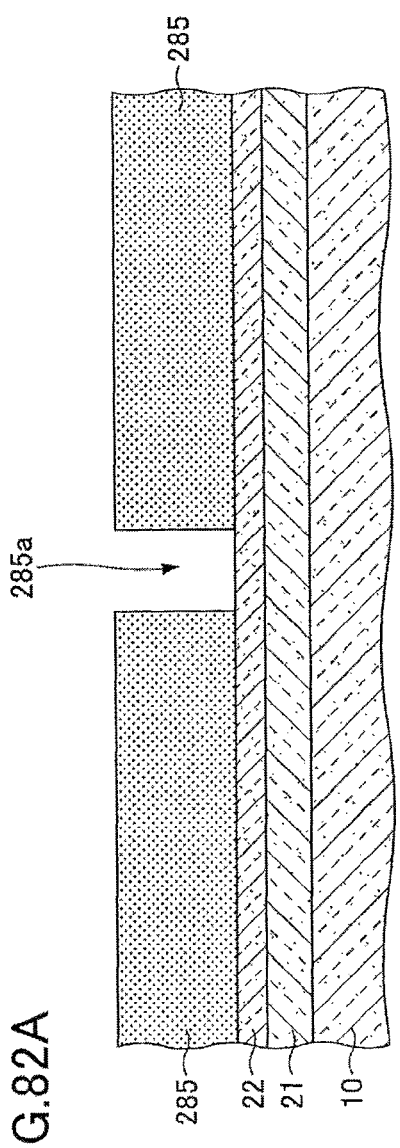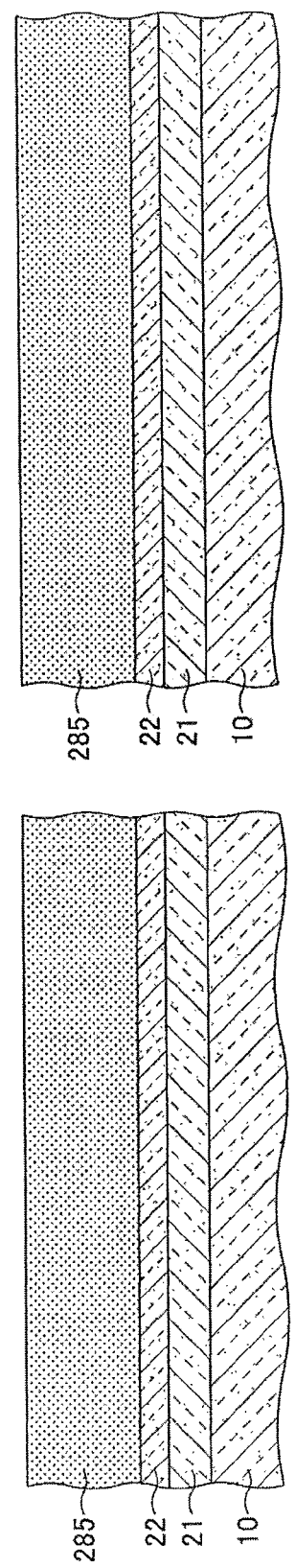

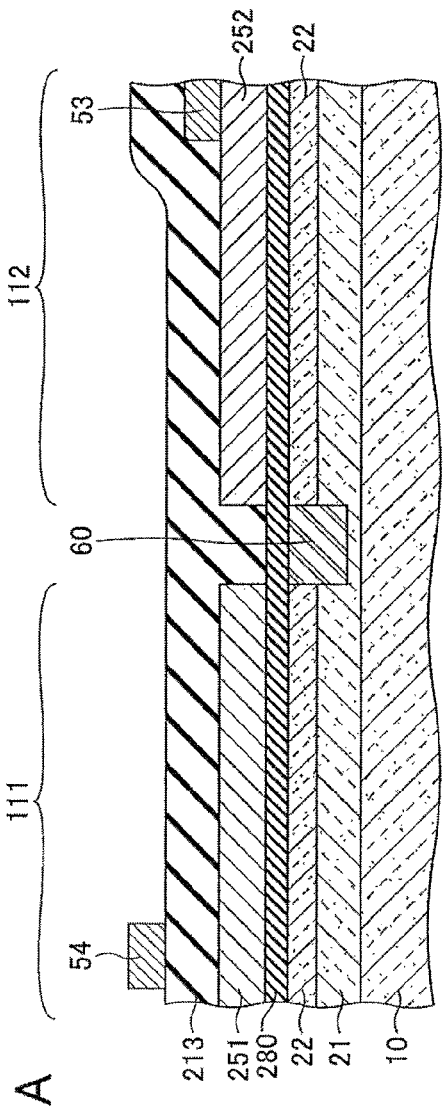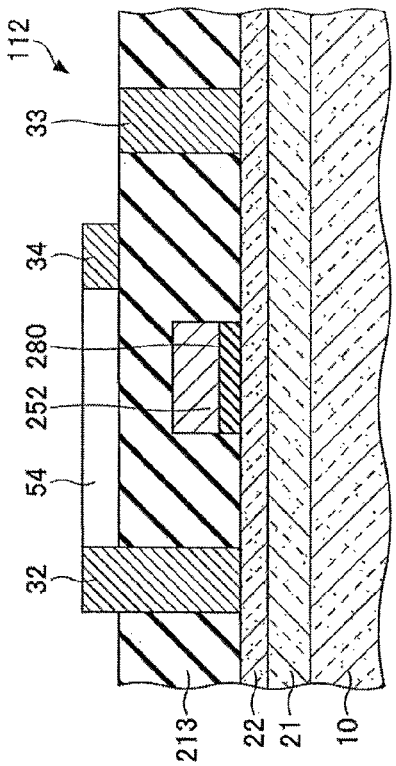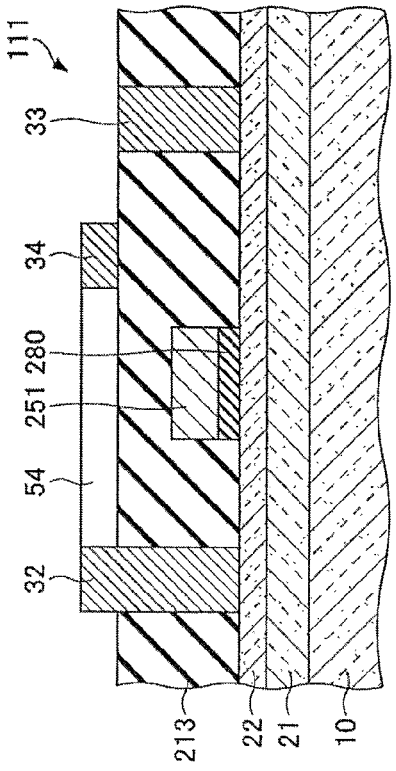

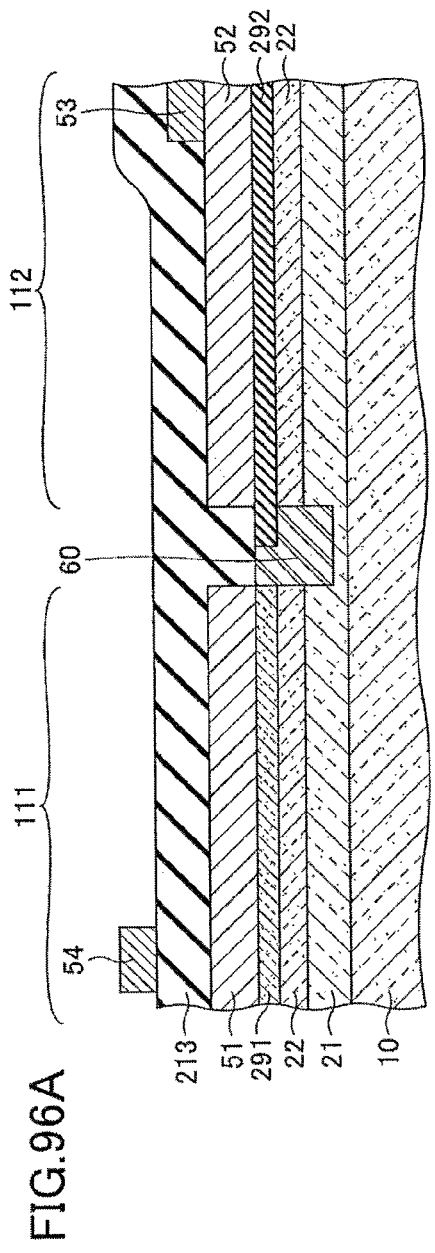
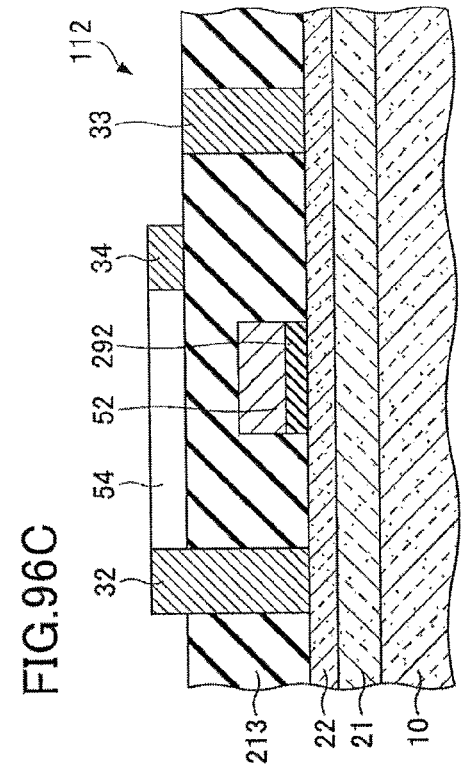
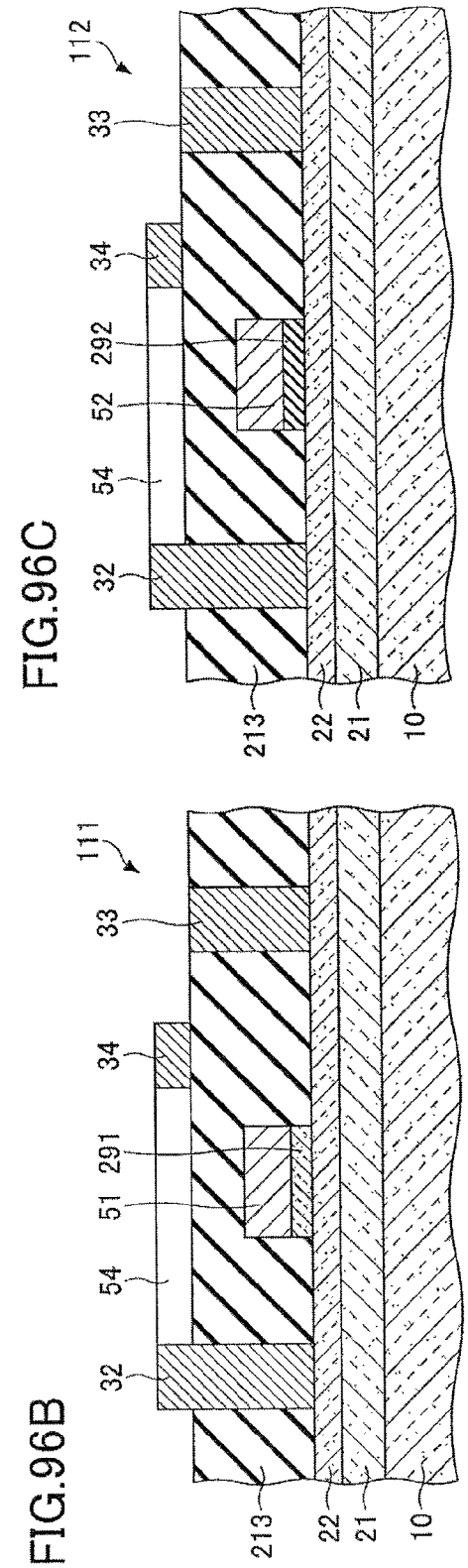

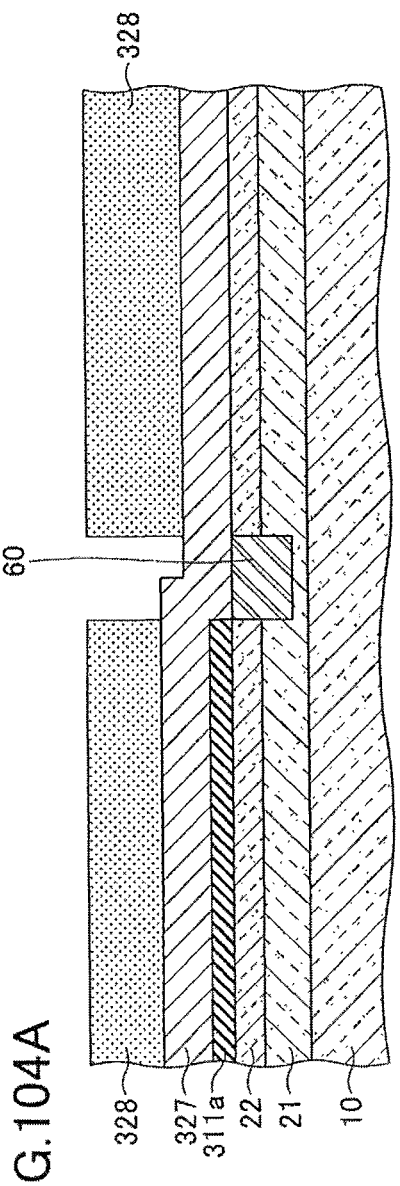
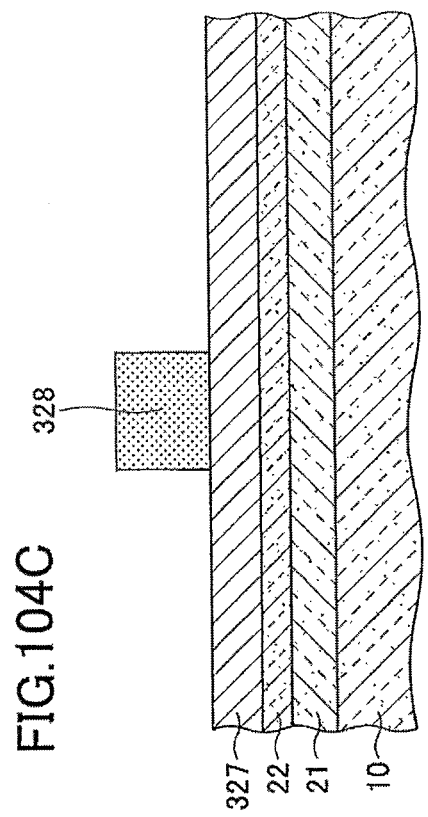
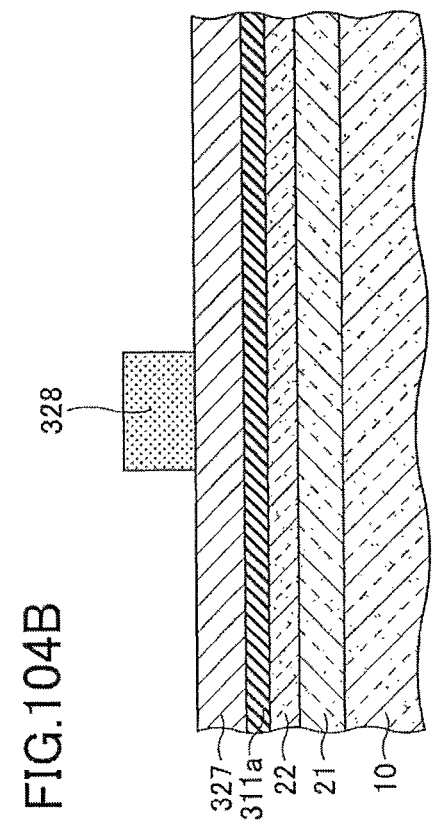
FIG.104A
FIG.104B
FIG.104C

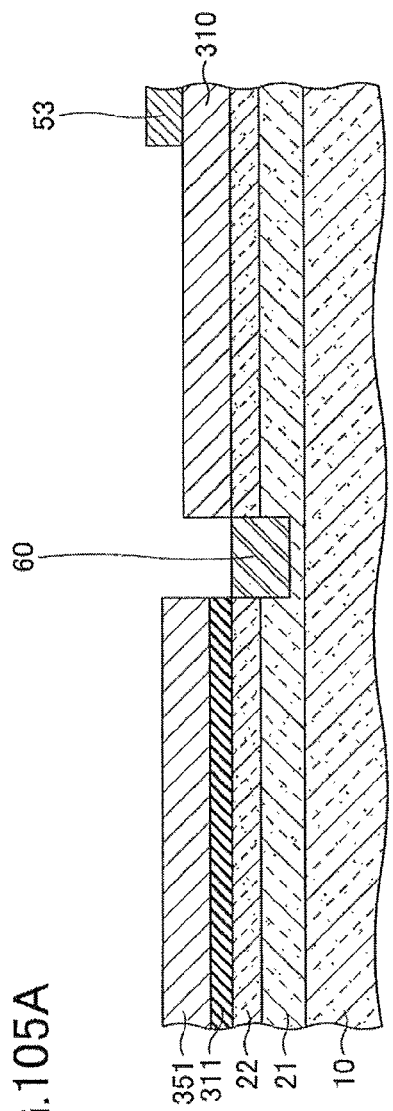
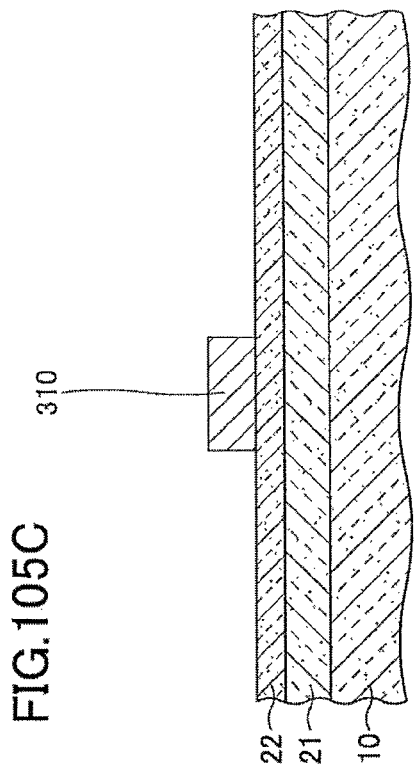
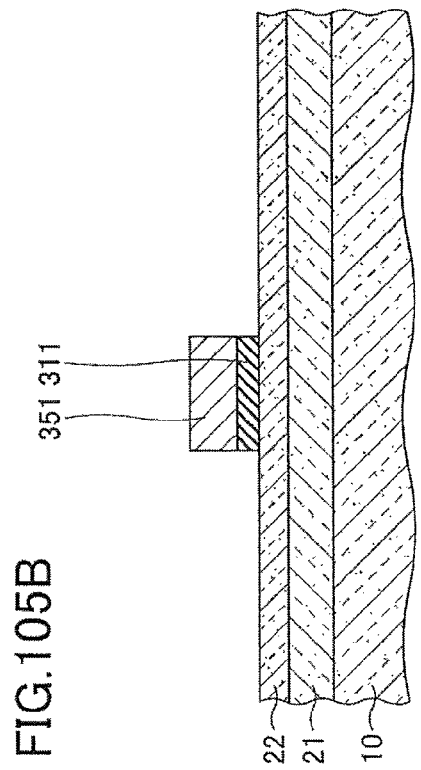
FIG.105A
FIG.105B
FIG.105C

III-N DEVICE WITH DUAL GATES AND FIELD PLATE

CROSS-REFERENCE TO RELATED APPLICATION

This application is based upon and claims the benefit of priority of the prior Japanese Patent Application No. 2013-114465, filed on May 30, 2013, the entire contents of which are incorporated herein by reference.

FIELD

The embodiment discussed herein is related to a semiconductor apparatus.

BACKGROUND

As a semiconductor material such as a transistor, silicon is generally used. However, based on a demand for a higher voltage semiconductor apparatus, research and development has been made in a higher voltage semiconductor apparatus using a nitride semiconductor such as GaN having a wider band gap.

Reference may be made to Japanese Laid-open Patent Publication Nos. 2002-9253 and 2008-219021.

SUMMARY

According to an aspect of the present invention, a semiconductor apparatus includes a substrate; a first semiconductor layer formed on the substrate and formed of a nitride semiconductor; a second semiconductor layer formed on the first semiconductor layer and formed of a nitride semiconductor; first and second gate electrodes, a source electrode, and a drain electrode formed on the second semiconductor layer; an interlayer insulation film formed on the second semiconductor layer; and a field plate formed on the interlayer insulation film. Further, the first gate electrode and the second gate electrode are formed between a region where the source electrode is formed and a region where the field plate is formed, an element isolation region is formed in the first and the second semiconductor layers which are between the first and the second gate electrodes, and the second gate electrode is electrically connected to the source electrode.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

BRIEF DESCRIPTION OF DRAWINGS

FIGS. 14A through 14C are second cross-sectional views illustrating the method of manufacturing the semiconductor apparatus according to the second embodiment;

FIGS. 16A through 16C are fourth cross-sectional views illustrating the method of manufacturing the semiconductor apparatus according to the second embodiment;

FIGS. 26A through 26C are fifth cross-sectional views illustrating the method of manufacturing the semiconductor apparatus according to the third embodiment;

FIGS. 31A through 31C are first cross-sectional views illustrating a method of manufacturing the semiconductor apparatus according to the fourth embodiment;

FIGS. 32A through 32C are second cross-sectional views illustrating the method of manufacturing the semiconductor apparatus according to the fourth embodiment;

FIGS. 35A through 35C are fifth cross-sectional views illustrating the method of manufacturing the semiconductor apparatus according to the fourth embodiment;

FIGS. 41A through 41C are first cross-sectional views illustrating a method of manufacturing the semiconductor apparatus according to the fifth embodiment;

FIGS. 43A through 43C are third cross-sectional views illustrating the method of manufacturing the semiconductor apparatus according to the fifth embodiment;

FIGS. 44A through 44C are fourth cross-sectional views illustrating the method of manufacturing the semiconductor apparatus according to the fifth embodiment;

FIGS. 45A through 45C are fifth cross-sectional views illustrating the method of manufacturing the semiconductor apparatus according to the fifth embodiment;

FIGS. 47A through 47C are seventh cross-sectional views illustrating the method of manufacturing the semiconductor apparatus according to the fifth embodiment;

FIGS. 52A through 52C are first cross-sectional views illustrating a method of manufacturing the semiconductor apparatus according to the sixth embodiment;

FIGS. 53A through 53C are second cross-sectional views illustrating the method of manufacturing the semiconductor apparatus according to the sixth embodiment;

FIGS. 54A through 54C are third cross-sectional views illustrating the method of manufacturing the semiconductor apparatus according to the sixth embodiment;

FIGS. 55A through 55C are fourth cross-sectional views illustrating the method of manufacturing the semiconductor apparatus according to the sixth embodiment;

FIGS. 65A through 65C are fourth cross-sectional views illustrating the method of manufacturing the semiconductor apparatus according to the seventh embodiment;

FIGS. 72A through 72C are first cross-sectional views illustrating a method of manufacturing the semiconductor apparatus according to the eighth embodiment;

FIGS. 73A through 73C are second cross-sectional views illustrating the method of manufacturing the semiconductor apparatus according to the eighth embodiment;

FIGS. 76A through 76C are fifth cross-sectional views illustrating the method of manufacturing the semiconductor apparatus according to the eighth embodiment;

FIGS. 82A through 82C are first cross-sectional views illustrating a method of manufacturing the semiconductor apparatus according to the ninth embodiment;

FIGS. 86A through 86C are fifth cross-sectional views illustrating the method of manufacturing the semiconductor apparatus according to the ninth embodiment;

FIGS. 96A through 96C are sixth cross-sectional views illustrating the method of manufacturing the semiconductor apparatus according to the tenth embodiment;

FIGS. 104A through 104C are third cross-sectional views illustrating the method of manufacturing the semiconductor apparatus according to the eleventh embodiment;

FIGS. 105A through 105C are fourth cross-sectional views illustrating the method of manufacturing the semiconductor apparatus according to the eleventh embodiment;

DESCRIPTION OF EMBODIMENT

Figure 1:
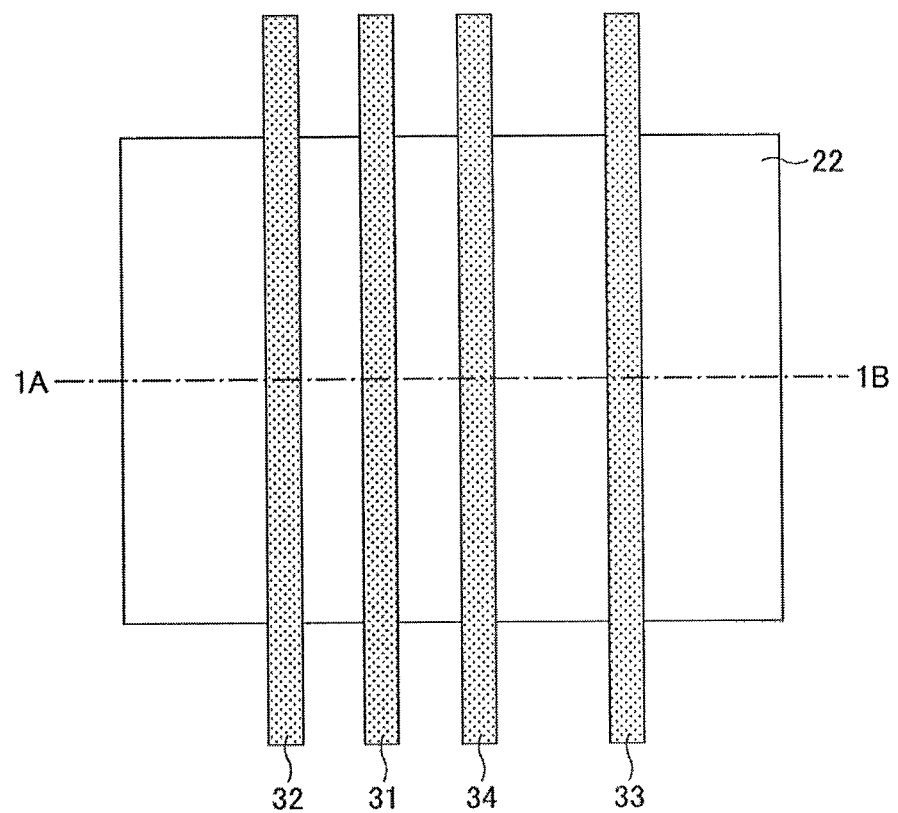
FIG. 1 is a top view of a semiconductor device such as an HEMT using a nitride semiconductor.

When a transistor such as a Field Effect Transistor (FET) is formed with silicon, a parasitic diode is accordingly formed between the source and the drain. Due to the parasitic diode, when, for example, an inductance is used as a load, a current may flow from the source to the drain while the transistor is in an OFF state (i.e., the same electric potential between the source and the drain).

However, in a transistor such as a High Electron Mobility Transistor (HEMT) formed with a nitride semiconductor material such as GaN, the parasitic diode is not accordingly formed between the source and the drain. Therefore, for a current to flow from the source to the drain while the transistor is in the OFF state, it is not possible for the current to flow until the drain voltage is sufficiently reduced. As a result, a loss may be increased.

Here, an external diode or the like may be provided between the source and the drain of the HEFT formed with a nitride semiconductor material such as GaN. However, in this case, the semiconductor may be larger and the number of forming processes is increased. Therefore, the cost may increase.

Therefore, in the semiconductor apparatus which is formed with a nitride semiconductor material such as GaN, it is desired to form a low cost semiconductor device such as a transistor or a diode between the source and the drain, so that the semiconductor apparatus can operate faster without increasing the size of the semiconductor apparatus.

Embodiments to carry out the present invention are described below. Through the embodiments, the same reference numerals are repeatedly used to describe the same members or the like, and the repeated descriptions thereof may be omitted.

First Embodiment

Figure 2:
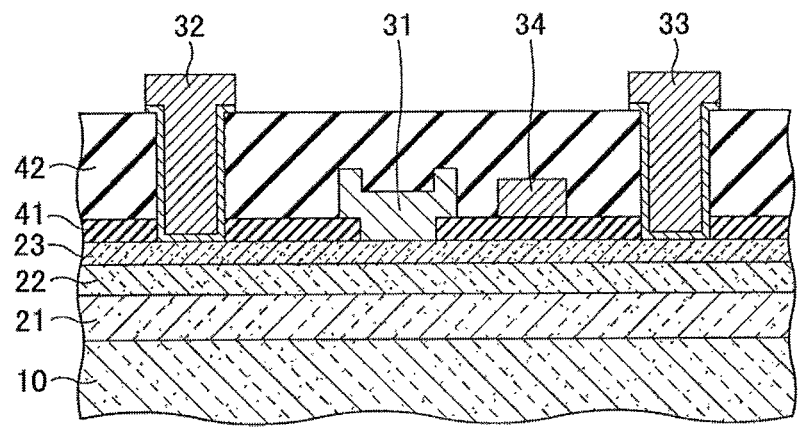
FIG. 2 is a cross-sectional view of the semiconductor apparatus such as the HEMT using the nitride semiconductor.

First, a semiconductor apparatus such as a HEMT using a nitride semiconductor such as GaN is described. As illustrated in FIGS. 1 and 2, in a semiconductor apparatus such as the HEMT using a nitride semiconductor such as GaN, an electron transit layer 21 is formed on a substrate 10 made of silicon or the like and an electron supply layer 22 made of AlGaN or the like is formed on the electron transit layer 21. FIG. 1 is a top view of the semiconductor apparatus such as the HEMT using a nitride semiconductor such as GaN. FIG. 2 is a cross-sectional view of the semiconductor apparatus when cut along the dashed-dotted line 1A-1B of FIG. 1. In this embodiment, the electron transit layer 21 and the electron supply layer 22 may be described as a first semiconductor layer and a second semiconductor layer.

Further, a cap layer 23 made of n-GaN or the like is formed on the electron supply layer 22. A first insulation film 41 is formed on the cap layer 23 in a region where none of a gate electrode 31, a source electrode 32, and a drain electrode 33 is formed. Further, a field plate (FP) 34 is formed on the first insulation film 41 in a region between the gate electrode 31 and the drain electrode 33. Further, a second insulation film 42 is formed on the first insulation film 41, the gate electrode 31, and the field plate (FP) 34.

Figure 3:
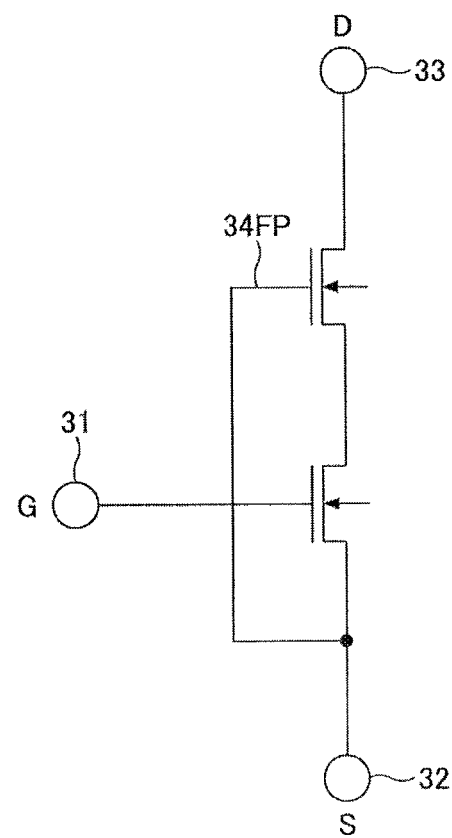
FIG. 3 is an equivalent circuit diagram of the semiconductor apparatus such as the HEMT using the nitride semiconductor.

In such a semiconductor apparatus, two transistors are formed; one transistor uses the gate electrode 31 as the gate electrode thereof and the other transistor uses the field plate (FP) 34 as the gate electrode thereof. For example, as illustrated in FIG. 3, by connecting the field plate (FP) 34 and the source electrode 32, it becomes possible to supply voltage to the field plate (FP) 34, the voltage being the same as voltage that is applied to the source electrode 32. The voltage applied to the field plate (FP) 34 is not limited to voltage equal to the voltage that is applied to the source electrode 32. For example, a desired voltage which is in a range from the voltage applied to the source electrode 32 to the voltage applied to the drain electrode 33 may be applied to the field plate (FP) 34.

Further, as illustrated in FIG. 1, in the semiconductor apparatus, the gate electrode 31, the source electrode 32, the drain electrode 33, and the field plate (FP) 34 are formed in a striped shape. Further, the gate electrode 31 is formed between the source electrode 32 and the drain electrode 33, and the field plate (FP) 34 is formed between the gate electrode 31 and the drain electrode 33.

Semiconductor Apparatus

Figure 4:
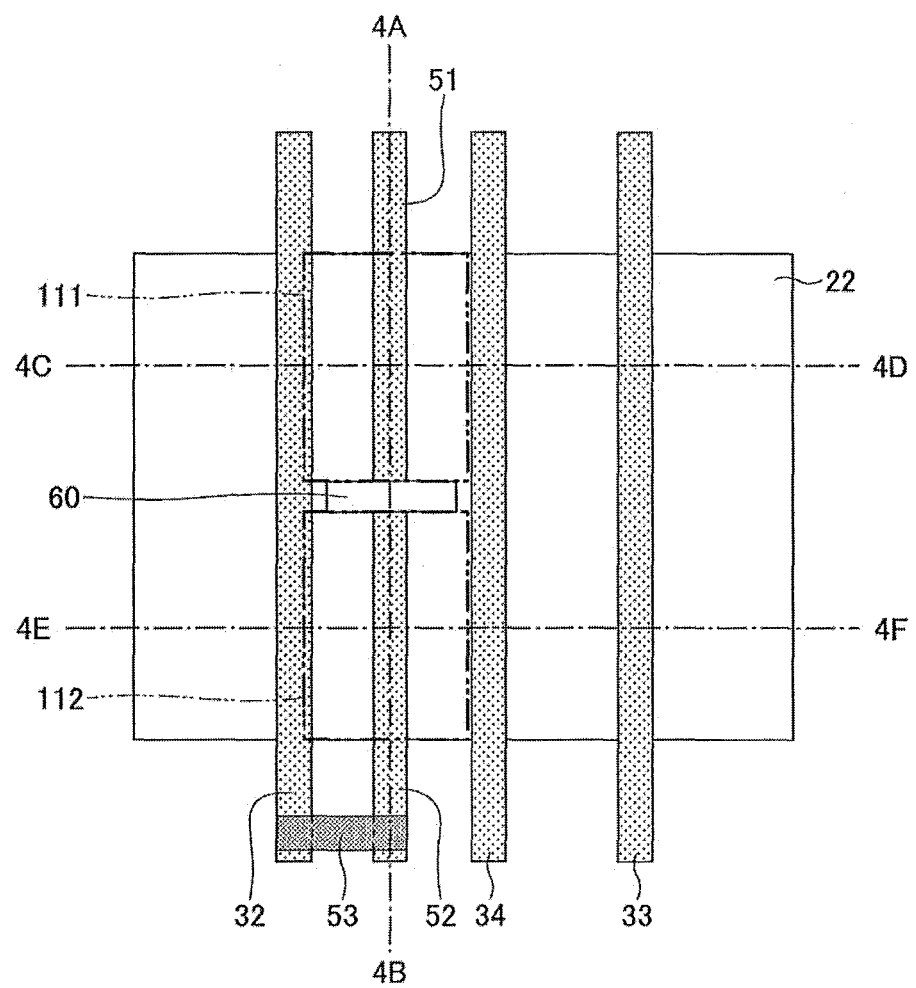
FIG. 4 is a top view of a semiconductor apparatus according to a first embodiment.
Figure 5:
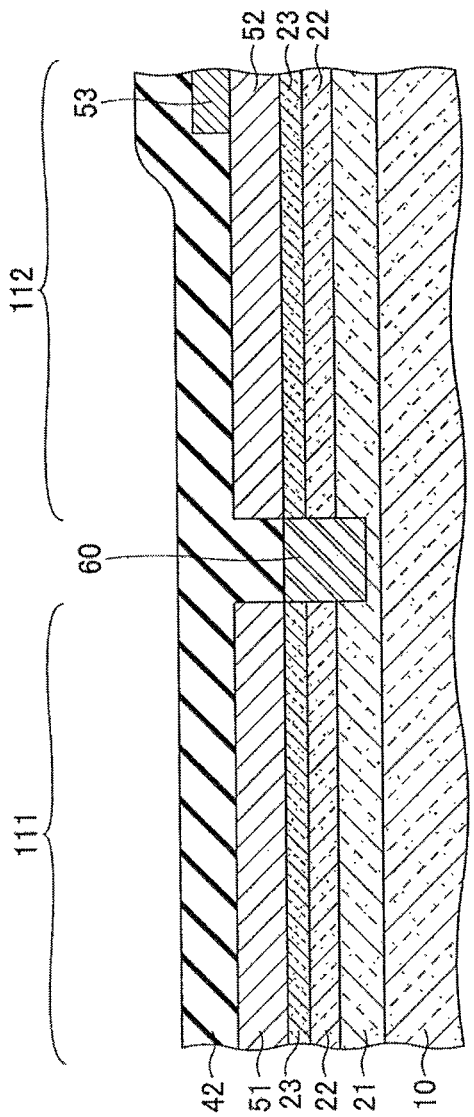
FIG. 5 is a first cross-sectional view of the semiconductor apparatus according to the first embodiment.
Figure 6:
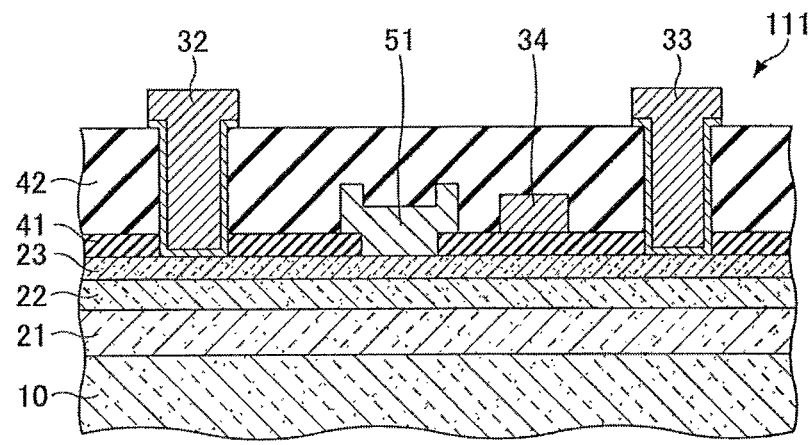
FIG. 6 is a second cross-sectional view of the semiconductor apparatus according to the first embodiment.
Figure 7:
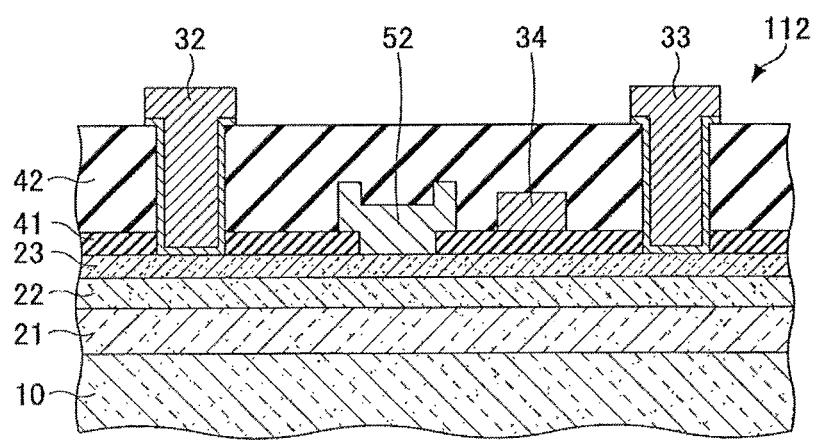
FIG. 7 is a third cross-sectional view of the semiconductor apparatus according to the first embodiment.
Figure 8:
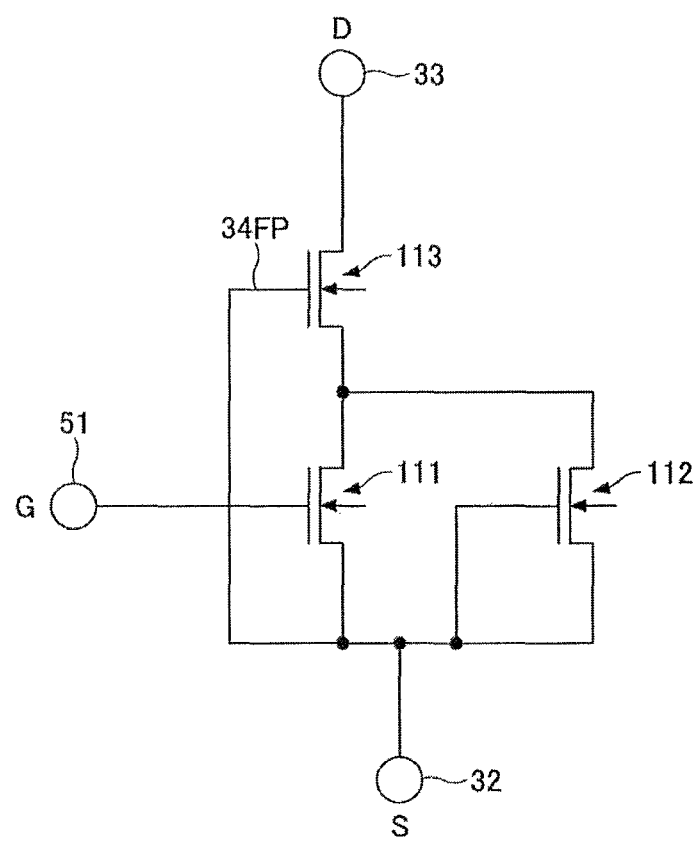
FIG. 8 is an equivalent circuit diagram of the semiconductor apparatus according to the first embodiment.

Next, a semiconductor apparatus according to a first embodiment is described with reference to FIGS. 4 through 8. FIG. 4 is a top view of the semiconductor apparatus according to this embodiment. Further, in FIG. 4, insulation films such as interlayer insulation films are not shown. FIG. 5 is a cross-sectional view of the semiconductor apparatus when cut along the dashed-dotted line 4A-4B of FIG. 4. FIG. 6 is a cross-sectional view of the semiconductor apparatus when cut along the dashed-dotted line 4C-4D of FIG. 4. FIG. 8 is an equivalent circuit diagram of the semiconductor apparatus according to this embodiment.

As illustrated in FIG. 4, in the semiconductor apparatus according to this embodiment, gate electrodes between the source electrode 32 and the field plate (FP) 34 are separately formed. Specifically, a first gate electrode 51 and a second gate electrode 52 are separately formed between the source electrode 32 and the field plate (FP) 34. Between the first gate electrode 51 and the second gate electrode 52, an element isolation region 60 is formed by, for example, Ar ion implantation into a part of the cap layer 23, the electron supply layer 22, and the electron transit layer 21. Beside the method of the Ar ion implantation, the element isolation region 60 may be formed by, for example, etching the nitride semiconductor in the region where the element isolation region 60 is to be formed and burying an insulating material or the like into the region where the nitride semiconductor is removed by the etching.

Further, in the semiconductor apparatus in this embodiment, the electron transit layer 21 made of GaN or the like which is a nitride semiconductor is formed on the substrate 10 made of silicon or the like. Further, the electron supply layer 22 made of AlGaN or the like is formed on the electron transit layer 21. By doing this, two-dimensional electron gas (2 DEG) is generated near a boundary surface between the electron transit layer 21 and the electron supply layer 22 and in the electron transit layer 21. The cap layer 23 made of n-GaN or the like is formed on the electron supply layer 22. The first gate electrode 51, the second gate electrode 52, the source electrode 32, and the drain electrode 33 are formed on the cap layer 23. The first insulation film 41 is formed on the cap layer 23 in a region where none of the first gate electrode 51, the second gate electrode 52, the source electrode 32, and the drain electrode 33 is formed. Further, the field plate (FP) 34 is formed on the first insulation film 41 in a region between the first gate electrode 51 and the drain electrode 33 and between the second gate electrode 52 and the drain electrode 33. Further, the second insulation film 42 is formed on the first insulation film 41, the gate electrode 31 (gate electrodes 51 and 52), and the field plate (FP) 34.

By doing this, in the semiconductor apparatus according to this embodiment, three transistors are formed, which are a first transistor 111 using the first gate electrode 51 as the gate electrode thereof, a second transistor 112 using the second gate electrode 52 as the gate electrode thereof, and a third transistor 113 using the field plate (FP) 34 as the gate electrode thereof. Here, the first transistor 111 and the second transistor 112 are HEMT.

In such a semiconductor apparatus, by connecting between the second gate electrode 52 and the source electrode 32 with a connection electrode 53, a voltage equal to the voltage applied to the source electrode 32 is applied to the second gate electrode 52. Further, by connecting between the field plate (FP) 34 and the source electrode 32 with a connection electrode (not shown), a voltage equal to the voltage applied to the source electrode 32 is applied to the field plate (FP) 34.

Further, as illustrated in FIG. 4, in the semiconductor apparatus according to this embodiment, the first gate electrode 51, the second gate electrode 52, and the element isolation region 60 are formed between the source electrode 32 and the drain electrode 33. Further, the field plate (FP) 34 is formed between the first gate electrode 51, the second gate electrode 52, and the element isolation region 60 and the drain electrode 33.

In this embodiment, by forming the second transistor 112 and connecting between the second gate electrode 52 of the second transistor 112 and the source electrode 32 with the connection electrode 53, the semiconductor apparatus can operate faster at a lower cost without increasing the size of the semiconductor apparatus.

Second Embodiment

Semiconductor Apparatus

Figure 9:
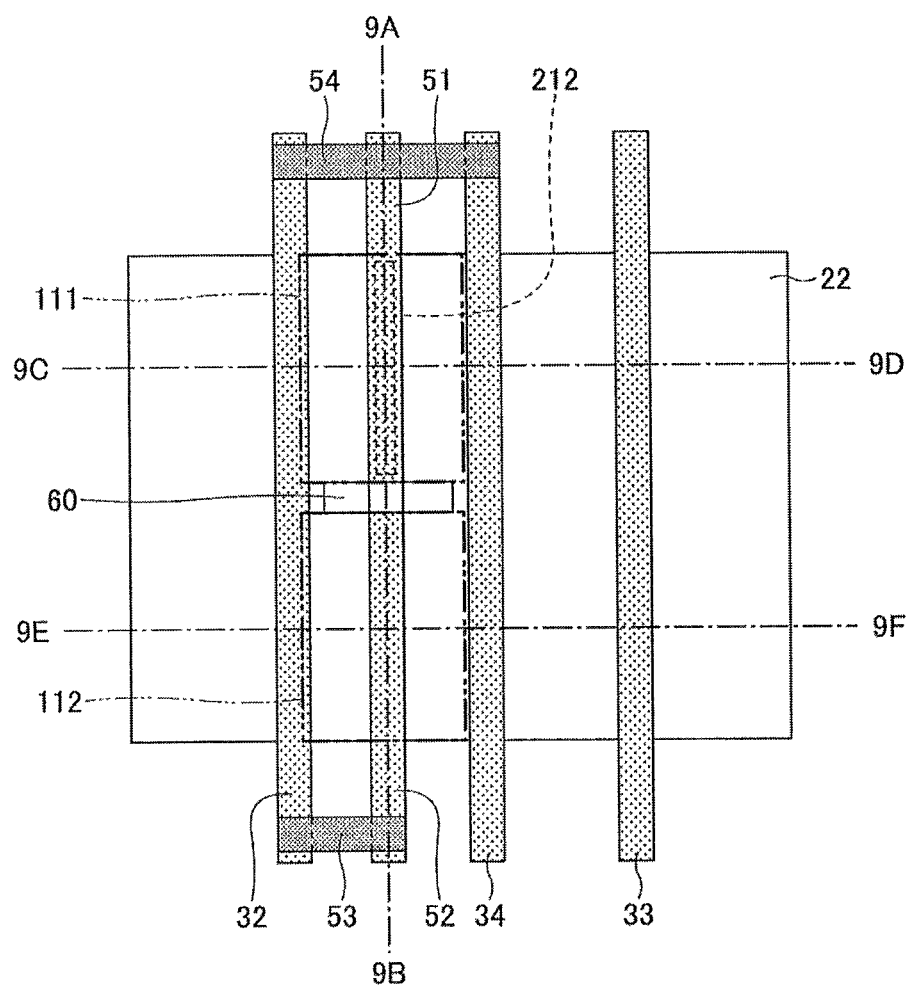
FIG. 9 is a top view of a semiconductor apparatus according to a second embodiment.
Figure 10:
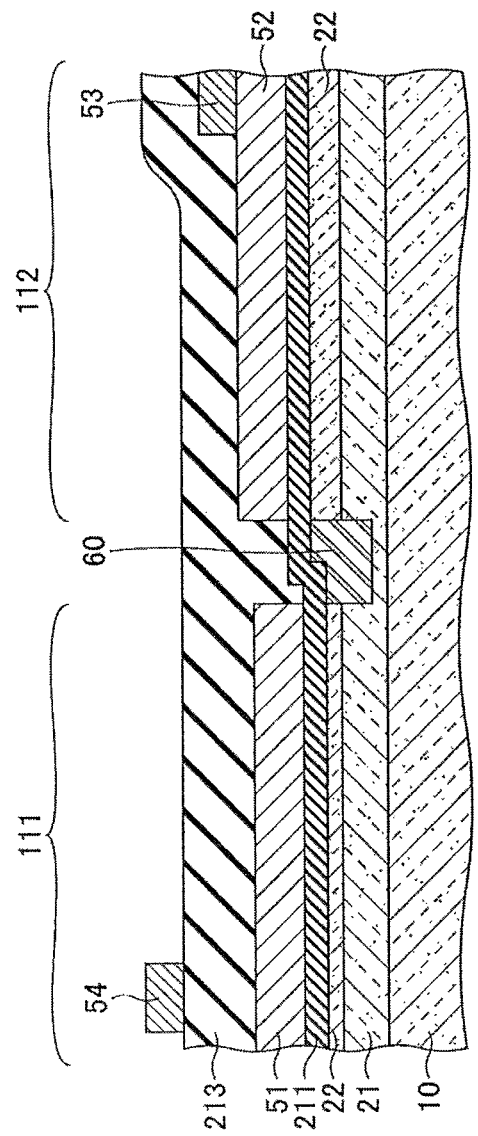
FIG. 10 is a first cross-sectional view of the semiconductor apparatus according to the second embodiment.
Figure 11:
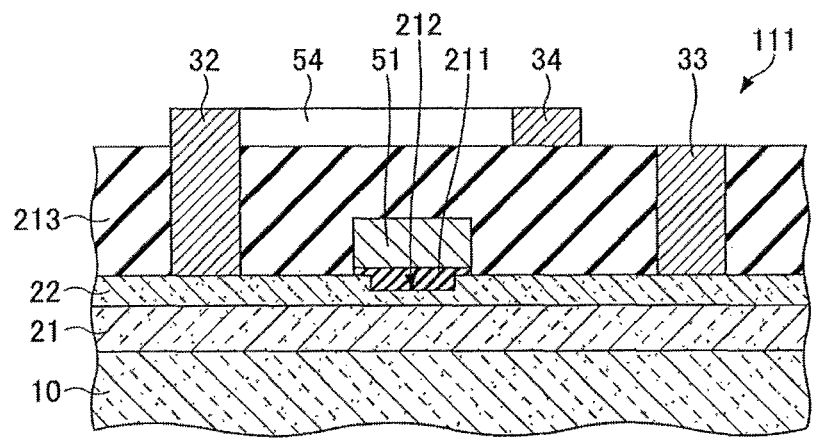
FIG. 11 is a second cross-sectional view of the semiconductor apparatus according to the second embodiment.
Figure 12:
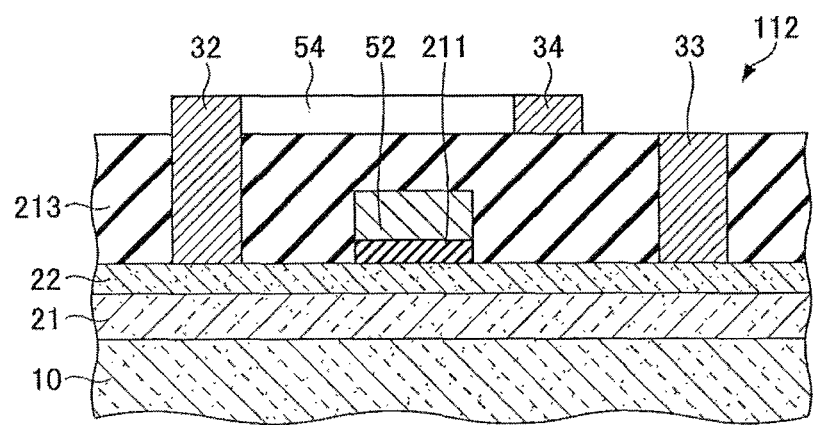
FIG. 12 is a third cross-sectional view of the semiconductor apparatus according to the second embodiment.

Next, the second embodiment is described. In a semiconductor apparatus according to this embodiment, a gate recess is formed on the first transistor. By doing this, a gate threshold value voltage of the first transistor becomes greater than that of the second transistor. The semiconductor apparatus according to this embodiment is described with reference to FIGS. 9 through 12. FIG. 9 is a top view of the semiconductor apparatus such according to this embodiment. In FIG. 9, interlayer insulation films are not shown. FIG. 10 is a cross-sectional view of the semiconductor apparatus when cut along the dashed-dotted line 9A-9B of FIG. 9. FIG. 11 is a cross-sectional view of the semiconductor apparatus when cut along the dashed-dotted line 9C-9D of FIG. 9. FIG. 12 is a cross-sectional view of the semiconductor apparatus when cut along the dashed-dotted line 9E-9F of FIG. 9.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21.

In a region where the first transistor 111 is to be formed, a gate recess 212 is formed by removing a part of the electron supply layer 22 in the region where the first gate electrode 51 is to be formed. A gate insulation film 211 is formed on the electron supply layer 22 in the region where the gate recess 212 is formed. The first gate electrode 51 is formed on the gate insulation film 211. Further, the gate insulation film 211 is formed on the electron supply layer 22 in the region where the second gate electrode 52 is to be formed. The second gate electrode 52 is formed on the gate insulation film 211. Further, the source electrode 32 and the drain electrode 33 are formed on the electron supply layer 22. An interlayer insulation film 213 is formed on the electron supply layer 22, the first gate electrode 51, and the second gate electrode 52. The field plate (FP) 34 and a connection electrode 54 are formed in predetermined regions on the interlayer insulation film 213.

The substrate 10 is made of silicon, but may alternatively be made of SiC, sapphire or the like.

The gate insulation film 211 is made of a High-k material such as nitride silicon (SiN), silicon oxide (SiO), aluminum nitride (AlN), aluminum oxide ($Al_2O_3$), zirconium oxide ($ZrO_x$), or hafnium oxide ($HfO_x$). Specifically, the gate insulation film 211 is formed by using any one of the materials or by laminating some of the materials.

The first gate electrode 51 and the second gate electrode 52 are formed of, for example, TiN, TaN, W, Pt, Al, polysilicon, or amorphous silicon in which an impurity element is doped.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the gate recess 212 is formed in the region where the first gate electrode 51 is formed in the first transistor 111. Therefore, it becomes possible to remove all or a part of the 2 DEG in the region under the first gate electrode 51. By doing this, the gate threshold value voltage of the first transistor 111 becomes greater than that of the second transistor 112.

As illustrated in FIG. 9, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 13A through 17C.

Figure 13A:
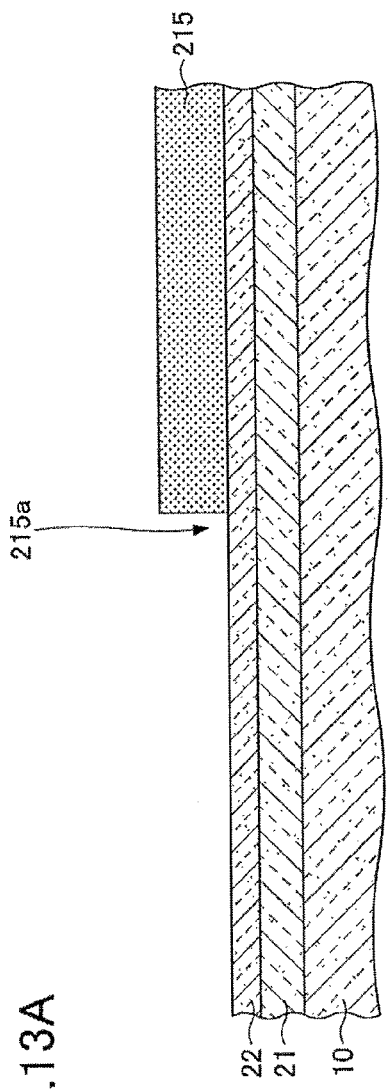
FIGS. 13A through 13C are first cross-sectional views illustrating a method of manufacturing the semiconductor apparatus according to the second embodiment.
Figure 13B:
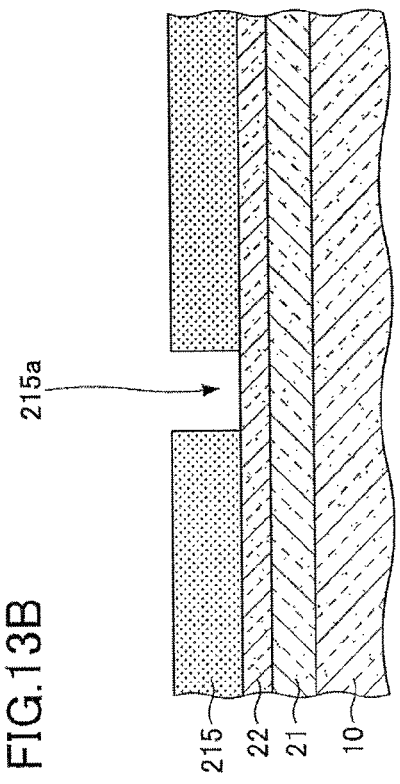
Figure 13C:
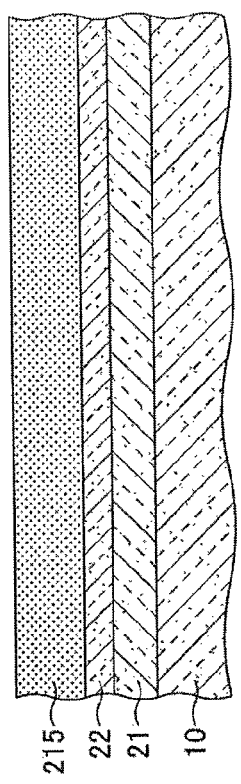

First, as illustrated in FIGS. 13A through 13C, a nitride semiconductor layer is formed on the substrate 10 made of silicon or the like, and a resist pattern 215 is formed on the nitride semiconductor layer. Here, FIG. 13A is a cross-sectional view of the semiconductor apparatus when cut along the dashed-dotted line 9A-9B of FIG. 9. FIG. 13B is a cross-sectional view of the semiconductor apparatus when cut along the dashed-dotted line 9C-9D of FIG. 9. FIG. 13C is a cross-sectional view of the semiconductor apparatus when cut along the dashed-dotted line 9E-9F of FIG. 9.

Specifically, nitride semiconductor layers such as the buffer layer (not shown) made of AlN, AlGaN or the like, the electron transit layer 21, and the electron supply layer 22 are laminated by epitaxial growth on the substrate 10. The electron transit layer 21 is made of GaN and has a film thickness of approximately 1 µm. The electron supply layer 22 is made of AlGaN, more specifically $Al_xGa_{1-x}N$ where x value is in a range of 0.15 to 0.25, so that the film thickness thereof is in a range of 15 nm to 25 nm.

In this embodiment, for example, the nitride semiconductor layers may be formed by Metal-Organic Vapor Phase Epitaxy (MOVPE). When the nitride semiconductor layers are formed by MOVPE, for example, trimethyl aluminum (TMA) is used as the source gas of Al, trimethyl gallium (TMG) is used as the source gas of Ga, and ammonia ($NH_3$) is used as the source gas of N. Further, n-type of the electron supply layer 22 may be given by doping Si or the like as an impurity element. In this case, for example, monosilane ($SiH_4$) is used as the source gas of Si.

The resist pattern 215 is formed by applying a photoresist on the electron supply layer 22 and exposing and developing the photoresist by an exposure device. The resist pattern 215 formed as described above includes an opening part 215a in the region where the gate recess 212 is to be formed.

Next, as illustrated in FIGS. 14A through 14C, a part of the electron supply layer 22 is removed by dry etching such as Reactive Ion Etching (RIE) so that the thickness of the electron supply layer 22 at the opening part 215a of the resist pattern 215 is in a range of 5 nm to 20 nm. By doing this, the gate recess 212 is formed. Further, after that, the resist pattern 215 is removed with an organic solvent or the like, and a resist pattern 216 is formed, the resist pattern 216 having an opening part 216a at the region where the element isolation region 60 is to be formed. Further, FIG. 14A is a cross-sectional view of the semiconductor apparatus when cut along the dashed-dotted line 9A-9B of FIG. 9. FIG. 14B is a cross-sectional view of the semiconductor apparatus when cut along the dashed-dotted line 9C-9D of FIG. 9. FIG. 14C is a cross-sectional view of the semiconductor apparatus when cut along the dashed-dotted line 9E-9F of FIG. 9.

When the electron supply layer 22 at the opening part 215a of the resist pattern 215 is partially removed by RIE or the like, chlorine-based gas, $SF_x$-based gas or the like is used. The resist pattern 216 is formed by removing the resist pattern 215 with an organic solvent or the like and applying a photoresist on the electron supply layer 22 and exposing and developing the photoresist by an exposure device.

Figure 15A:
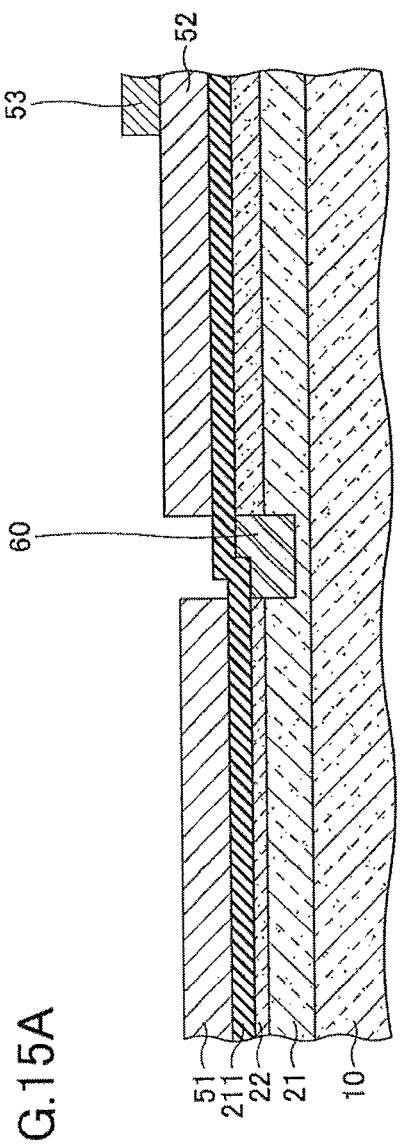
FIGS. 15A through 15C are third cross-sectional views illustrating the method of manufacturing the semiconductor apparatus according to the second embodiment.
Figure 15C:
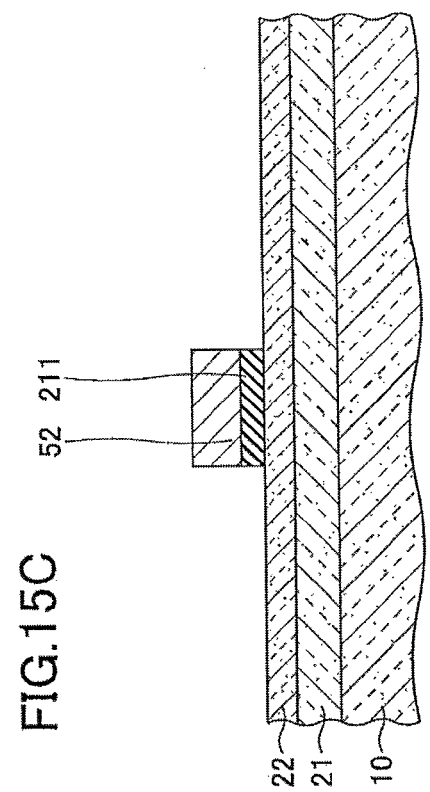
Figure 15B:
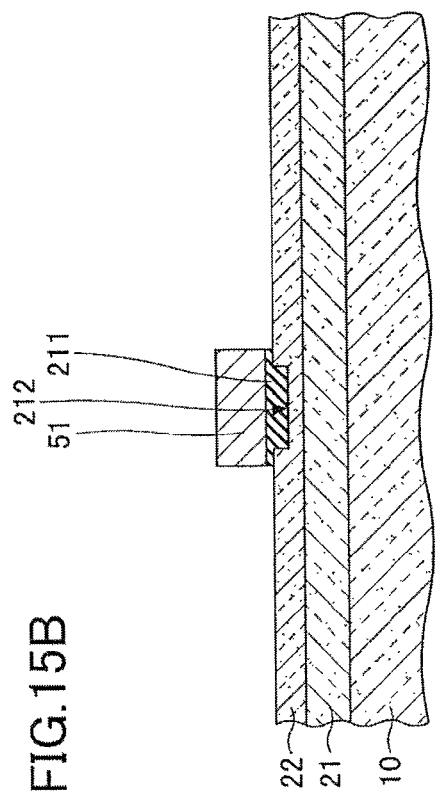

Next, as illustrated in FIGS. 15A through 15C, the element isolation region 60 is formed in the nitride semiconductor layer at the opening part 216a of the resist pattern 216. Further, the resist pattern 216 is removed so that the gate insulation film 211, the first gate electrode 51, and the second gate electrode 52 are formed. Here, FIG. 15A is a cross-sectional view of the semiconductor apparatus when cut along the dashed-dotted line 9A-9B of FIG. 9. FIG. 15B is a cross-sectional view of the semiconductor apparatus when cut along the dashed-dotted line 9C-9D of FIG. 9. FIG. 15C is a cross-sectional view of the semiconductor apparatus when cut along the dashed-dotted line 9E-9F of FIG. 9.

Specifically, the element isolation region 60 is formed by performing ion implantation of Ar ions, B ions or the like at a predetermined acceleration voltage into the nitride semiconductor layer at the opening part 216a of the resist pattern 216, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 216 is removed with an organic solvent or the like.

To form the gate insulation film 211, first, an insulation film made of SiN or the like for forming the gate insulation film 211 is formed by Chemical Vapor Deposition (CVD) or Atomic Layer Deposition (ALD). After that, a resist pattern (not shown) is formed on the formed insulation film made of SiN or the like in the region where the gate insulation film 211 is to be formed. The insulation film in the region where the resist pattern is not formed is removed by dry etching or wet etching, so as to form the gate insulation film 211. The resist pattern (not shown) is removed with an organic solvent or the like.

To form the first gate electrode 51 and the second gate electrode 52, first, a resist pattern (not shown) is formed on the electron supply layer 22 in the regions where the first gate electrode 51 and the second gate electrode 52 are to be formed. The resist pattern has opening parts in the regions where the first gate electrode 51 and the second gate electrode 52 are to be formed. After that, a metal film for forming the first gate electrode 51 and the second gate electrode 52 is formed on the surface where the resist pattern is formed by, for example, vacuum deposition, and is dipped into an organic solvent or the like. By doing this, the metal film formed on the resist film and the resist pattern are removed by lift-off, so that the first gate electrode 51 and the second gate electrode 52 are formed based on the remaining metal film.

By doing this, the first gate electrode 51 is formed on the gate insulation film 211 in the region including the region where the gate recess 212 is formed in the region where the first transistor 111 is to be formed. The second gate electrode 52 is formed on the gate insulation film 211 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Next, as illustrated in FIGS. 16A through 16C, the interlayer insulation film 213 is formed on the electron supply layer 22, the first gate electrode 51, and the second gate electrode 52. Further, opening parts 213a and 213b are formed in the interlayer insulation film 213 in the regions where the source electrode 32 and a drain electrode 33 are to be formed. Here, FIG. 16A is a cross-sectional view of the semiconductor apparatus when cut along the dashed-dotted line 9A-9B of FIG. 9. FIG. 16B is a cross-sectional view of the semiconductor apparatus when cut along the dashed-dotted line 9C-9D of FIG. 9. FIG. 16C is a cross-sectional view of the semiconductor apparatus when cut along the dashed-dotted line 9E-9F of FIG. 9.

Specifically, first, the interlayer insulation film 213 is formed on the electron supply layer 22, the first gate electrode 51, and the second gate electrode 52 by forming a $SiO_2$ or SiN layer or a laminated layer of $SiO_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Figure 17A:
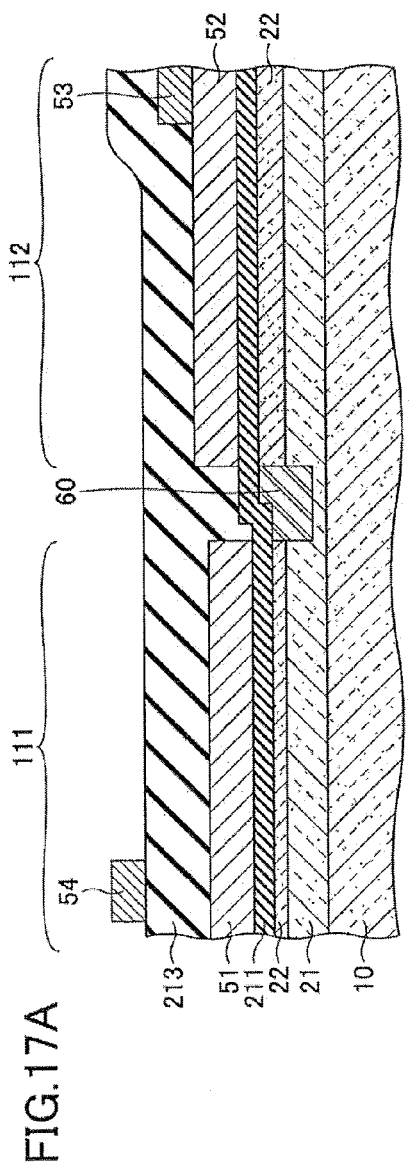
FIGS. 17A through 17C are fifth cross-sectional views illustrating the method of manufacturing the semiconductor apparatus according to the second embodiment.
Figure 17C:
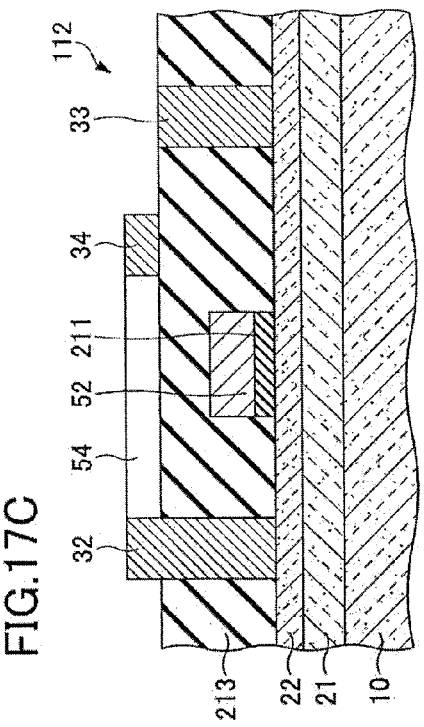
Figure 17B:
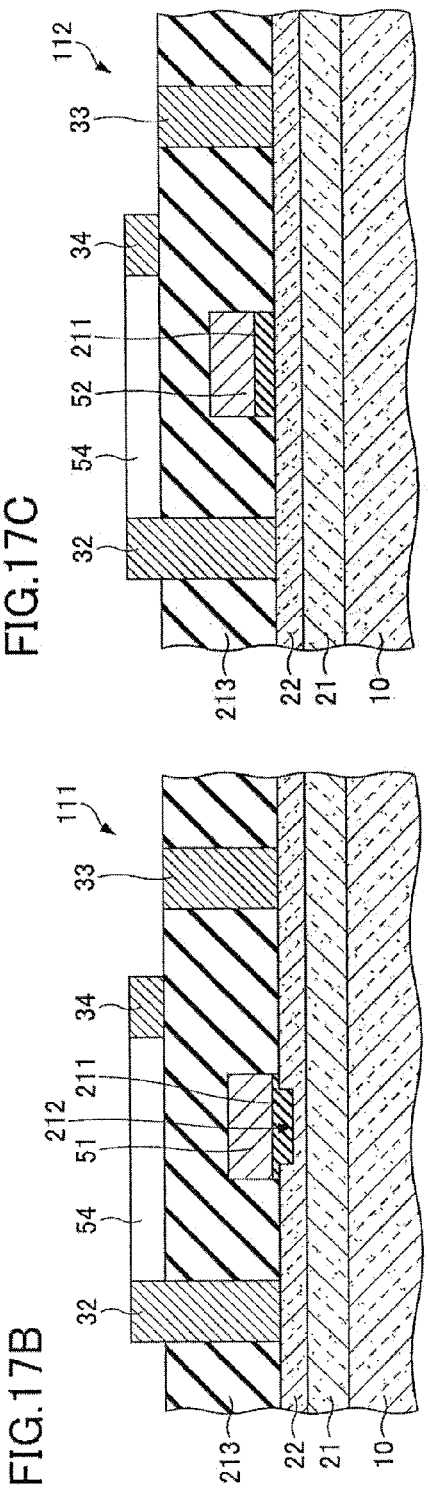

Next, as illustrated in FIG. 17A through 17C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 17A is a cross-sectional view of the semiconductor apparatus when cut along the dashed-dotted line 9A-9B of FIG. 9. FIG. 17B is a cross-sectional view of the semiconductor apparatus when cut along the dashed-dotted line 9C-9D of FIG. 9. FIG. 17C is a cross-sectional view of the semiconductor apparatus when cut along the dashed-dotted line 9E-9F of FIG. 9.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first embodiment.

Third Embodiment

Semiconductor Apparatus

Figure 18:
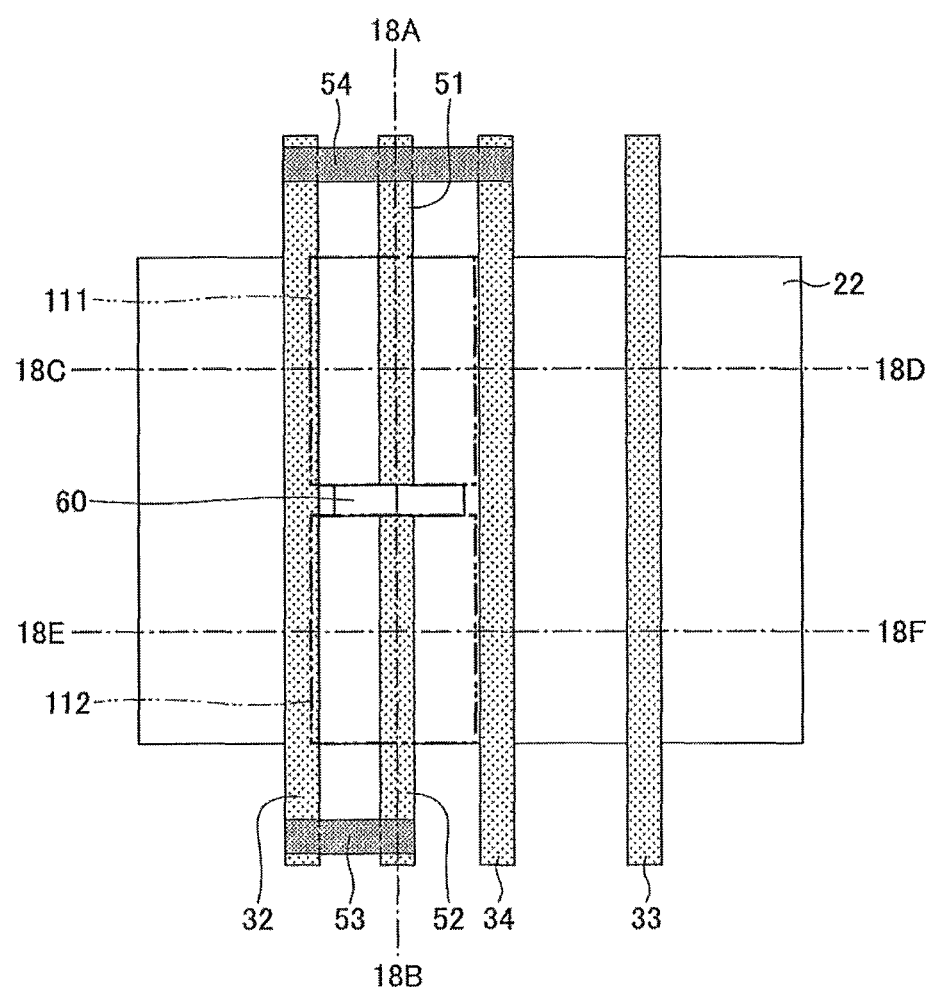
FIG. 18 is a top view of a semiconductor apparatus according to a third embodiment.
Figure 19:
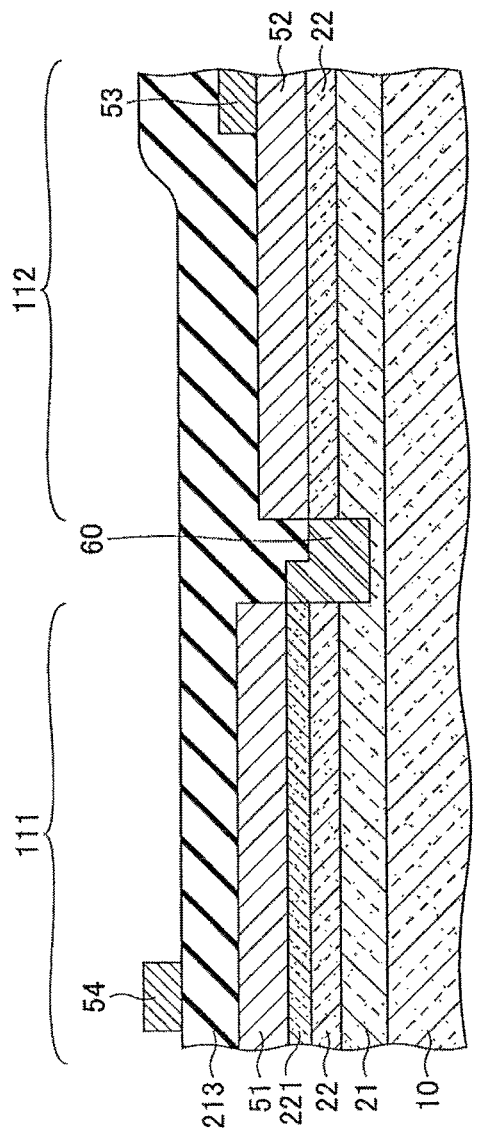
FIG. 19 is a first cross-sectional view of the semiconductor apparatus according to the third embodiment.
Figure 20:
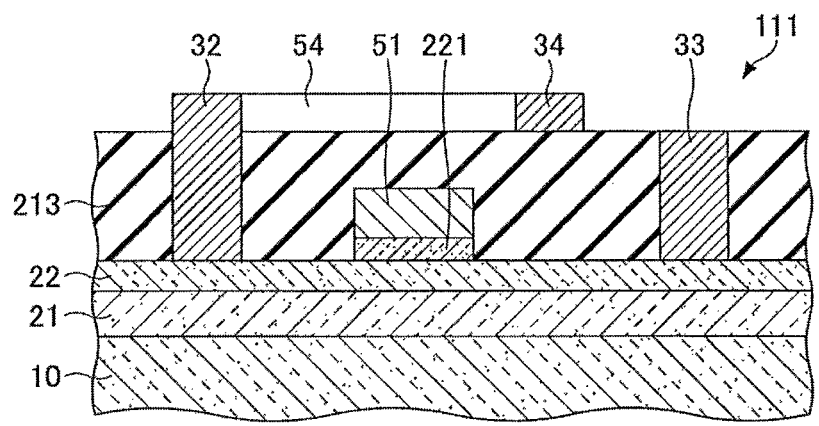
FIG. 20 is a second cross-sectional view of the semiconductor apparatus according to the third embodiment.
Figure 21:
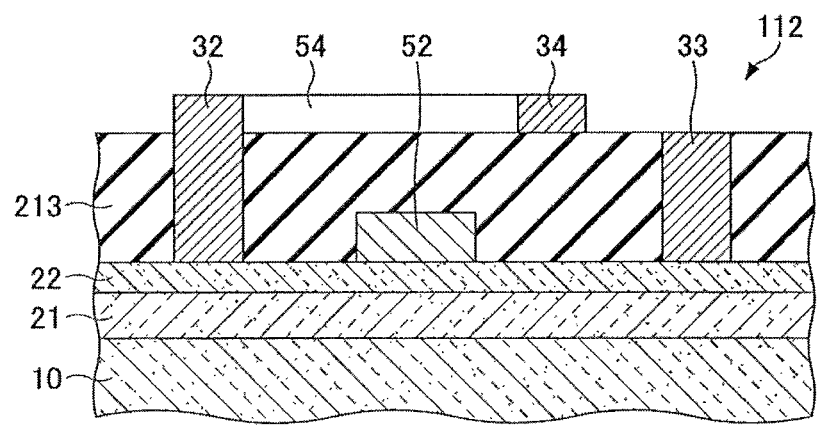
FIG. 21 is a third cross-sectional view of the semiconductor apparatus according to the third embodiment.

Next, a third embodiment is described. In a semiconductor apparatus according to this embodiment, a p-type layer is formed in the first transistor, so that the gate threshold value voltage of the first transistor is greater than that of the second transistor. The semiconductor according to this embodiment is described with reference to FIGS. 18 through 21. FIG. 18 is a top view of the semiconductor apparatus according to this embodiment. Further, in FIG. 18, the interlayer insulation films are not shown. FIG. 19 is a cross-sectional view of the semiconductor apparatus when cut along the dashed-dotted line 18A-18B of FIG. 18. FIG. 20 is a cross-sectional view of the semiconductor apparatus when cut along the dashed-dotted line 18C-18D of FIG. 18. FIG. 21 is a cross-sectional view of the semiconductor apparatus when cut along the dashed-dotted line 18E-18F of FIG. 18.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21. In a region where the first transistor 111 is to be formed, a p-type layer 221 is formed on the electron supply layer 22 in the region where the first gate electrode 51 is to be formed. The first gate electrode 51 is to be formed on the p-type layer 221 formed as described above. Further, in a region where the second transistor 112 is to be formed, the second gate electrode 52 is formed on the electron supply layer 22. Further, the source electrode 32 and the drain electrode 33 are formed on the electron supply layer 22. The interlayer insulation film 213 is formed on the electron supply layer 22, the first gate electrode 51, and the second gate electrode 52. The field plate (FP) 34 and the connection electrode 54 are formed in predetermined regions on the interlayer insulation film 213.

The substrate 10 is made of silicon, but may alternatively be made of SiC, sapphire or the like.

The first gate electrode 51 and the second gate electrode 52 are formed of, for example, TiN, TaN, W, Pt, Al, polysilicon, or amorphous silicon in which an impurity element is doped.

The p-type layer 221 is formed of GaN in which Mg is doped as a p-type impurity element.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the p-type layer 221 is formed under the first gate electrode 51 in the first transistor 111. Therefore, it becomes possible to remove all or a part of the 2 DEG in the region under the first gate electrode 51. By doing this, the gate threshold value voltage of the first transistor 111 becomes greater than that of the second transistor 112.

As illustrated in FIG. 18, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 22A through 26C.

Figure 22A:
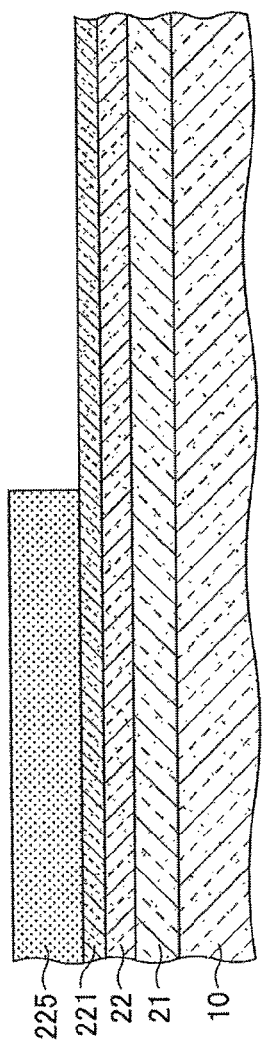
FIGS. 22A through 22C are first cross-sectional views illustrating a method of manufacturing the semiconductor apparatus according to the third embodiment.
Figure 22C:
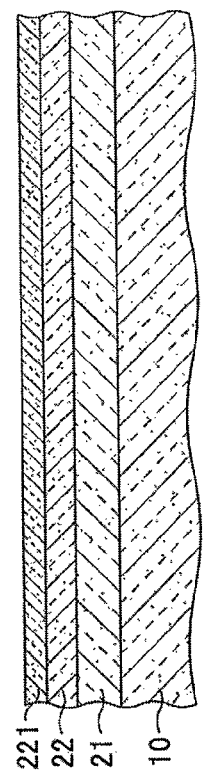
Figure 22B:
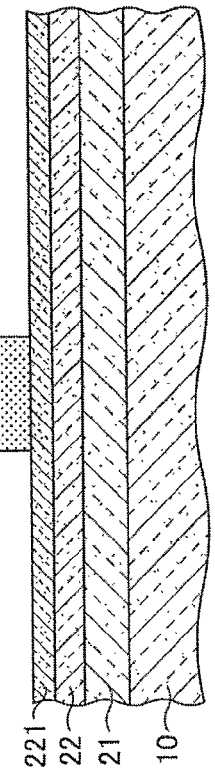

First, as illustrated in FIGS. 22A through 22C, a nitride semiconductor layer is formed on the substrate 10 made of silicon or the like, and a resist pattern 225 is formed on a predetermined region of the nitride semiconductor layer. Here, FIG. 22A is a cross-sectional view of the semiconductor apparatus when cut along the dashed-dotted line 18A-18B of FIG. 18. FIG. 22B is a cross-sectional view of the semiconductor apparatus when cut along the dashed-dotted line 18C-18D of FIG. 18. FIG. 24C is a cross-sectional view of the semiconductor apparatus when cut along the dashed-dotted line 18E-18F of FIG. 18.

Specifically, nitride semiconductor layers such as the buffer layer (not shown) made of AlN, AlGaN or the like, the electron transit layer 21, the electron supply layer 22, and the p-type layer 221 are sequentially laminated by epitaxial growth on the substrate 10. The electron transit layer 21 is made of GaN and has a film thickness of approximately 1 µm. The electron supply layer 22 is made of AlGaN, more specifically $Al_xGa_{1-x}N$ where x value is in a range of 0.15 to 0.25, so that the film thickness thereof is in a range of 15 nm to 25 nm. The p-type layer 221 is made of p-GaN and has a film thickness in a range of 40 nm to 80 nm. As a p-type impurity element, Mg is doped so that the impurity concentration is in a range of $1 \times 10^{19}$ $cm^{-3}$ to $3 \times 10^{19}$ $cm^{-3}$.

The resist pattern 225 is formed in the region where the first gate electrode 51 is to be formed by applying a photoresist on the p-type layer 221 and exposing and developing the photoresist by an exposure device.

Figure 23A:
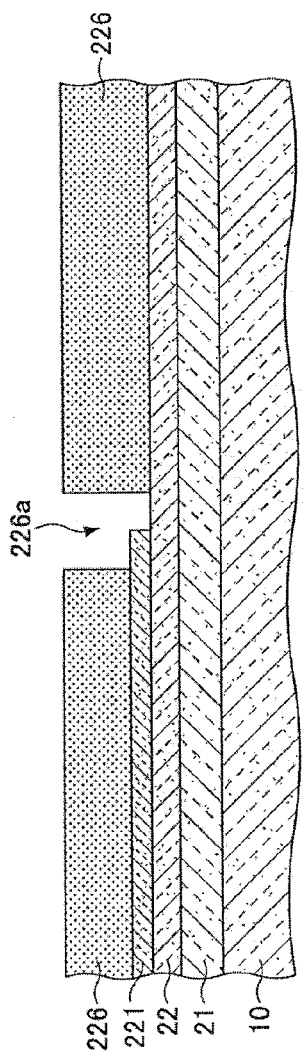
FIGS. 23A through 23C are second cross-sectional views illustrating the method of manufacturing the semiconductor apparatus according to the third embodiment.
Figure 23C:
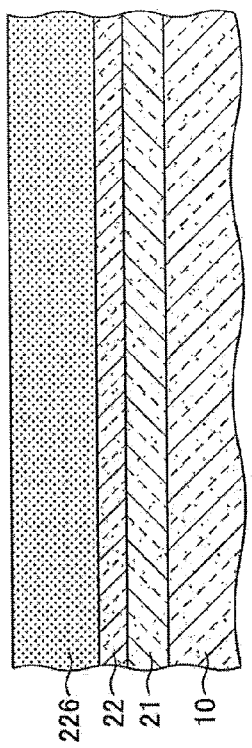
Figure 23B:
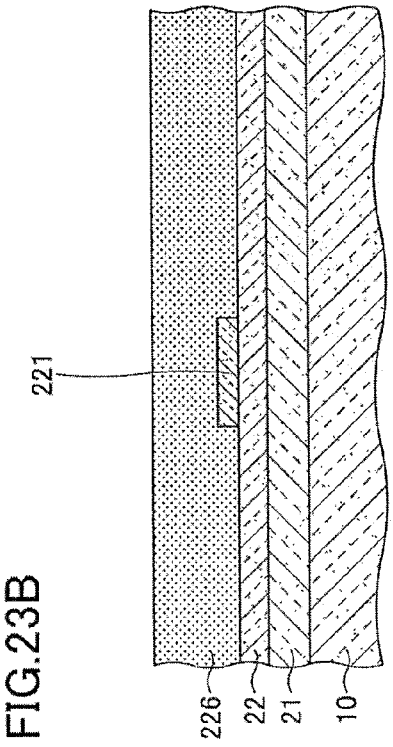

Next, as illustrated in FIGS. 23A through 23C, the p-type layer 221 is formed in the region where the first gate electrode 51 is to be formed by removing the p-type layer 221 in the region where the resist pattern 225 is not formed. After that, the resist pattern 225 is removed with an organic solvent or the like, and a resist pattern 226 is formed, the resist pattern 226 having an opening part 226a at the region where the element isolation region 60 is to be formed. Further, FIG. 23A is a cross-sectional view of the semiconductor apparatus when cut along the dashed-dotted line 18A-18B of FIG. 18. FIG. 23B is a cross-sectional view of the semiconductor apparatus when cut along the dashed-dotted line 18C-18D of FIG. 18. FIG. 23C is a cross-sectional view of the semiconductor apparatus when cut along the dashed-dotted line 18E-18F of FIG. 18.

When the p-type layer 221 in the region where the resist pattern 225 is not formed is partially removed by RIE or the like, chlorine-based gas, $SF_x$-based gas or the like is used. The resist pattern 226 is formed by removing the resist pattern 225 with an organic solvent or the like and applying a photoresist on the electron supply layer 22 and exposing and developing the photoresist by an exposure device.

Figure 24A:
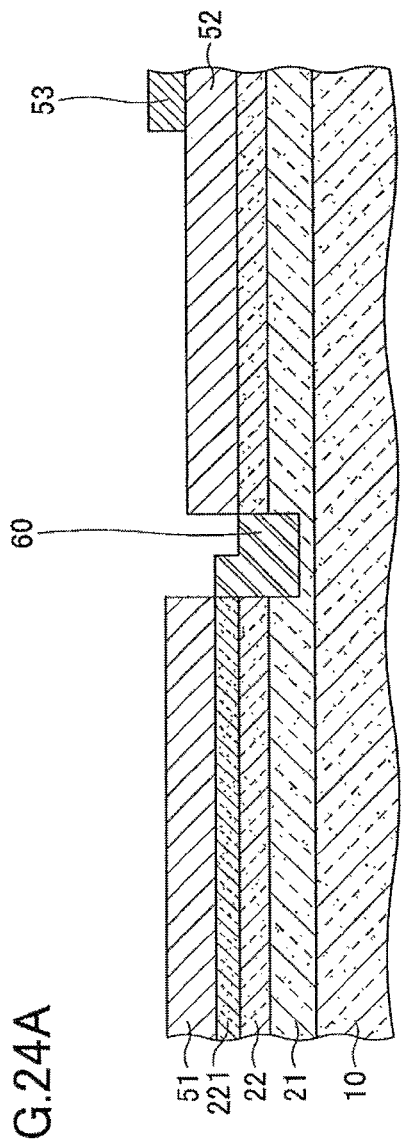
FIGS. 24A through 24C are third cross-sectional views illustrating the method of manufacturing the semiconductor apparatus according to the third embodiment.
Figure 24C:
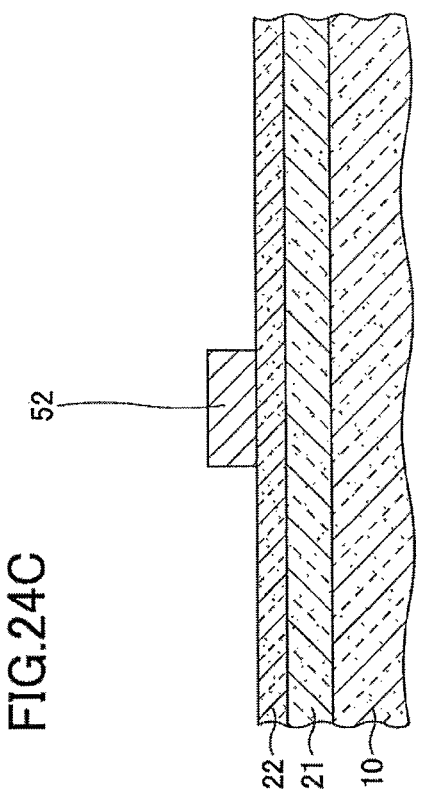
Figure 24B:
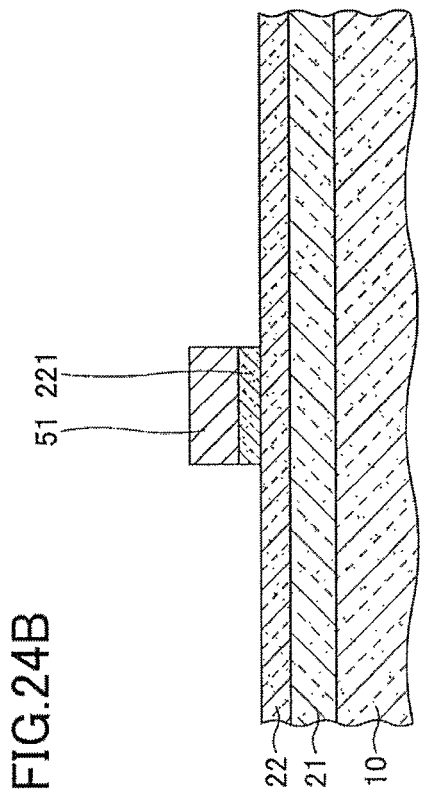

Next, as illustrated in FIGS. 24A through 24C, the element isolation region 60 is formed in the nitride semiconductor layer at the opening part 226a of the resist pattern 226. Further, the resist pattern 226 is removed and the first gate electrode 51 and the second gate electrode 52 are formed. Here, FIG. 24A is a cross-sectional view of the semiconductor apparatus when cut along the dashed-dotted line 18A-18B of FIG. 18. FIG. 24B is a cross-sectional view of the semiconductor apparatus when cut along the dashed-dotted line 18C-18D of FIG. 18. FIG. 24C is a cross-sectional view of the semiconductor apparatus when cut along the dashed-dotted line 18E-18F of FIG. 18.

Specifically, the element isolation region 60 is formed by performing ion implantation of Ar ions, B ions or the like at a predetermined acceleration voltage into the nitride semiconductor layer at the opening part 226a of the resist pattern 226, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 226 is removed with an organic solvent or the like.

To form the first gate electrode 51 and the second gate electrode 52, first, a resist pattern (not shown) is formed on the electron supply layer 22 in the regions where the first gate electrode 51 and the second gate electrode 52 are to be formed. The resist pattern has opening parts in the regions where the first gate electrode 51 and the second gate electrode 52 are to be formed. After that, a metal film for forming the first gate electrode 51 and the second gate electrode 52 is formed on the surface where the resist pattern is formed by, for example, vacuum deposition, and is dipped into an organic solvent or the like. By doing this, the metal film formed on the resist film and the resist pattern are removed by lift-off, so that the first gate electrode 51 and the second gate electrode 52 are formed based on the remaining metal film.

By doing this, the first gate electrode 51 is formed on the p-type layer 221 in the region where the first transistor 111 is to be formed. The second gate electrode 52 is formed on the electron supply layer 22 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Figure 25A:
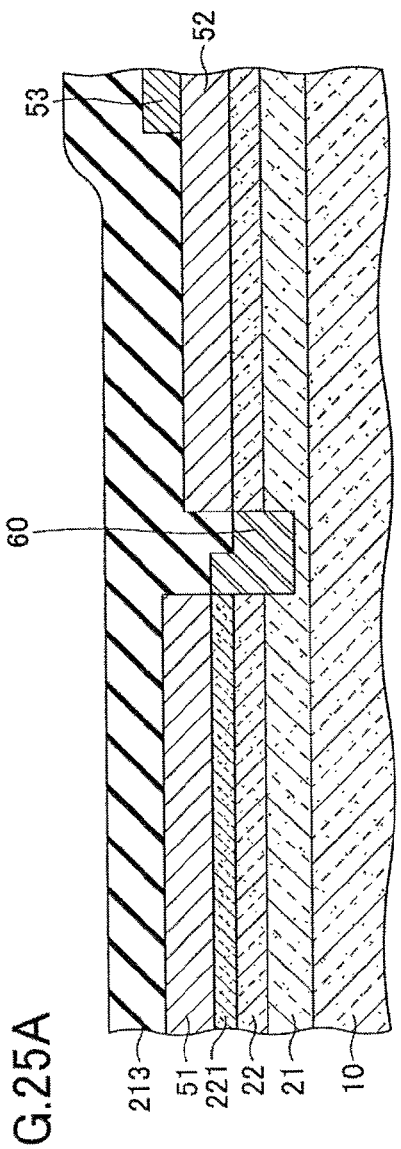
FIGS. 25A through 25C are fourth cross-sectional views illustrating the method of manufacturing the semiconductor apparatus according to the third embodiment.
Figure 25C:
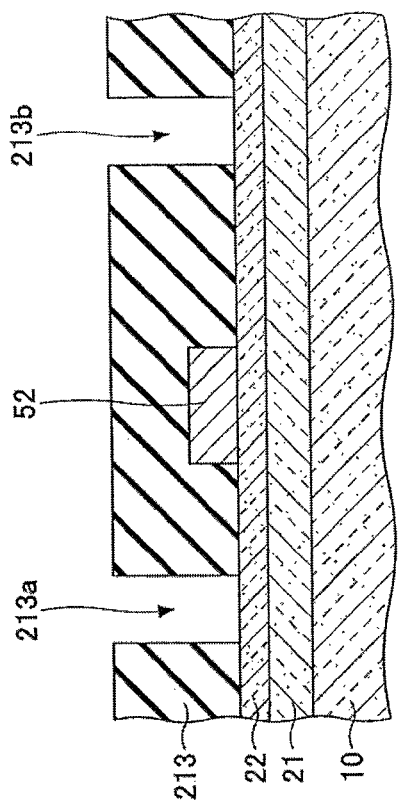
Figure 25B:
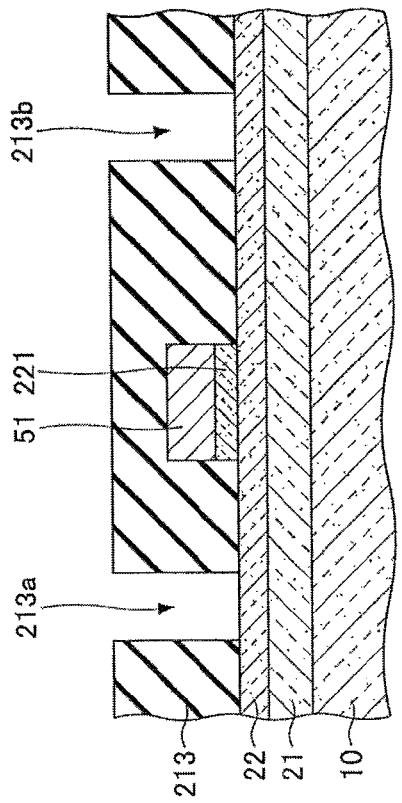

Next, as illustrated in FIGS. 25A through 25C, the interlayer insulation film 213 is formed on the electron supply layer 22, the first gate electrode 51, and the second gate electrode 52. Further, opening parts 213a and 213b are formed in the interlayer insulation film 213 in the regions where the source electrode 32 and the drain electrode 33 are to be formed. Here, FIG. 25A is a cross-sectional view of the semiconductor apparatus when cut along the dashed-dotted line 18A-18B of FIG. 18. FIG. 25B is a cross-sectional view of the semiconductor apparatus when cut along the dashed-dotted line 18C-18D of FIG. 18. FIG. 25C is a cross-sectional view of the semiconductor apparatus when cut along the dashed-dotted line 18E-18F of FIG. 18.

Specifically, first, the interlayer insulation film 213 is formed on the electron supply layer 22, the first gate electrode 51, and the second gate electrode 52 by forming a $SiO_2$ or SiN layer or a laminated layer of $SiO_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that, the resist pattern (not shown) is removed with an organic solvent or the like.

Next, as illustrated in FIG. 26A through 26C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 26A is a cross-sectional view of the semiconductor apparatus when cut along the dashed-dotted line 18A-18B of FIG. 18. FIG. 26B is a cross-sectional view of the semiconductor apparatus when cut along the dashed-dotted line 18C-18D of FIG. 18. FIG. 26C is a cross-sectional view of the semiconductor apparatus when cut along the dashed-dotted line 18E-18F of FIG. 18.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

Fourth Embodiment

Semiconductor Apparatus

Figure 27:
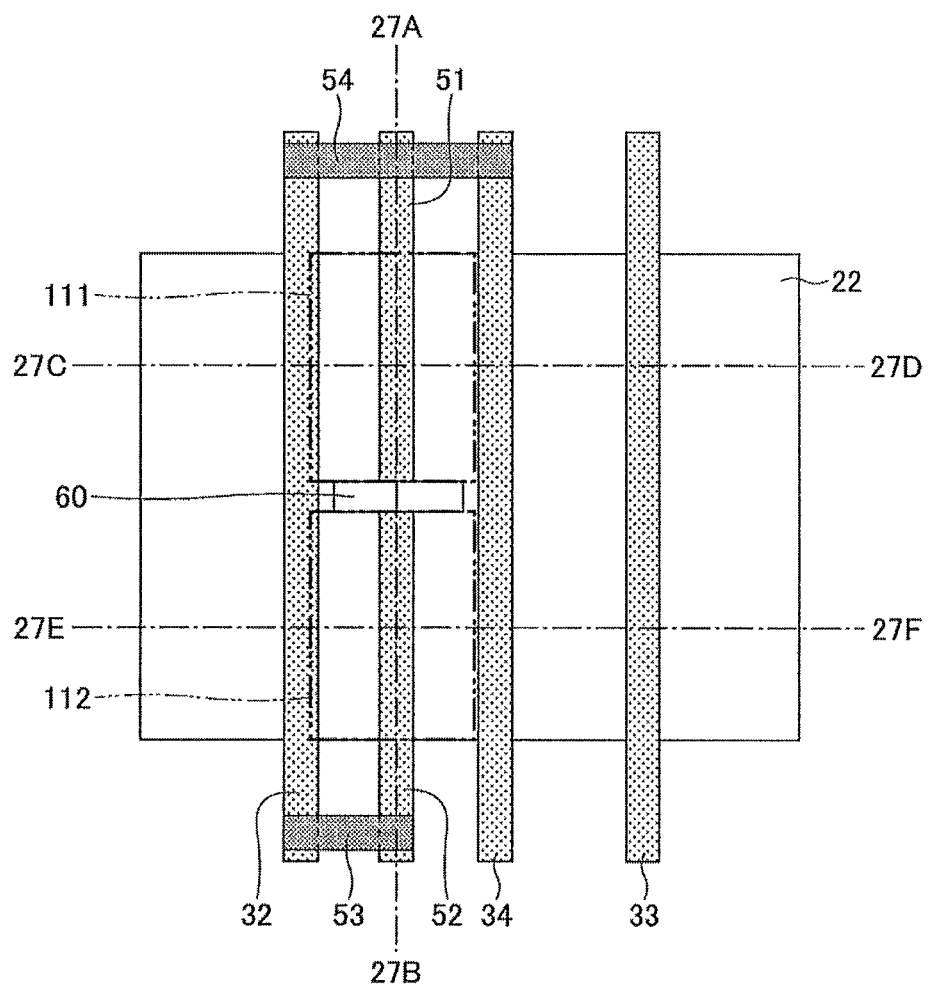
FIG. 27 is a top view of a semiconductor apparatus according to a fourth embodiment.
Figure 28:
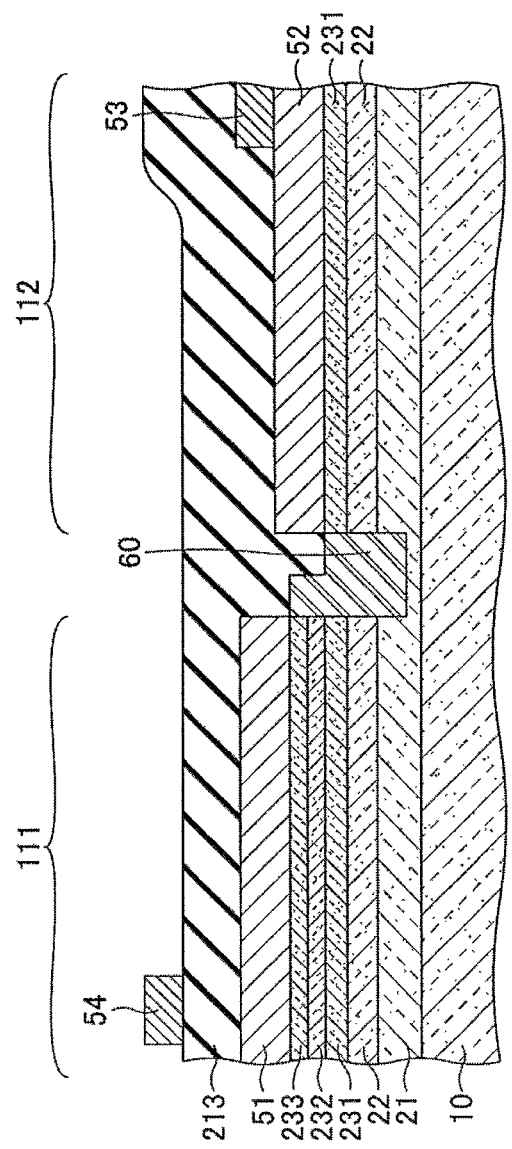
FIG. 28 is a first cross-sectional view of the semiconductor apparatus according to the fourth embodiment.
Figure 29:
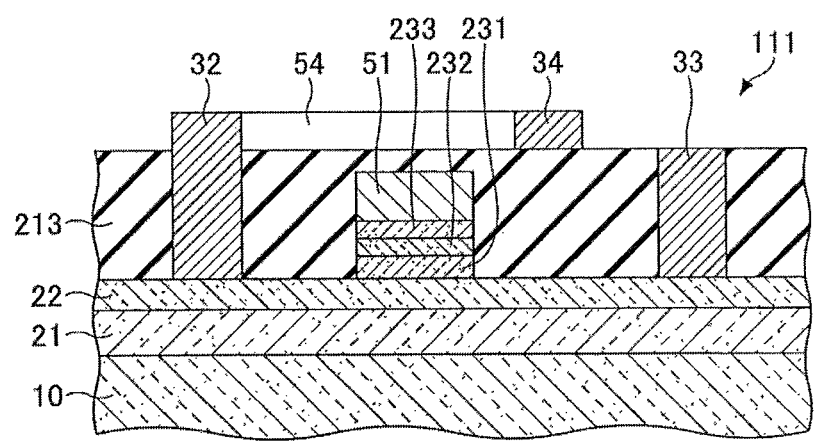
FIG. 29 is a second cross-sectional view of the semiconductor apparatus according to the fourth embodiment.
Figure 30:
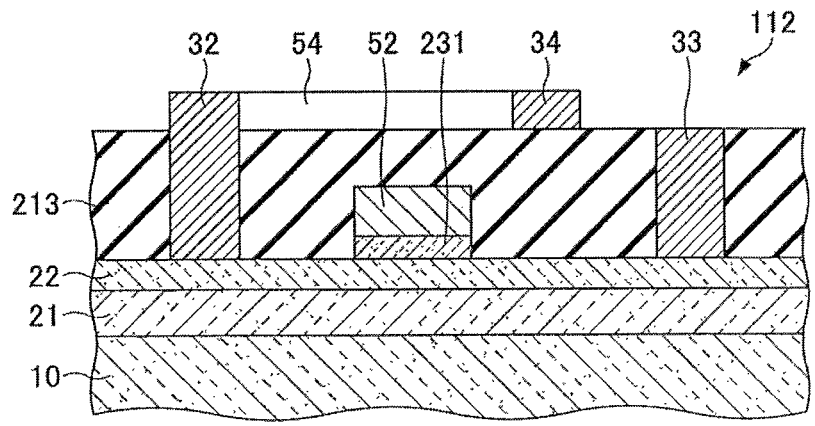
FIG. 30 is a third cross-sectional view of the semiconductor apparatus according to the fourth embodiment.

Next, a fourth embodiment is described. In a semiconductor apparatus according to this embodiment, a p-type layer formed in the first transistor is thicker than a p-type layer formed in the second transistor, so that the gate threshold value voltage of the first transistor is greater than that of the second transistor. The semiconductor according to this embodiment is described with reference to FIGS. 27 through 30. FIG. 27 is a top view of the semiconductor apparatus according to this embodiment. Further, in FIG. 27, the interlayer insulation films are not shown. FIG. 28 is a cross-sectional view of the semiconductor apparatus when cut along the dashed-dotted line 27A-27B of FIG. 27. FIG. 29 is a cross-sectional view of the semiconductor apparatus when cut along the dashed-dotted line 27C-27D of FIG. 27. FIG. 30 is a cross-sectional view of the semiconductor apparatus when cut along the dashed-dotted line 27E-27F of FIG. 27.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21. In a region where the first transistor 111 is to be formed, a first p-type layer 231, a second p-type layer 232, and a third p-type layer 233 are laminated and formed on the electron supply layer 22 in the region where the first gate electrode 51 is to be formed. The first gate electrode 51 is to be formed on the third p-type layer 233 formed as described above. Further, in a region where the second transistor 112 is to be formed, the first p-type layer 231 is formed on the electron supply layer 22. The second gate electrode 52 is formed on the first p-type layer 231. Further, the source electrode 32 and the drain electrode 33 are formed on the electron supply layer 22. The interlayer insulation film 213 is formed on the electron supply layer 22, the first gate electrode 51, and the second gate electrode 52. The field plate (FP) 34 is formed in a predetermined region on the interlayer insulation film 213.

The substrate 10 is made of silicon, but may alternatively be made of SiC, sapphire or the like.

The first gate electrode 51 and the second gate electrode 52 are formed of, for example, TiN, TaN, W, Pt, Al, polysilicon, or amorphous silicon in which an impurity element is doped.

The first p-type layer 231 is formed of GaN in which Mg is doped as a p-type impurity element. The second p-type layer 232 is formed of AlGaN in which Mg is doped as a p-type impurity element. The third p-type layer 233 is formed of GaN in which Mg is doped as a p-type impurity element.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, only the first p-type layer 231 is formed under the second gate electrode 52. But the first p-type layer 231, the second p-type layer 232, and the third p-type layer 233 are formed under the first gate electrode 51. Namely, the P-type layer under the first gate electrode 51 in the first transistor 111 and the p-type layer under the second gate electrode 52 in the second transistor 112 are formed in a manner that the p-type layer formed under the first gate electrode 51 is thicker than the p-type layer formed under the second gate electrode 52. Therefore, it becomes possible to remove all or a part of the 2 DEG in the region under the first gate electrode 51. By doing this, the gate threshold value voltage of the first transistor 111 becomes greater than that of the second transistor 112.

As illustrated in FIG. 27, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 31A through 36C.

First, as illustrated in FIGS. 31A through 31C, a nitride semiconductor layer is formed on the substrate 10 made of silicon or the like, and a resist pattern 235 is formed on a predetermined region of the nitride semiconductor layer. Here, FIG. 31A is a cross-sectional view of the semiconductor apparatus when cut along the dashed-dotted line 27A-27B of FIG. 27. FIG. 31B is a cross-sectional view of the semiconductor apparatus when cut along the dashed-dotted line 27C-27D of FIG. 27. FIG. 31C is a cross-sectional view of the semiconductor apparatus when cut along the dashed-dotted line 27E-27F of FIG. 27.

Specifically, nitride semiconductor layers such as the buffer layer (not shown) made of AlN, AlGaN or the like, the electron transit layer 21, the electron supply layer 22, the first p-type layer 231, the second p-type layer 232, and the third p-type layer 233 are sequentially laminated by epitaxial growth on the substrate 10. The electron transit layer 21 is made of GaN and has a film thickness of approximately 1 μm. The electron supply layer 22 is made of AlGaN, more specifically $Al_xGa_{1-x}N$ where x value is in a range of 0.15 to 0.25, so that the film thickness thereof is in a range of 15 nm to 25 nm. The first p-type layer 231 is made of p-GaN, has a film thickness of 30 nm to 50 nm, and is doped with Mg as a p-type impurity element so that the impurity concentration is in a range of $1\times10^{19}$ cm$^{-3}$ to $3\times10^{19}$ cm$^{-3}$. The second p-type layer 232 is made of p-AlGaN, more specifically $Al_xGa_{1-x}N$ where x value is in a range of 0.15 to 0.25, so that the film thickness thereof is in a range of 5 nm to 15 nm. The second p-type layer 232 is doped with Mg as a p-type impurity element so that the impurity concentration is in a range of $1\times10^{19}$ cm$^{-3}$ to $3\times10^{19}$ cm$^{-3}$. The third p-type layer 233 is made of p-GaN, has a film thickness of 30 nm to 50 nm, and is doped with Mg as a p-type impurity element so that the impurity concentration is in a range of $1\times10^{19}$ cm$^{-3}$ to $3\times10^{19}$ cm$^{-3}$.

The resist pattern 235 is formed in the region where the first gate electrode 51 is to be formed by applying a photoresist on the third p-type layer 233 and exposing and developing the photoresist by an exposure device.

Next, as illustrated in FIGS. 32A through 32C, the third p-type layer 233 and the second p-type layer 232 in the region where the resist pattern 235 is not formed are removed. By doing this, the third p-type layer 233, the second p-type layer 232 in the region, and the first p-type layer 231 are formed in the region where the first gate electrode 51 is to be formed. After that, the resist pattern 235 is removed with an organic solvent or the like. Then, a resist pattern 236 is formed in the regions where the first gate electrode 51 and the second gate electrode 52 are to be formed. Here, FIG. 32A is a cross-sectional view of the semiconductor apparatus when cut along the dashed-dotted line 27A-27B of FIG. 27. FIG. 32B is a cross-sectional view of the semiconductor apparatus when cut along the dashed-dotted line 27C-27D of FIG. 27. FIG. 32C is a cross-sectional view of the semiconductor apparatus when cut along the dashed-dotted line 27E-27F of FIG. 27.

When the third p-type layer 233 and the second p-type layer 232 in the region where the resist pattern 235 is not formed are partially removed by RIE or the like, chlorine-based gas, $SF_x$-based gas or the like is used. Further, in this embodiment, the third p-type layer 233 and the second p-type layer 232 in the region are removed by anisotropic etching. Specifically, the RIE is performed on p-GaN and P—AlGaN using different etching speeds. By doing this, it becomes possible to stop etching in a state where the surface of the first p-type layer 231 formed of p-GaN is exposed. Further, after the resist pattern 235 is removed with an organic solvent or the like, the resist pattern 236 is formed by applying a photoresist on the electron supply layer 22 and exposing and developing the photoresist by an exposure device.

Figure 33A:
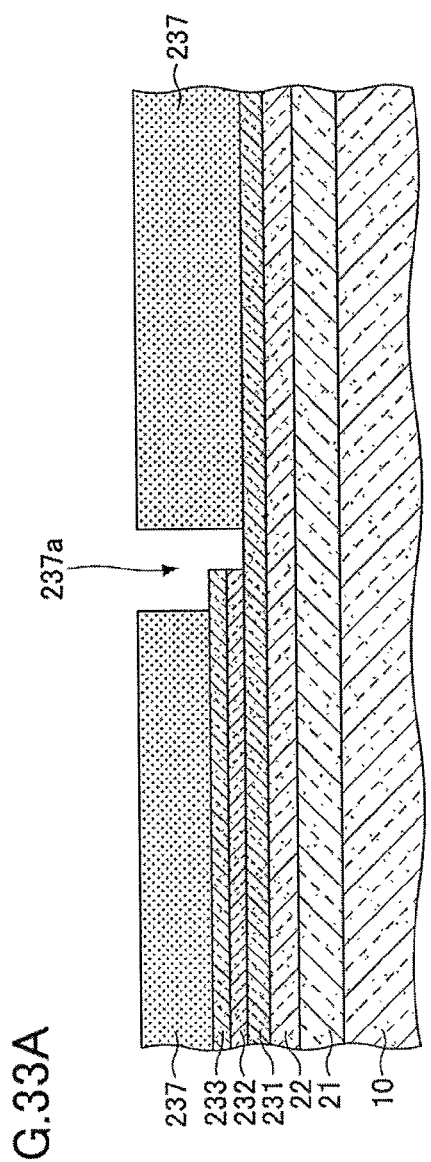
FIGS. 33A through 33C are third cross-sectional views illustrating the method of manufacturing the semiconductor apparatus according to the fourth embodiment.
Figure 33C:
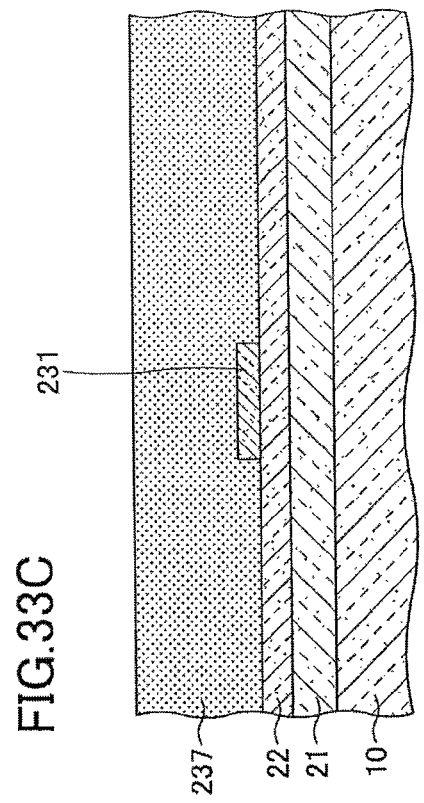
Figure 33B:
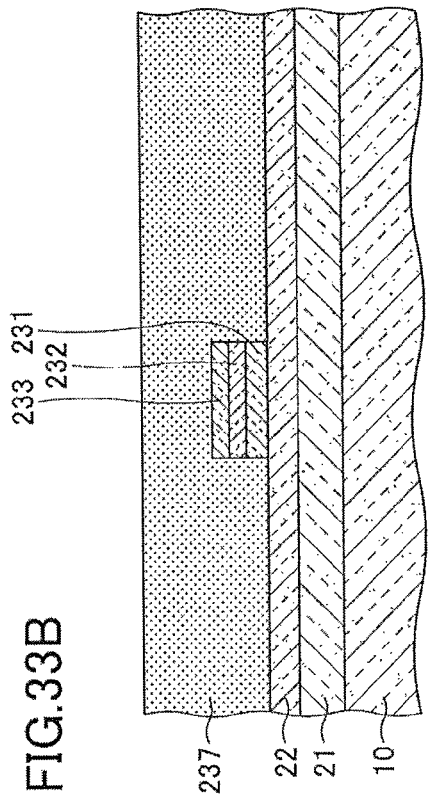

Next, as illustrated in FIGS. 33A through 33C, the first gate electrode 51 in the region where the resist pattern 236 is not formed is removed. By doing this, the first p-type layer 231 is formed in the region where the second gate electrode 52 is to be formed. After that resist pattern 236 is removed with an organic solvent or the like. Further, a resist pattern 237 is formed, the resist pattern 237 having an opening part 237a in the region where the element isolation region 60 is to be formed. Here, FIG. 33A is a cross-sectional view of the semiconductor apparatus when cut along the dashed-dotted line 27A-27B of FIG. 27. FIG. 33B is a cross-sectional view of the semiconductor apparatus when cut along the dashed-dotted line 27C-27D of FIG. 27. FIG. 33C is a cross-sectional view of the semiconductor apparatus when cut along the dashed-dotted line 27E-27F of FIG. 27.

When the first p-type layer 231 in the region where the resist pattern 236 is not formed is partially removed by RIE or the like, chlorine-based gas, $SF_x$-based gas or the like is used. Further, after the resist pattern 236 is removed with an organic solvent or the like, the resist pattern 237 is formed by applying a photoresist on the electron supply layer 22 and exposing and developing the photoresist by an exposure device.

Figure 34A:
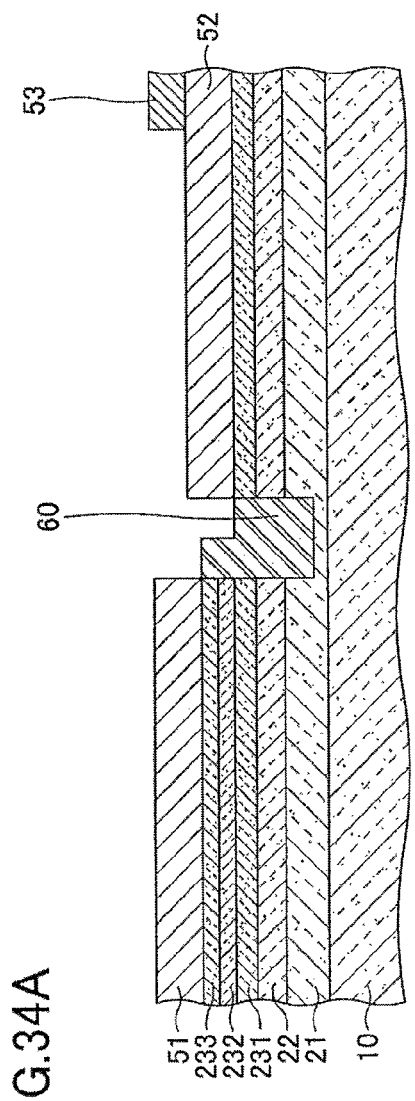
FIGS. 34A through 34C are fourth cross-sectional views illustrating the method of manufacturing the semiconductor apparatus according to the fourth embodiment.
Figure 34C:
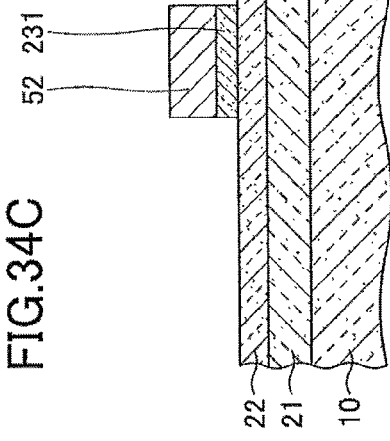
Figure 34B:
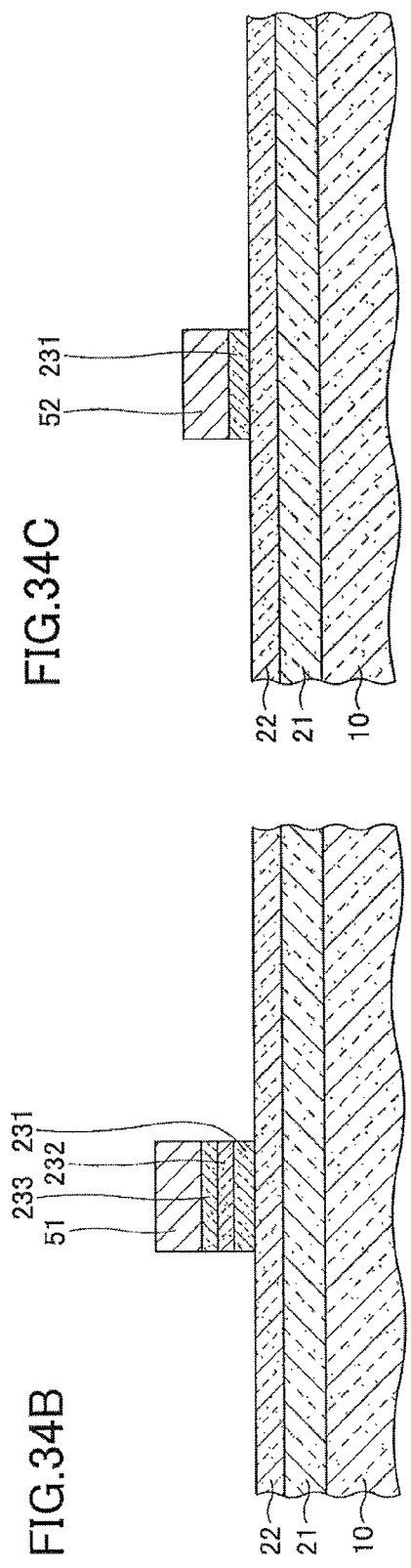

Next, as illustrated in FIGS. 34A through 34C, the element isolation region 60 is formed in the nitride semiconductor layer at the opening part 237a of the resist pattern 237. Further, the resist pattern 237 is removed, so that the first gate electrode 51 and the second gate electrode 52 are formed. Here, FIG. 34A is a cross-sectional view of the semiconductor apparatus when cut along the dashed-dotted line 27A-27B of FIG. 27. FIG. 34B is a cross-sectional view of the semi-conductor apparatus when cut along the dashed-dotted line 27C-27D of FIG. 27. FIG. 34C is a cross-sectional view of the semiconductor apparatus when cut along the dashed-dotted line 27E-27F of FIG. 27.

Specifically, the element isolation region 60 is formed by performing ion implantation of Ar ions, B ions or the like at a predetermined acceleration voltage into the nitride semiconductor layer at the opening part 237a of the resist pattern 237, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 237 is removed with an organic solvent or the like.

To form the first gate electrode 51 and the second gate electrode 52, first, a resist pattern (not shown) is formed on the electron supply layer 22 in the regions where the first gate electrode 51 and the second gate electrode 52 are to be formed. After that, a metal film for forming the first gate electrode 51 and the second gate electrode 52 is formed on the surface where the resist pattern is formed by, for example, vacuum deposition, and is dipped into an organic solvent or the like. By doing this, the metal film formed on the resist film and the resist pattern are removed by lift-off, so that the first gate electrode 51 and the second gate electrode 52 are formed based on the remaining metal film.

By doing this, the first gate electrode 51 is formed on the third p-type layer 233 in the region where the first transistor 111 is to be formed. The second gate electrode 52 is formed on the first p-type layer 231 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Next, as illustrated in FIGS. 35A through 35C, the interlayer insulation film 213 is formed on the electron supply layer 22, the first gate electrode 51, and the second gate electrode 52. Further, the opening parts 213a and 213b are formed in the interlayer insulation film 213 in the regions where the source electrode 32 and the drain electrode 33 are to be formed. Here, FIG. 35A is a cross-sectional view of the semiconductor apparatus when cut along the dashed-dotted line 27A-27B of FIG. 27. FIG. 35B is a cross-sectional view of the semiconductor apparatus when cut along the dashed-dotted line 27C-27D of FIG. 27. FIG. 35C is a cross-sectional view of the semiconductor apparatus when cut along the dashed-dotted line 27E-27F of FIG. 27.

Specifically, first, the interlayer insulation film 213 is formed on the electron supply layer 22, the first gate electrode 51, and the second gate electrode 52 by forming a $SiO_2$ or SiN layer or a laminated layer of $SiO_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Figure 36A:
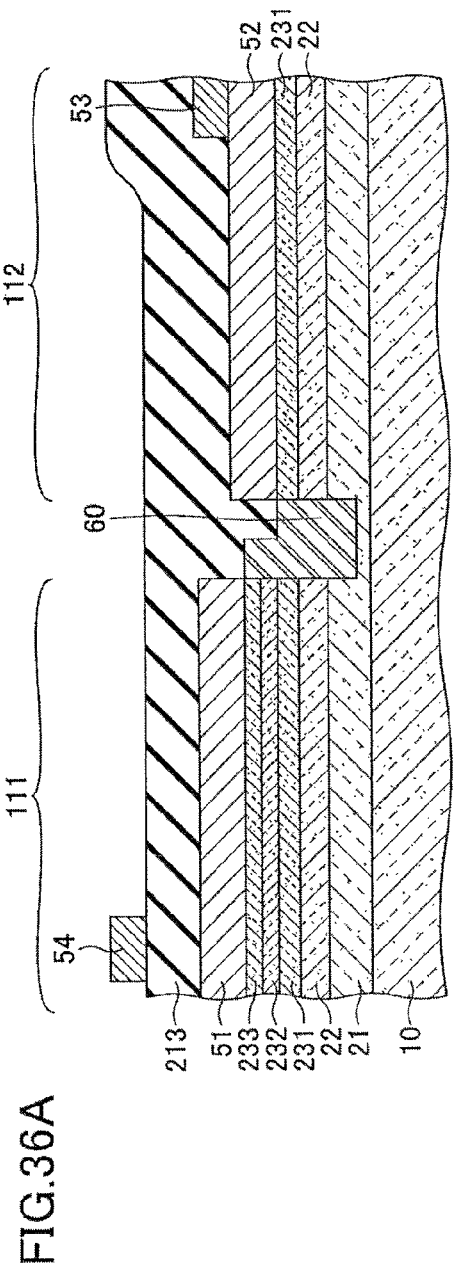
FIGS. 36A through 36C are sixth cross-sectional views illustrating the method of manufacturing the semiconductor apparatus according to the fourth embodiment.
Figure 36C:
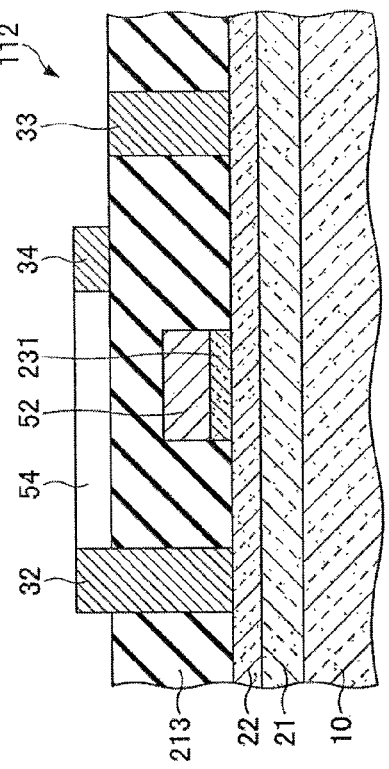
Figure 36B:
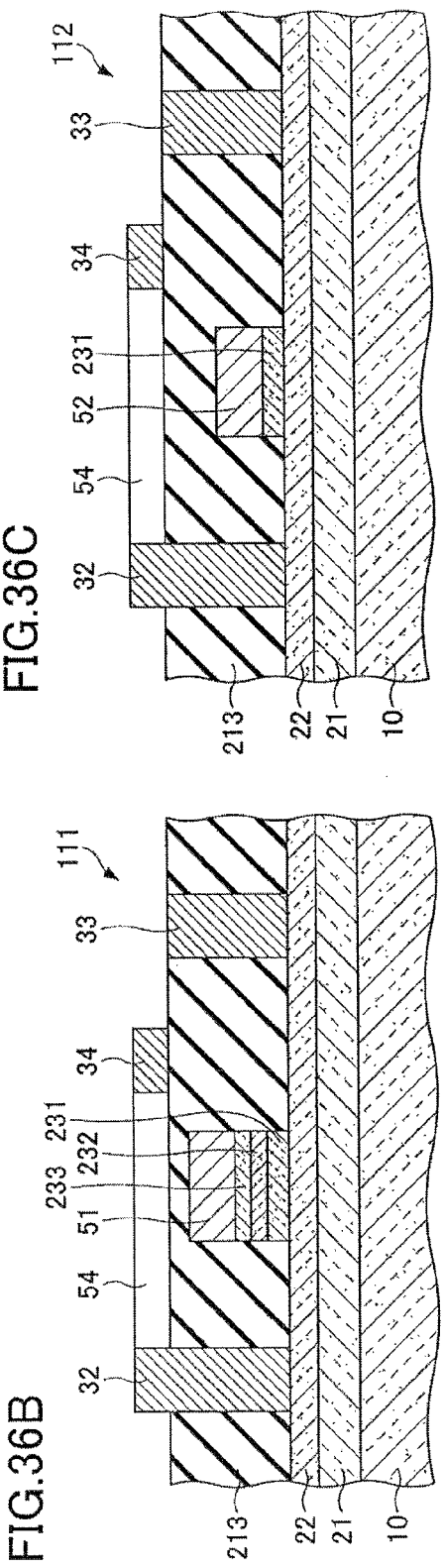

Next, as illustrated in FIG. 36A through 36C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 36A is a cross-sectional view of the semiconductor apparatus when cut along the dashed-dotted line 27A-27B of FIG. 27. FIG. 36B is a cross-sectional view of the semiconductor apparatus when cut along the dashed-dotted line 27C-27D of FIG. 27. FIG. 36C is a cross-sectional view of the semiconductor apparatus when cut along the dashed-dotted line 27E-27F of FIG. 27.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

Fifth Embodiment

Semiconductor Apparatus

Figure 37:
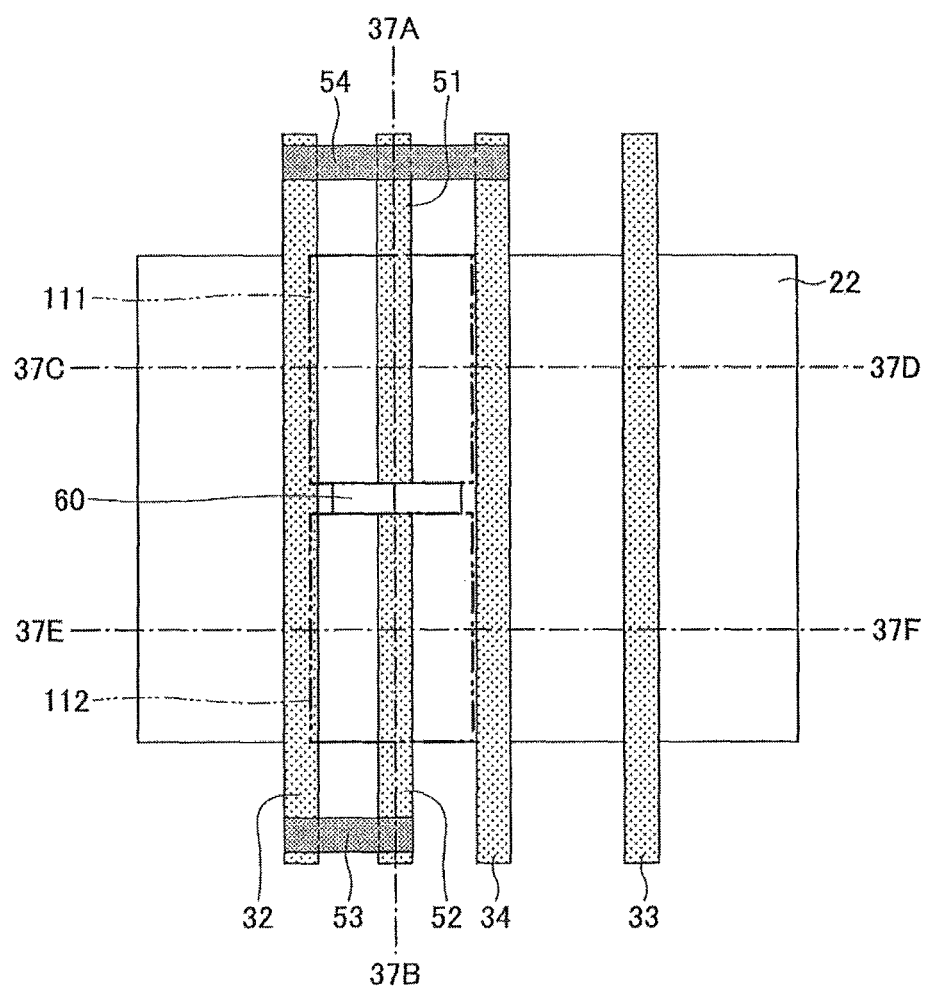
FIG. 37 is a top view of a semiconductor apparatus according to a fifth embodiment.
Figure 38:
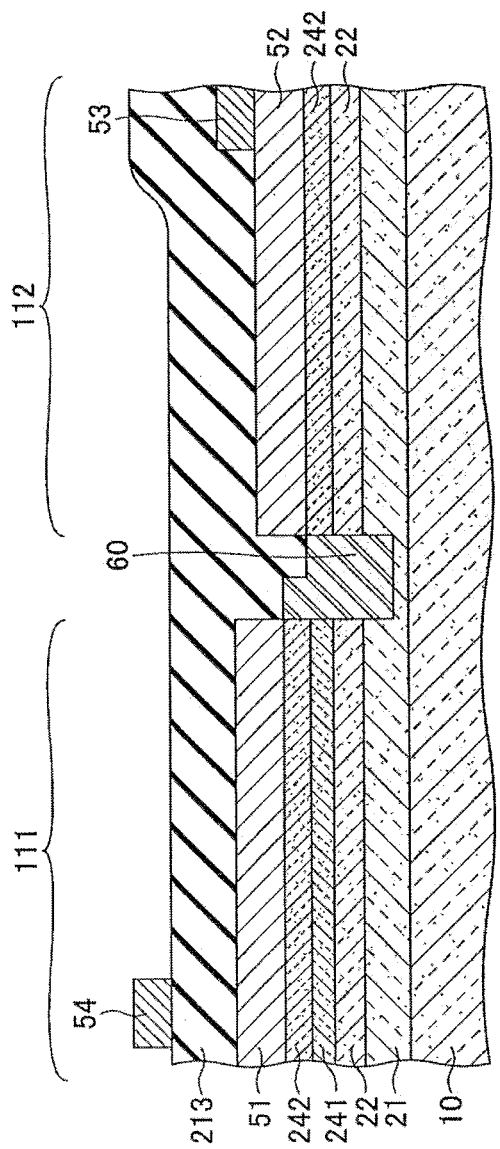
FIG. 38 is a first cross-sectional view of the semiconductor apparatus according to the fifth embodiment.
Figure 39:
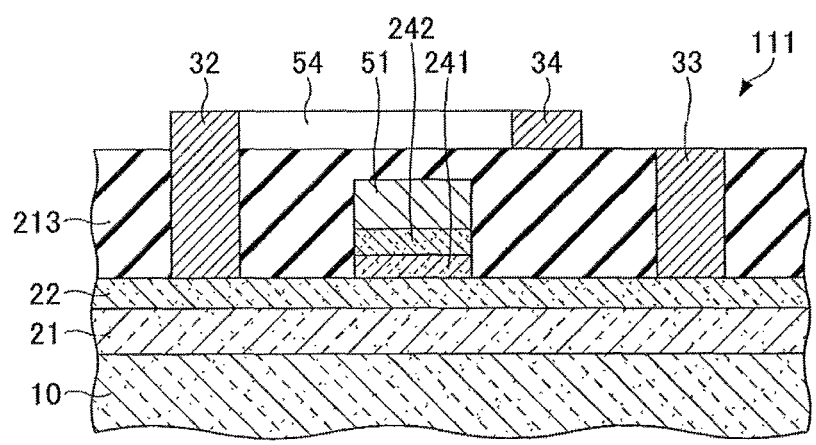
FIG. 39 is a second cross-sectional view of the semiconductor apparatus according to the fifth embodiment.
Figure 40:
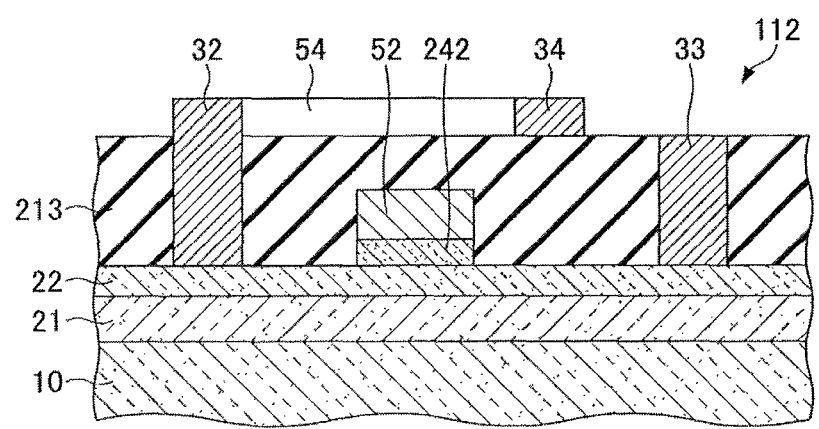
FIG. 40 is a third cross-sectional view of the semiconductor apparatus according to the fifth embodiment.

Next, a fifth embodiment is described. In a semiconductor apparatus according to this embodiment, a p-type layer formed in the first transistor is thicker than a p-type layer formed in the second transistor, so that the gate threshold value voltage of the first transistor is greater than that of the second transistor. The semiconductor according to this embodiment is described with reference to FIGS. 37 through 40. FIG. 37 is a top view of the semiconductor apparatus according to this embodiment. Further, in FIG. 37, the interlayer insulation films are not shown. FIG. 38 is a cross-sectional view of the semiconductor apparatus when cut along the dashed-dotted line 37A-37B of FIG. 37. FIG. 39 is a cross-sectional view of the semiconductor apparatus when cut along the dashed-dotted line 37C-37D of FIG. 23. FIG. 40 is a cross-sectional view of the semiconductor apparatus when cut along the dashed-dotted line 37E-37F of FIG. 37.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21. In a region where the first transistor 111 is to be formed, a first p-type layer 241 and a second p-type layer 242 are laminated and formed on the electron supply layer 22 in the region where the first gate electrode 51 is to be formed. The first gate electrode 51 is to be formed on the second p-type layer 242 formed as described above. Further, in a region where the second transistor 112 is to be formed, the second p-type layer 242 is formed on the electron supply layer 22. The second gate electrode 52 is formed on the second p-type layer 242. Further, the source electrode 32 and the drain electrode 33 are formed on the electron supply layer 22. The interlayer insulation film 213 is formed on the electron supply layer 22, the first gate electrode 51, and the second gate electrode 52. The field plate (FP) 34 is formed in a predetermined region on the interlayer insulation film 213.

The substrate 10 is made of silicon, but may alternatively be made of SiC, sapphire or the like.

The first gate electrode 51 and the second gate electrode 52 are formed of, for example, TiN, TaN, W, Pt, Al, polysilicon, or amorphous silicon in which an impurity element is doped.

The first p-type layer 241 is formed of GaN in which Mg is doped as a p-type impurity element. The second p-type layer 242 is formed of GaN in which Mg is doped as a p-type impurity element.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, only the second p-type layer 242 is formed under the second gate electrode 52. But the first p-type layer 241 and the second p-type layer 242 are formed under the first gate electrode 51. Namely, the p-type layer under the first gate electrode 51 in the first transistor 111 and the p-type layer under the second gate electrode 52 in the second transistor 112 are formed in a manner that the p-type layer formed under the first gate electrode 51 is thicker than the p-type layer formed under the second gate electrode 52. Therefore, it becomes possible to remove more 2 DEG in the region under the first gate electrode 51 of the first transistor 111 than in the region under the second gate electrode 52 of the second transistor 112. By doing this, the gate threshold value voltage of the first transistor 111 becomes greater than that of the second transistor 112.

As illustrated in FIG. 37, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 41A through 47C.

First, as illustrated in FIGS. 41A through 41C, a nitride semiconductor layer is formed on the substrate 10 made of silicon or the like, and a resist pattern 245 is formed on a predetermined region of the nitride semiconductor layer. Here, FIG. 41A is a cross-sectional view of the semiconductor apparatus when cut along the dashed-dotted line 37A-37B of FIG. 37. FIG. 41B is a cross-sectional view of the semiconductor apparatus when cut along the dashed-dotted line 37C-37D of FIG. 37. FIG. 41C is a cross-sectional view of the semiconductor apparatus when cut along the dashed-dotted line 37E-37F of FIG. 37.

Specifically, nitride semiconductor layers such as the buffer layer (not shown) made of AlN, AlGaN or the like, the electron transit layer 21, the electron supply layer 22, the first p-type layer 241 and the like are sequentially laminated by epitaxial growth on the substrate 10. The electron transit layer 21 is made of GaN and has a film thickness of approximately 1 µm. The electron supply layer 22 is made of AlGaN, more specifically $Al_xGa_{1-x}N$ where x value is in a range of 0.15 to 0.25, so that the film thickness thereof is in a range of 10 nm to 20 nm. The first p-type layer 241 is made of p-GaN, has a film thickness of 30 nm to 50 nm, and is doped with Mg as a p-type impurity element so that the impurity concentration is in a range of $1\times10^{19}$ cm$^{-3}$ to $3\times10^{19}$ cm$^{-3}$.

The resist pattern 245 is formed in the region where the first gate electrode 51 is to be formed by applying a photoresist on the first p-type layer 241 and exposing and developing the photoresist by an exposure device.

Figure 42A:
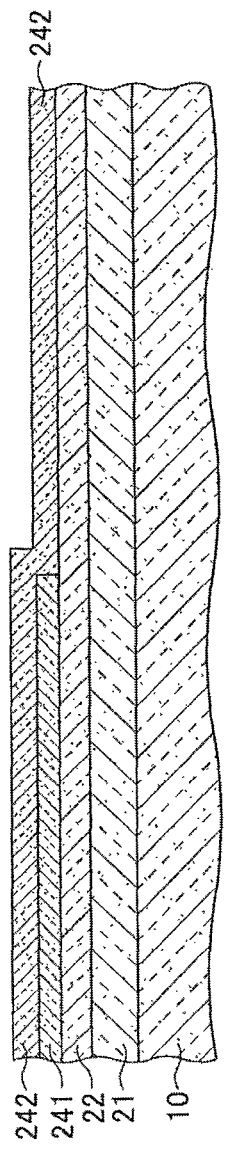
FIGS. 42A through 42C are second cross-sectional views illustrating the method of manufacturing the semiconductor apparatus according to the fifth embodiment.
Figure 42C:
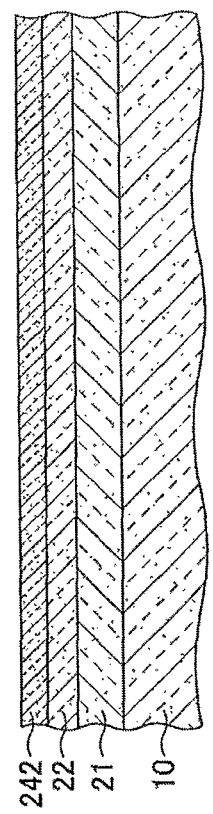
Figure 42B:
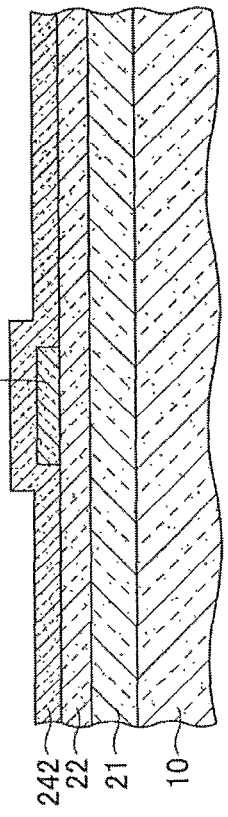

Next, as illustrated in FIGS. 42A through 42C, the first p-type layer 241 in the region where the resist pattern 245 is not formed is removed. Then, after the resist pattern 245 is removed with an organic solvent or the like, the second p-type layer 242 is formed by MOVPE. Here, FIG. 42A is a cross-sectional view of the semiconductor apparatus when cut along the dashed-dotted line 37A-37B of FIG. 37. FIG. 42B is a cross-sectional view of the semiconductor apparatus when cut along the dashed-dotted line 37C-37D of FIG. 37. FIG. 42C is a cross-sectional view of the semiconductor apparatus when cut along the dashed-dotted line 37E-37F of FIG. 37.

When the first p-type layer 241 in the region where the resist pattern 245 is not formed is partially removed by RIE or the like, chlorine-based gas, SF$_x$-based gas or the like is used. Further, in this embodiment, the first p-type layer 241 is removed by anisotropic etching. Specifically, the RIE is performed on p-GaN and AlGaN using different etching speeds. By doing this, it becomes possible to stop etching in a state where the surface of the electron supply layer 22 formed of AlGaN is exposed.

The second p-type layer 242 is formed of p-GaN formed by epitaxial growth using MOVPE, and has a film thickness of 30 nm to 50 nm, and is doped with Mg as a p-type impurity element so that the impurity concentration is in a range of $1\times10^{19}$ cm$^{-3}$ to $3\times10^{19}$ cm$^{-3}$.

Next, as illustrated in FIGS. 43A through 43C, a resist pattern 246 is formed in the regions where the first gate electrode 51 and the second gate electrode 52 are to be formed. Then, the second p-type layer 242 in the region where the resist pattern 246 is not formed is removed by RIE or the like. Here, FIG. 43A is a cross-sectional view of the semiconductor apparatus when cut along the dashed-dotted line 37A-37B of FIG. 37. FIG. 43B is a cross-sectional view of the semiconductor apparatus when cut along the dashed-dotted line 37C-37D of FIG. 37. FIG. 43C is a cross-sectional view of the semiconductor apparatus when cut along the dashed-dotted line 37E-37F of FIG. 37.

When the second p-type layer 242 in the region where the resist pattern 246 is not formed is partially removed, by RIE or the like, chlorine-based gas, SF$_x$-based gas or the like is used. Further, in this embodiment, the second p-type layer 242 is removed by anisotropic etching. Specifically, the RIE is performed on p-GaN and AlGaN using different etching speeds. By doing this, it becomes possible to stop etching in a state where the surface of the electron supply layer 22 formed of AlGaN is exposed. By doing this, the first p-type layer 241 is formed in the region where the second gate electrode 52 is to be formed and the second p-type layer 242 is formed in the region where the first gate electrode 51 is to be formed.

Next, as illustrated in FIGS. 44A through 44C, after a resist pattern 246 is removed with an organic solvent or the like, a resist pattern 247 having an opening part 247a in the region where the element isolation region 60 is to be formed, so that the element isolation region 60 is formed by ion implantation or the like. Here, FIG. 44A is a cross-sectional view of the semiconductor apparatus when cut along the dashed-dotted line 37A-37B of FIG. 37. FIG. 44B is a cross-sectional view of the semiconductor apparatus when cut along the dashed-dotted line 37C-37D of FIG. 37. FIG. 44C is a cross-sectional view of the semiconductor apparatus when cut along the dashed-dotted line 37E-37F of FIG. 37.

Further, after the resist pattern 246 is removed with an organic solvent or the like, the resist pattern 247 is formed by applying a photoresist on the electron supply layer 22 and exposing and developing the photoresist by an exposure device.

Specifically, the element isolation region 60 is formed by performing ion implantation of Ar ions, B ions or the like at a predetermined acceleration voltage into the nitride semiconductor layer at the opening part 247a of the resist pattern 247, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 237 is removed with an organic solvent or the like.

Next, as illustrated in FIGS. 45A through 45C, after a resist pattern 247 is removed with an organic solvent or the like, the first gate electrode 51 and the second gate electrode 52 are formed. Here, FIG. 45A is a cross-sectional view of the semiconductor apparatus when cut along the dashed-dotted line 37A-37B of FIG. 37. FIG. 45B is a cross-sectional view of the semiconductor apparatus when cut along the dashed-dotted line 37C-37D of FIG. 37. FIG. 45C is a cross-sectional view of the semiconductor apparatus when cut along the dashed-dotted line 37E-37F of FIG. 37.

To form the first gate electrode 51 and the second gate electrode 52, first, a resist pattern (not shown) is formed on the electron supply layer 22 in the regions where the first gate electrode 51 and the second gate electrode 52 are to be formed. After that, a metal film for forming the first gate electrode 51 and the second gate electrode 52 is formed on the surface where the resist pattern is formed by, for example, vacuum deposition, and is dipped into an organic solvent or the like. By doing this, the metal film formed on the resist film and the resist pattern are removed by lift-off, so that the first gate electrode 51 and the second gate electrode 52 are formed based on the remaining metal film.

By doing this, the first gate electrode 51 is formed on the layer where the first p-type layer 241 and the second p-type layer 242 are laminated in the region where the first transistor 111 is to be formed. The second gate electrode 52 is formed on the second p-type layer 242 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Figure 46A:
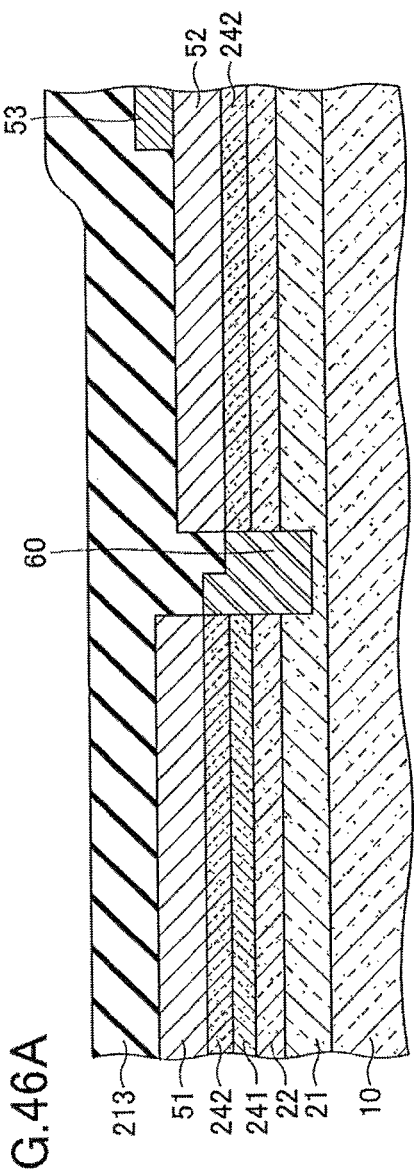
FIGS. 46A through 46C are sixth cross-sectional views illustrating the method of manufacturing the semiconductor apparatus according to the fifth embodiment.
Figure 46C:
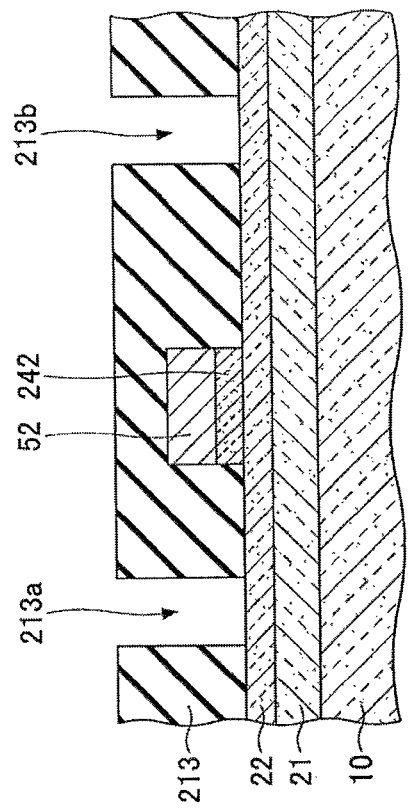
Figure 46B:
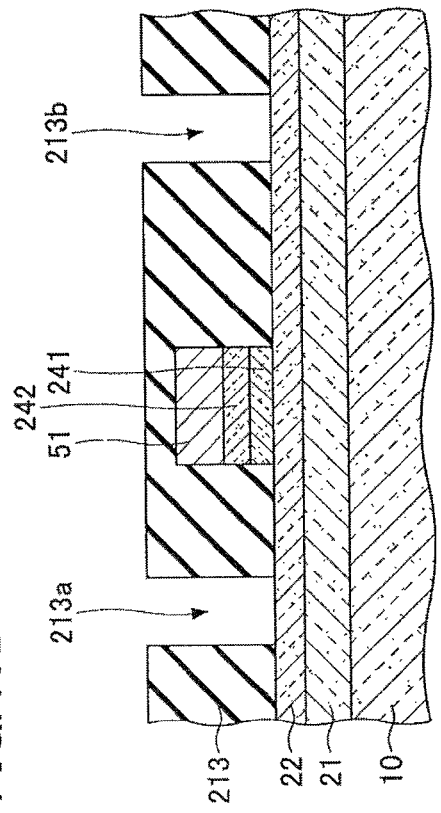

Next, as illustrated in FIGS. 46A through 46C, the interlayer insulation film 213 is formed on the electron supply layer 22, the first gate electrode 51, and the second gate electrode 52. Further, the opening parts 213a and 213b are formed in the interlayer insulation film 213 in the regions where the source electrode 32 and the drain electrode 33 are to be formed. Here, FIG. 46A is a cross-sectional view of the semiconductor apparatus when cut along the dashed-dotted line 37A-37B of FIG. 37. FIG. 46B is a cross-sectional view of the semiconductor apparatus when cut along the dashed-dotted line 37C-37D of FIG. 37. FIG. 46C is a cross-sectional view of the semiconductor apparatus when cut along the dashed-dotted line 37E-37F of FIG. 37.

Specifically, first, the interlayer insulation film 213 is formed on the electron supply layer 22, the first gate electrode 51, and the second gate electrode 52 by forming a $SiO_2$ or SiN layer or a laminated layer of $SiO_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Next, as illustrated in FIG. 47A through 47C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 47A is a cross-sectional view of the semiconductor apparatus when cut along the dashed-dotted line 37A-37B of FIG. 37. FIG. 47B is a cross-sectional view of the semiconductor apparatus when cut along the dashed-dotted line 37C-37D of FIG. 37. FIG. 47C is a cross-sectional view of the semiconductor apparatus when cut along the dashed-dotted line 37E-37F of FIG. 37.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

Sixth Embodiment

Semiconductor Apparatus

Figure 48:
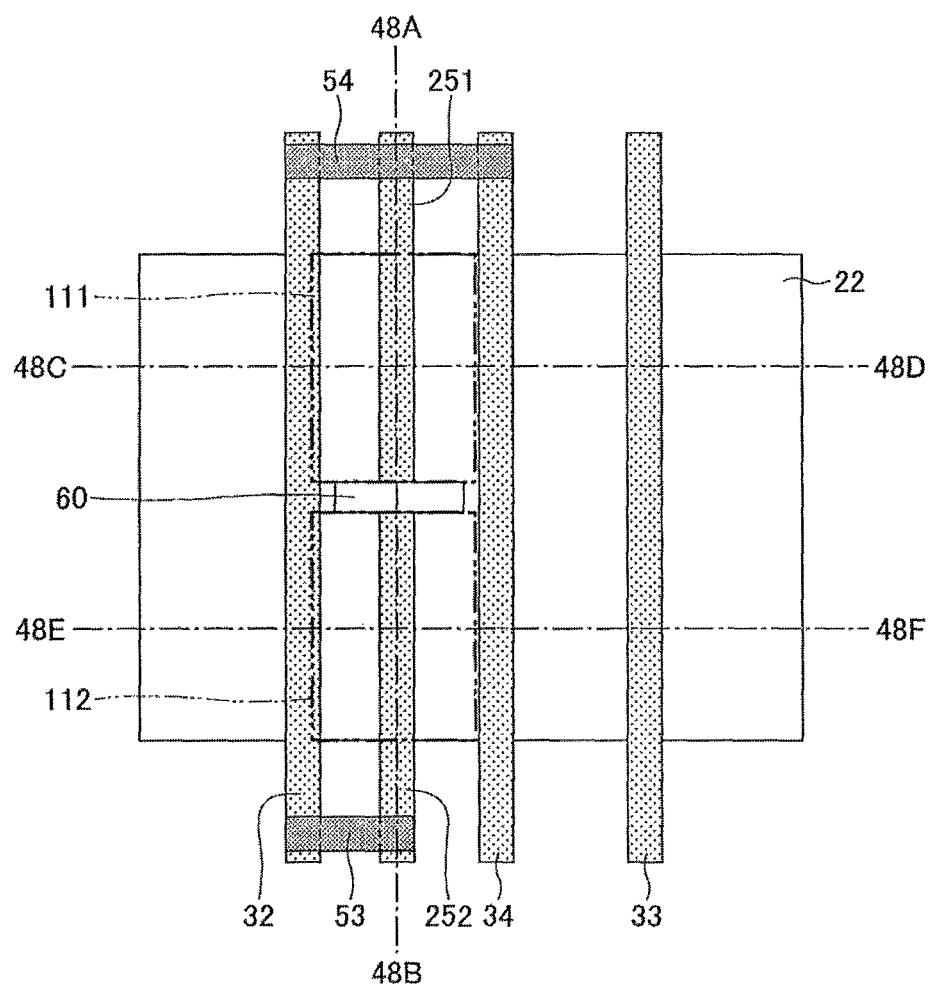
FIG. 48 is a top view of a semiconductor apparatus according to a sixth embodiment.
Figure 49:
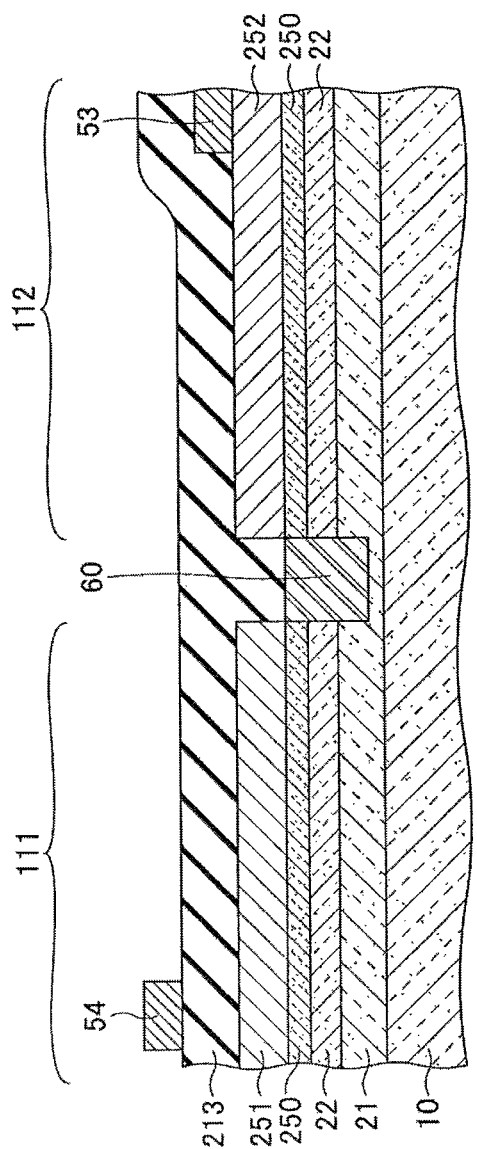
FIG. 49 is a first cross-sectional view of the semiconductor apparatus according to the sixth embodiment.
Figure 50:
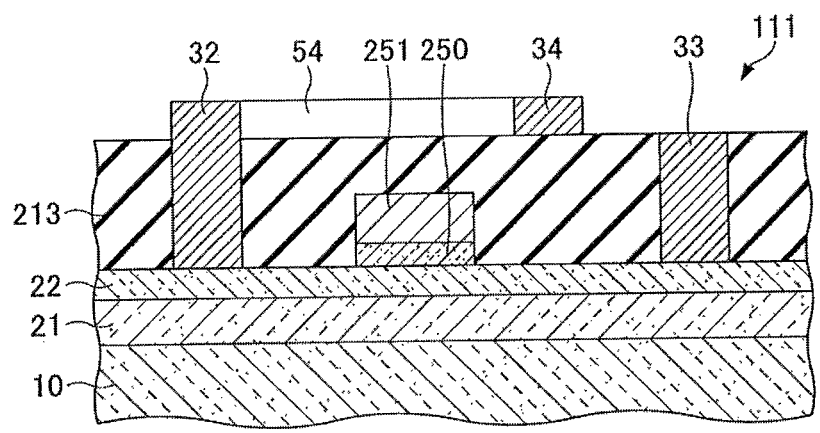
FIG. 50 is a second cross-sectional view of the semiconductor apparatus according to the sixth embodiment.
Figure 51:
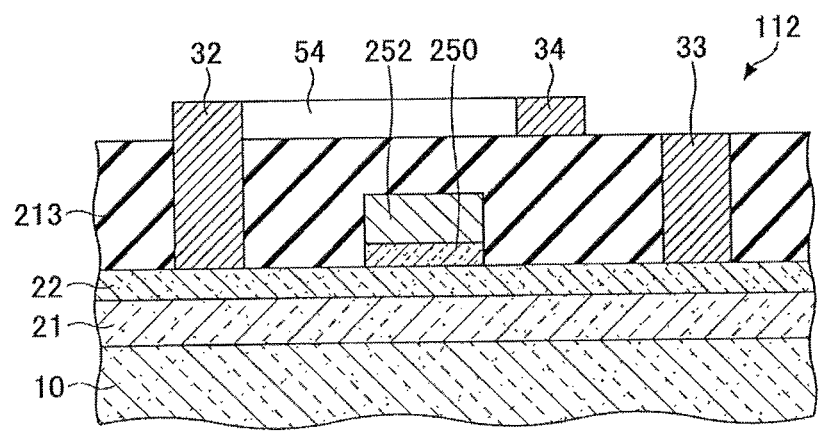
FIG. 51 is a third cross-sectional view of the semiconductor apparatus according to the sixth embodiment.

Next, a sixth embodiment is described. In a semiconductor apparatus according to this embodiment, the first gate electrode in the first transistor is made of a material having a higher work function than the work function of the material of the second gate electrode in the second transistor. By doing this, the gate threshold value voltage of the first transistor is greater than that of the second transistor. The semiconductor according to this embodiment is described with reference to FIGS. 48 through 51. FIG. 48 is a top view of the semiconductor apparatus according to this embodiment. Further, in FIG. 48, the interlayer insulation films are not shown. FIG. 49 is a cross-sectional view of the semiconductor apparatus when cut along the dashed-dotted line 48A-48B of FIG. 48. FIG. 50 is a cross-sectional view of the semiconductor apparatus when cut along the dashed-dotted line 48C-48D of FIG. 48. FIG. 51 is a cross-sectional view of the semiconductor apparatus when cut along the dashed-dotted line 48E-48F of FIG. 48.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21. Further, a p-type layer 250 is formed on the electron supply layer 22 in the regions where a first gate electrode 251 and a second gate electrode 252 are to be formed. The first gate electrode 251 is formed on the p-type layer 250 in the region where the first transistor 111 is to be formed. The second gate electrode 252 is formed on the p-type layer 250 in the region where the second transistor 112 is to be formed. Further, the source electrode 32 and the drain electrode 33 are formed on the electron supply layer 22. The interlayer insulation film 213 is formed on the electron supply layer 22, the first gate electrode 251, and the second gate electrode 252. The field plate (FP) 34 and the connection electrode 54 are formed in predetermined regions on the interlayer insulation film 213.

The substrate 10 is made of silicon, but may alternatively be made of SiC, sapphire or the like.

The first gate electrode 251 and the second gate electrode 252 are formed of, for example, TiN, TaN, W, Pt, Al, polysilicon, or amorphous silicon in which an impurity element is doped. The first gate electrode 251 is formed of a material different from a material of which the second gate electrode 252 is formed. Namely, the material of the first gate electrode 251 has a higher work function than that of the material of the second gate electrode 252. Table 1 illustrates the relationships between the materials and work functions.

TABLE 1

| MATERIAL | WORK FUNCTION eV |
| --- | --- |
| TaN | 4.05 |
| Ta | 4.25 |
| Al | 4.28 |
| Ti | 4.33 |
| W | 4.55 |
| WNx | 4.6 |
| TiN | 4.7 |
| Si | 4.85 |
| Ni | 5.15 |
| Pt | 5.65 |

In this embodiment, for example, the first gate electrode 251 is formed of Pt whose work function is 5.65 eV and the second gate electrode 252 is formed of Al whose work function is 4.28 eV.

By doing this, in the semiconductor apparatus in this embodiment, three transistors are formed. Namely, the three transistors are the first transistor 111 using the first gate electrode 251 as the gate electrode thereof, the second transistor 112 using the second gate electrode 252 as the gate electrode thereof, and the third transistor using the field plate (FP) 34 as the gate electrode thereof.

In the semiconductor apparatus according to this embodiment, the second gate electrode 252 is connected to the source electrode 32 through the connection electrode 53, so that voltage equal to the voltage applied to the source electrode 32 is applied to the second gate electrode 252. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the first gate electrode 251 is formed of the material whose work function is greater than the work function of the material of which the second gate electrode 252 is formed. By doing this, the gate threshold value voltage of the first transistor 111 becomes greater than that of the second transistor 112.

As illustrated in FIG. 48, in the semiconductor apparatus according to the embodiment, the first gate electrode 251, the second gate electrode 252, and the element isolation region 60 are formed between the source electrode 32 and the drain electrode 33. The field plate (FP) 34 is formed between the first gate electrode 251, the second gate electrode 252, and the element isolation region 60, and the drain electrode 33. The element isolation region 60 is formed between the first gate electrode 251 and the second gate electrode 252.

Method of Manufacturing Semiconductor Apparatus

Next, a method of manufacturing the semiconductor apparatus according to this embodiment is described with reference to FIGS. 52A through 57C.

First, as illustrated in FIGS. 52A through 52C, a nitride semiconductor layer is formed on the substrate 10 made of silicon or the like, and a resist pattern 255 is formed on a predetermined region of the nitride semiconductor layer. Here, FIG. 52A is a cross-sectional view of the semiconductor apparatus when cut along the dashed-dotted line 48A-48B of FIG. 48. FIG. 52B is a cross-sectional view of the semiconductor apparatus when cut along the dashed-dotted line 48C-48D of FIG. 48. FIG. 52C is a cross-sectional view of the semiconductor apparatus when cut along the dashed-dotted line 48E-48F of FIG. 48.

Specifically, nitride semiconductor layers such as the buffer layer (not shown) made of AlN, AlGaN or the like, the electron transit layer 21, the electron supply layer 22, the p-type layer 250 and the like are sequentially laminated by epitaxial growth on the substrate 10. The electron transit layer 21 is made of GaN and has a film thickness of approximately 1 μm. The electron supply layer 22 is made of AlGaN, more specifically $Al_xGa_{1-x}N$ where x value is in a range of 0.15 to 0.25, so that the film thickness thereof is in a range of 15 nm to 25 nm. The p-type layer 250 is made of p-GaN, has a film thickness of 40 nm to 80 nm, and is doped with Mg as a p-type impurity element so that the impurity concentration is in a range of $1 \times 10^{19}$ cm$^{-3}$ to $3 \times 10^{19}$ cm$^{-3}$.

The resist pattern 255 is formed in the regions where the first gate electrode 51 and the second gate electrode 52 are to be formed by applying a photoresist on the p-type layer 250 and exposing and developing the photoresist by an exposure device.

Next, as illustrated in FIGS. 53A through 53C, the p-type layer 250 where the resist pattern 255 is not formed is removed, so as to form the p-type layer 250 in the regions where the first gate electrode 251, the second gate electrode 252 are to be formed. Then, after the resist pattern 255 is removed with an organic solvent or the like, a resist pattern 256 having an opening part 256a in the region where the element isolation region 60 is to be formed. Here, FIG. 53A is a cross-sectional view of the semiconductor apparatus when cut along the dashed-dotted line 48A-48B of FIG. 48. FIG. 53B is a cross-sectional view of the semiconductor apparatus when cut along the dashed-dotted line 48C-48D of FIG. 48. FIG. 53C is a cross-sectional view of the semiconductor apparatus when cut along the dashed-dotted line 48E-48F of FIG. 48.

When the p-type layer 250 where the resist pattern 255 is not formed is partially removed by RIE or the like, chlorine-based gas, $SF_x$-based gas or the like is used. The resist pattern 255 is formed by applying a photoresist on the electron supply layer 22 and exposing and developing the photoresist by an exposure device. Further, in this embodiment, the first p-type layer 241 is removed by anisotropic etching. Specifically, the RIE is performed on p-GaN and AlGaN using different etching speeds. By doing this, it becomes possible to stop etching in a state where the surface of the electron supply layer 22 formed of AlGaN is exposed.

Next, as illustrated in FIGS. 54A through 54C, the element isolation region 60 is formed in the nitride semiconductor layer at the opening part 256a of the resist pattern 256. Then, after the resist pattern 256 is removed, a conductive film 252a made of Al or the like to form the second gate electrode 252 is formed. Then, a resist pattern 257 is formed. Here, FIG. 54A is a cross-sectional view of the semiconductor apparatus when cut along the dashed-dotted line 48A-48B of FIG. 48. FIG. 54B is a cross-sectional view of the semiconductor apparatus when cut along the dashed-dotted line 48C-48D of FIG. 48. FIG. 54C is a cross-sectional view of the semiconductor apparatus when cut along the dashed-dotted line 48E-48F of FIG. 48.

Specifically, the element isolation region 60 is formed by performing ion implantation of Ar ions, B ions or the like at a predetermined acceleration voltage into the nitride semiconductor layer at the opening part 256a of the resist pattern 256, so as to have a predetermined concentration of the doped ions. By doing this, the element isolation region 60 is formed between the first gate electrode 251 and the second gate electrode 252. For example, the element isolation region 60 to be formed may be formed by ion implantation of Ar, B or the like performed on a part of the electron transit layer 21 and the electron supply layer 22. The resist pattern 256 is removed with an organic solvent or the like.

The conductive film 252a made of Al or the like to form the second gate electrode 252 is formed by forming a film on the p-type layer 250 and the electron supply layer 22 by vacuum deposition, sputtering or the like. After that, by applying a photoresist on the conductive film 252a and exposing and developing the photoresist by an exposure device, the resist pattern 257 is formed in the region where the second gate electrode 252 is to be formed.

Next, as illustrated in FIGS. 55A through 55C, the conductive film 252a in the region where the resist pattern 257 is not formed is removed by dry etching such as RIE or wet etching to form the second gate electrode 252. Further, during the etching, it is assumed that the nitride semiconductor layer is not etched. After, the resist pattern 257 is removed with an organic solvent or the like and the conductive film 252a for forming the first gate electrode 251 on the second gate electrode 252, the p-type layer 250, and the electron supply layer 22 is formed. Here, a resist pattern 258 is formed. Here, FIG. 55A is a cross-sectional view of the semiconductor apparatus when cut along the dashed-dotted line 48A-48B of FIG. 48. FIG. 55B is a cross-sectional view of the semiconductor apparatus when cut along the dashed-dotted line 48C-48D of FIG. 48. FIG. 55C is a cross-sectional view of the semiconductor apparatus when cut along the dashed-dotted line 48E-48F of FIG. 48.

A conductive film 251a made of Pt or the like to form the first gate electrode 251 is formed by forming a film on the second gate electrode 252, the p-type layer 250, and the electron supply layer 22 by vacuum deposition, sputtering or the like. After that, by applying a photoresist on the conductive film 251a and exposing and developing the photoresist by an exposure device, the resist pattern 258 is formed in the region where the first gate electrode 251 is to be formed.

Figure 56A:
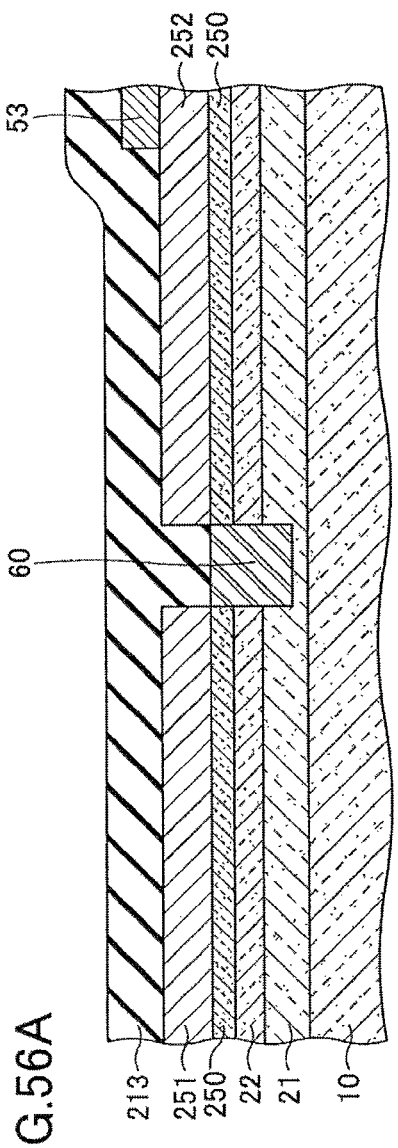
FIGS. 56A through 56C are fifth cross-sectional views illustrating the method of manufacturing the semiconductor apparatus according to the sixth embodiment.
Figure 56C:
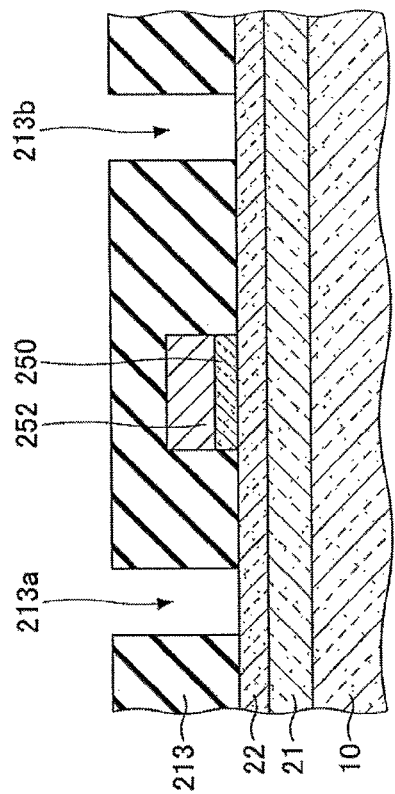
Figure 56B:
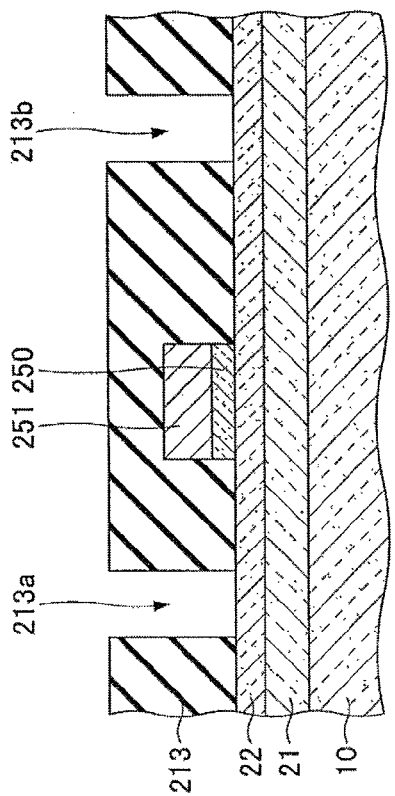

Next, as illustrated in FIGS. 56A through 56C, the conductive film 251a in the region where resist pattern 258 is not formed is removed by dry etching such as RIE or wet etching to form the first gate electrode 251. Further, during the etching, it is assumed that the second gate electrode 252 is not etched. The resist pattern 258 is removed with an organic solvent or the like. After that, the interlayer insulation film 213 is formed on the first gate electrode 251 and the second gate electrode 252. Further, the openings 213a and 213b are formed in the interlayer insulation film 213 in the regions where the source electrode 32 and the drain electrode 33 are to be formed. Here, FIG. 56A is a cross-sectional view of the semiconductor apparatus when cut along the dashed-dotted line 48A-48B of FIG. 48. FIG. 56B is a cross-sectional view of the semiconductor apparatus when cut along the dashed-dotted line 48C-48D of FIG. 48. FIG. 56C is a cross-sectional view of the semiconductor apparatus when cut along the dashed-dotted line 48E-48F of FIG. 48.

As described above, the first gate electrode 251 is formed on the p-type layer 250 in the region where the first transistor 111 is formed, and the second gate electrode 252 is formed on the p-type layer 250 in the region where the second transistor 112 is formed. Further, in this embodiment, the connection electrode 53, which connects the second gate electrode 252 with the source electrode 32 described below, may be formed at the same time when the first gate electrode 251 and the second gate electrode 252 are formed, or may be separately formed after the first gate electrode 251 and the second gate electrode 252 are formed or after the source electrode 32 described below is formed.

After that, the interlayer insulation film 213 is formed on the electron supply layer 22, the first gate electrode 251, and the second gate electrode 252 by forming a $SiO_2$ or SiN layer or a laminated layer of $SiO_2$ and SiN by CVD or ALD. Then, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Figure 57A:
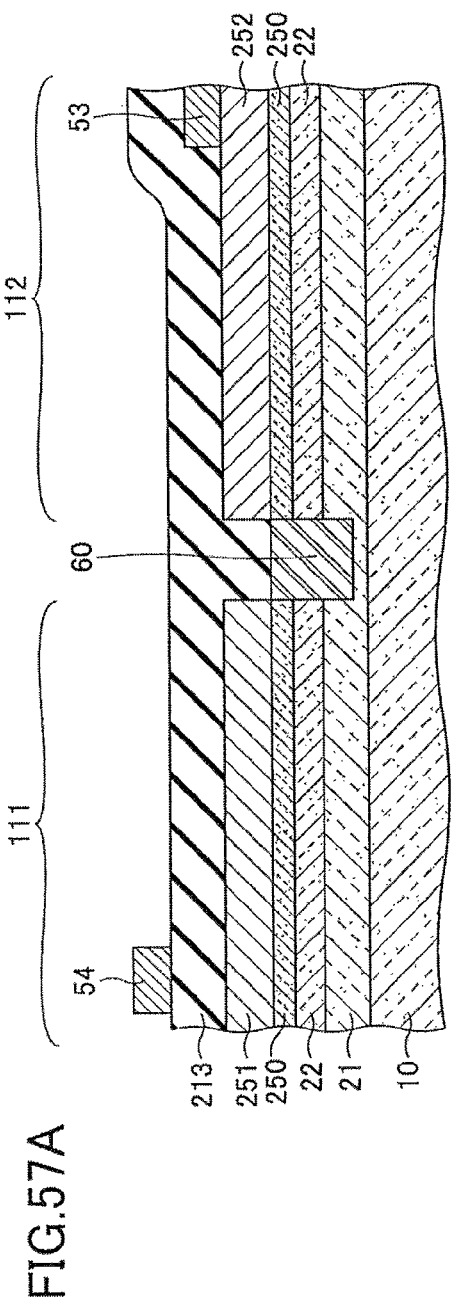
FIGS. 57A through 57C are sixth cross-sectional views illustrating the method of manufacturing the semiconductor apparatus according to the sixth embodiment.
Figure 57C:
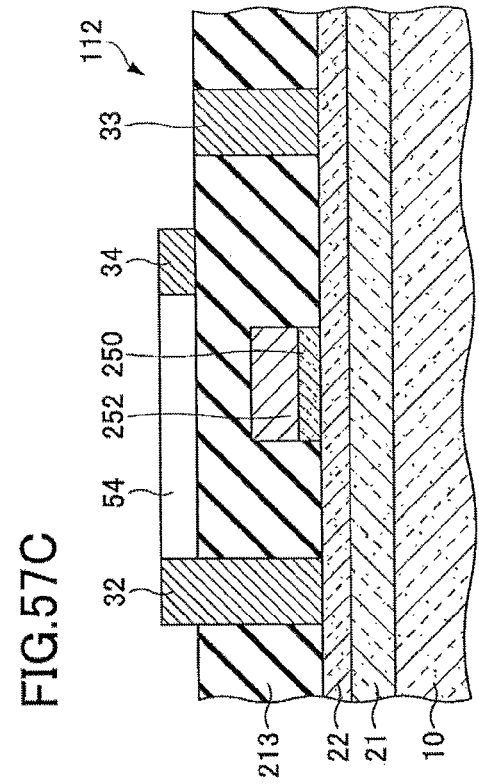
Figure 57B:
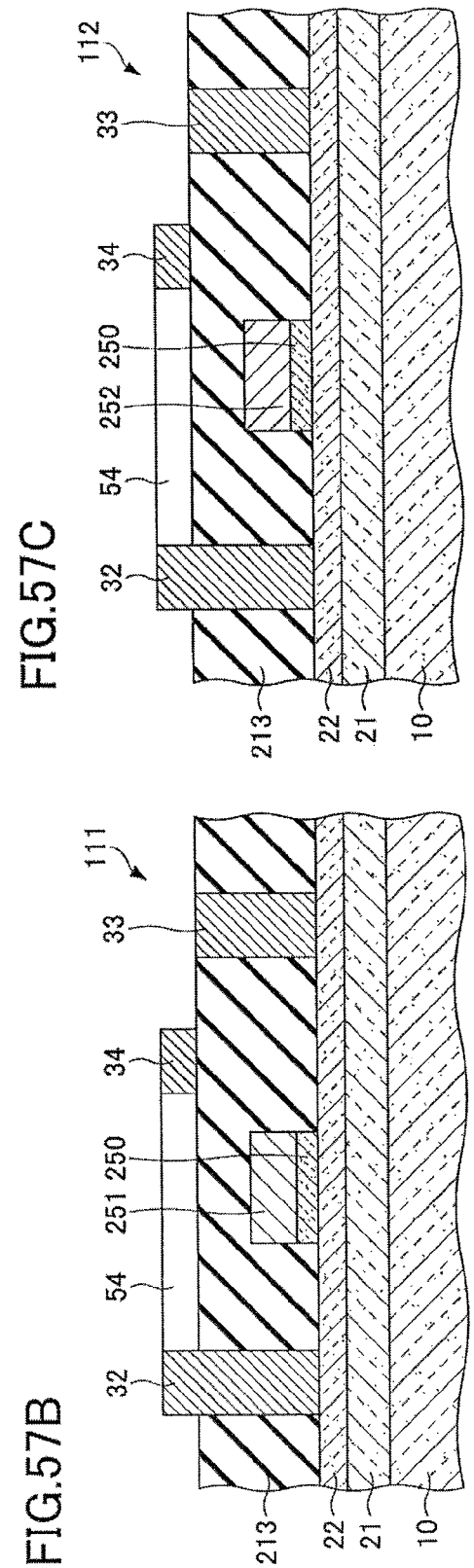

Next, as illustrated in FIG. 57A through 57C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 57A is a cross-sectional view of the semiconductor apparatus when cut along the dashed-dotted line 48A-48B of FIG. 48. FIG. 57B is a cross-sectional view of the semiconductor apparatus when cut along the dashed-dotted line 48C-48D of FIG. 48. FIG. 57C is a cross-sectional view of the semiconductor apparatus when cut along the dashed-dotted line 48E-48F of FIG. 48.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

Seventh Embodiment

Semiconductor Apparatus

Figure 58:
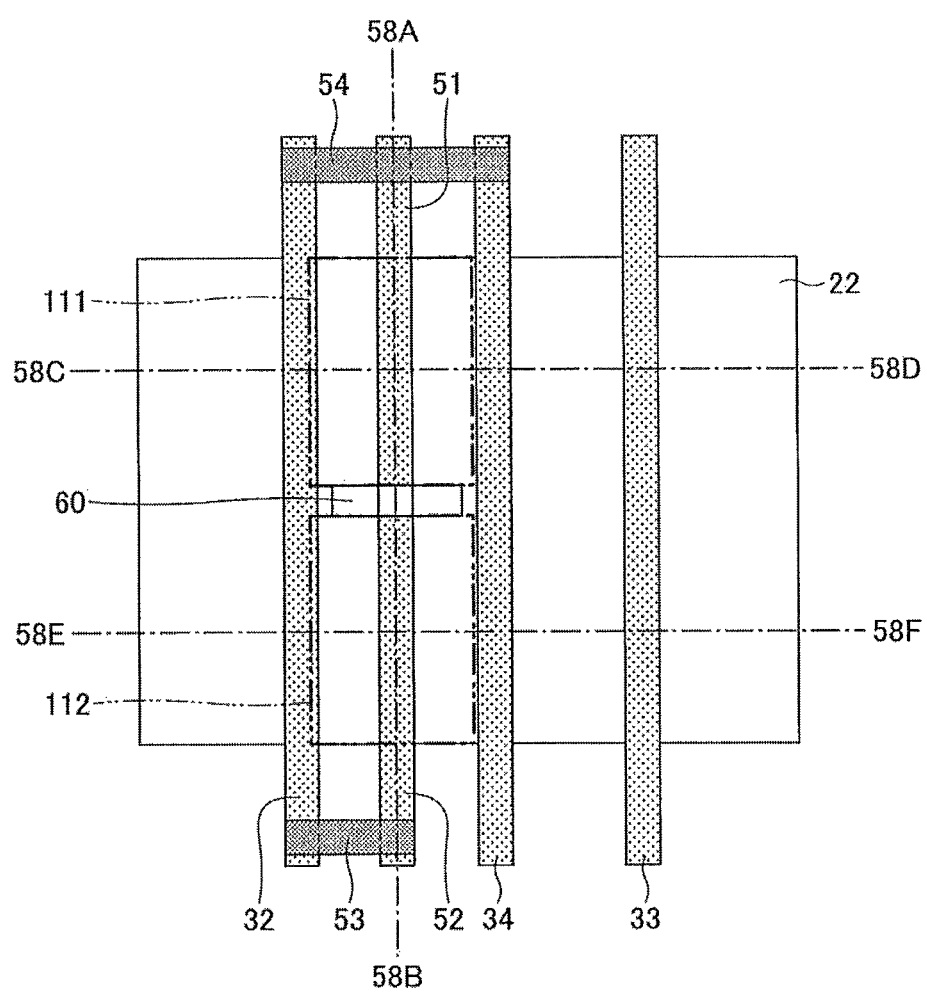
FIG. 58 is a top view of a semiconductor apparatus according to a seventh embodiment.
Figure 59:
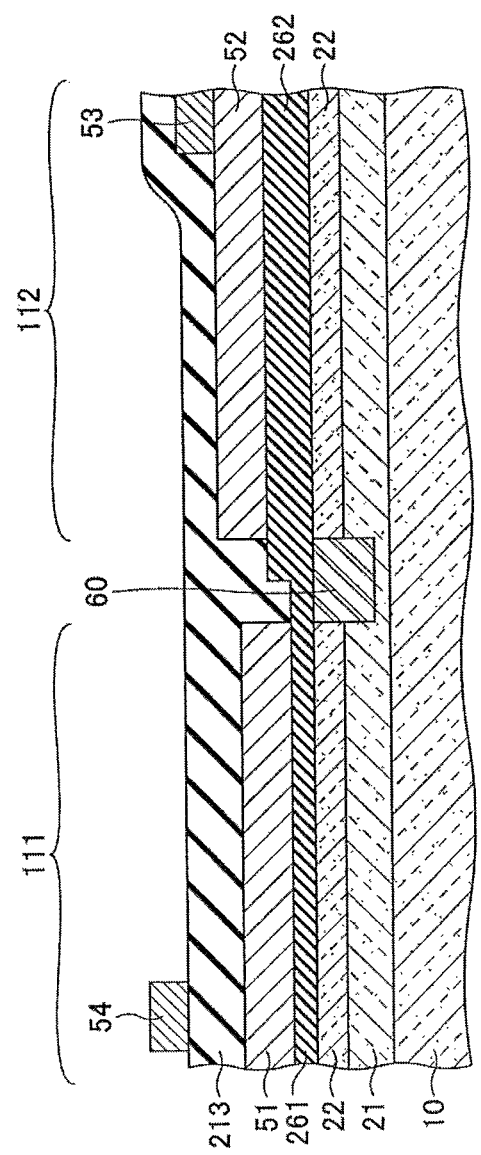
FIG. 59 is a first cross-sectional view of the semiconductor apparatus according to the seventh embodiment.
Figure 60:
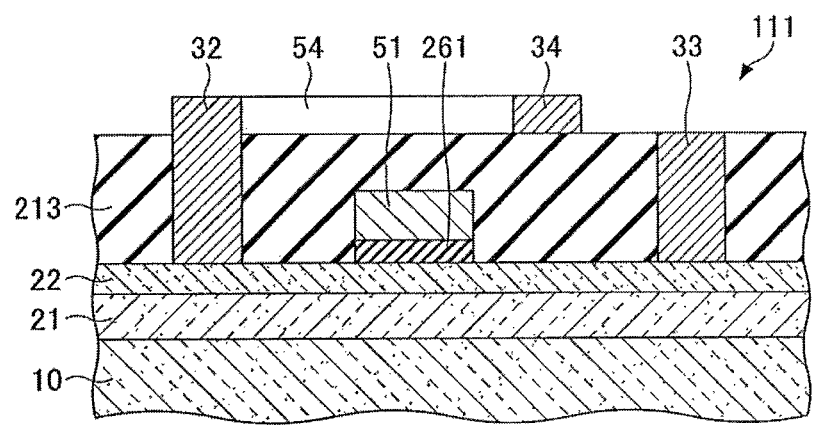
FIG. 60 is a second cross-sectional view of the semiconductor apparatus according to the seventh embodiment.
Figure 61:
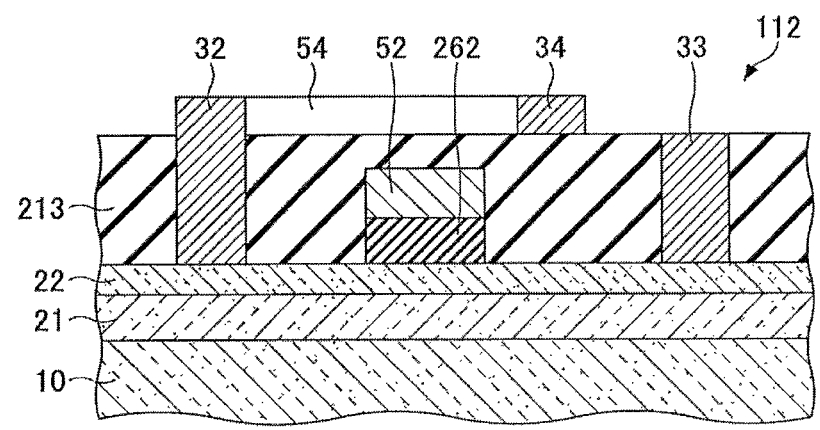
FIG. 61 is a third cross-sectional view of the semiconductor apparatus according to the seventh embodiment.

Next, a seventh embodiment is described. In a semiconductor apparatus according to this embodiment, the gate insulation film of the first transistor is thinner than the gate insulation film of the second transistor. By doing this, the gate threshold value voltage of the first transistor is greater than that of the second transistor. The semiconductor according to this embodiment is described with reference to FIGS. 58 through 61. FIG. 58 is a top view of the semiconductor apparatus according to this embodiment. Further, in FIG. 58, the interlayer insulation films are not shown. FIG. 59 is a cross-sectional view of the semiconductor apparatus when cut along the dashed-dotted line 58A-58B of FIG. 58. FIG. 60 is a cross-sectional view of the semiconductor apparatus when cut along the dashed-dotted line 58C-58D of FIG. 58. FIG. 61 is a cross-sectional view of the semiconductor apparatus when cut along the dashed-dotted line 58E-58F of FIG. 58.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21.

Further, a first gate insulation film 261 is formed on the electron supply layer 22 in the region where the first transistor 111 is to be formed, and the first gate electrode 51 is formed on the first gate insulation film 261. Further, a second gate insulation film 262 is formed on the electron supply layer 22 in the region where the second transistor 112 is to be formed, and the second gate electrode 52 is formed on the second gate insulation film 262. In this embodiment, the second gate insulation film 262 is formed so as to be thicker than the first gate insulation film 261. Further, the source electrode 32 and the drain electrode 33 are formed on the electron supply layer 22. The interlayer insulation film 213 is formed on the electron supply layer 22, the first gate electrode 51 and the second gate electrode 52. The field plate (FP) 34 and the connection electrode 54 are formed in predetermined regions on the interlayer insulation film 213.

The substrate 10 is made of silicon, but may alternatively be made of SiC, sapphire or the like.

The first gate insulation film 261 and the second gate insulation film 262 are made of a High-k material such as nitride silicon (SiN), silicon oxide (SiO), aluminum nitride (AlN), aluminum oxide ($Al_2O_3$), zirconium oxide ($ZrO_x$), or hafnium oxide ($HfO_x$). Specifically, the first gate insulation film 261 and the second gate insulation film 262 are formed by using any one of the materials or by laminating some of the materials.

The first gate electrode 51 and the second gate electrode 52 are formed of, for example, TiN, TaN, W, Pt, Al, polysilicon, or amorphous silicon in which an impurity element is doped.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the first gate insulation film 261 in the first transistor 111 is thinner than the second gate insulation film 262 in the second transistor 112. By doing this, the gate threshold value voltage of the first transistor 111 becomes greater than that of the second transistor 112.

As illustrated in FIG. 58, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 62A through 67C.

Figure 62A:
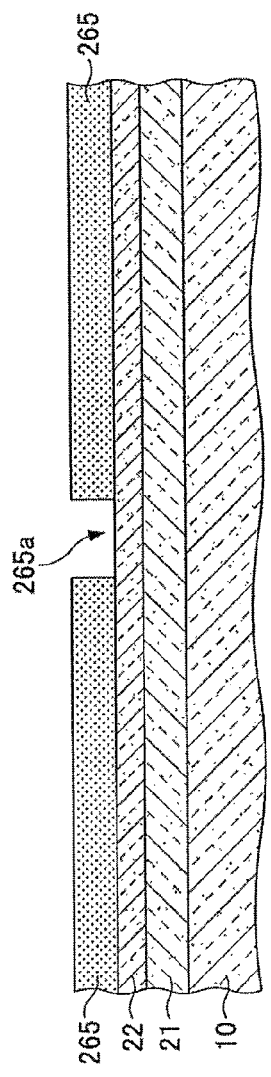
FIGS. 62A through 62C are first cross-sectional views illustrating a method of manufacturing the semiconductor apparatus according to the seventh embodiment.
Figure 62C:
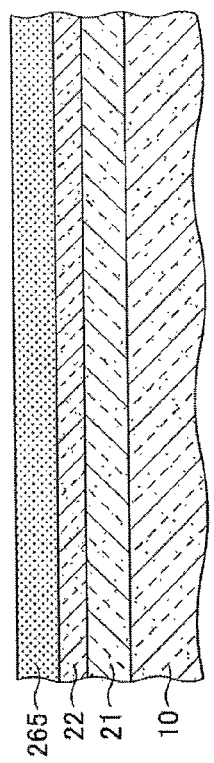
Figure 62B:
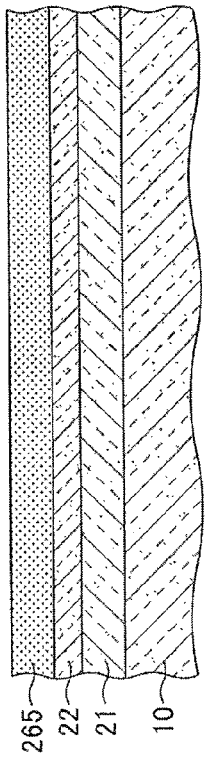

First, as illustrated in FIGS. 62A through 62C, a nitride semiconductor layer is formed on the substrate 10 made of silicon or the like, and a resist pattern 265 having an opening part 265a is formed on a predetermined region of the nitride semiconductor layer. Here, FIG. 62A is a cross-sectional view of the semiconductor apparatus when cut along the dashed-dotted line 58A-58B of FIG. 58. FIG. 62B is a cross-sectional view of the semiconductor apparatus when cut along the dashed-dotted line 58C-58D of FIG. 58. FIG. 62O is a cross-sectional view of the semiconductor apparatus when cut along the dashed-dotted line 58E-58F of FIG. 58.

Specifically, nitride semiconductor layers such as the buffer layer (not shown) made of AlN, AlGaN or the like, the electron transit layer 21, and the electron supply layer 22 and the like are laminated by epitaxial growth on the substrate 10. The electron transit layer 21 is made of GaN and has a film thickness of approximately 1 μm. The electron supply layer 22 is made of AlGaN, more specifically $Al_xGa_{1-x}N$ where x value is in a range of 0.15 to 0.25, so that the film thickness thereof is in a range of 15 nm to 25 nm.

The resist pattern 265 is formed by applying a photoresist on the electron supply layer 22 and exposing and developing the photoresist by an exposure device. The resist pattern 265 formed by this way has the opening part 265a in the region where the element isolation region 60 is to be formed.

Figure 63A:
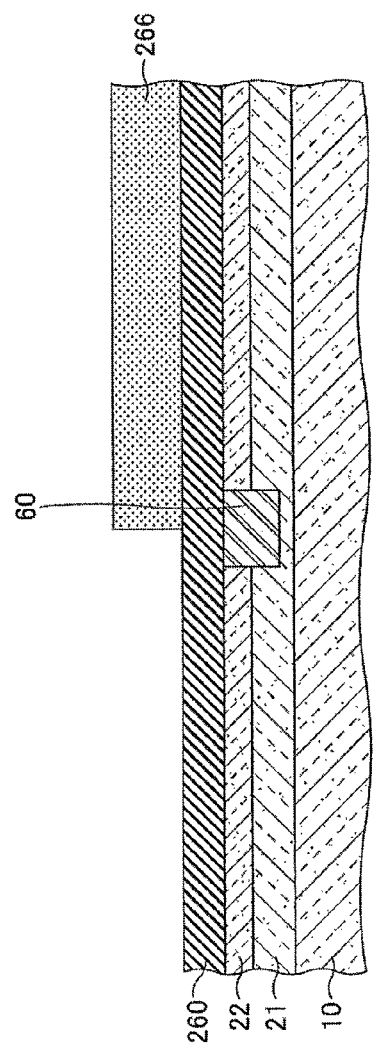
FIGS. 63A through 63C are second cross-sectional views illustrating the method of manufacturing the semiconductor apparatus according to the seventh embodiment.
Figure 63C:
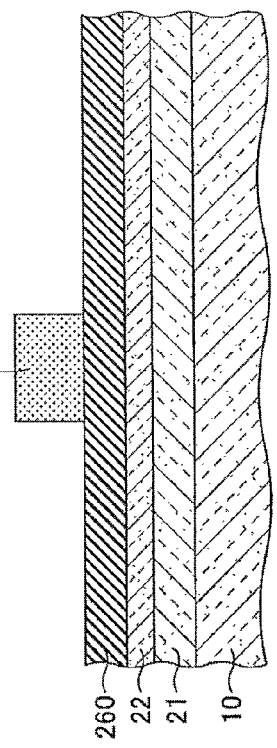
Figure 63B:
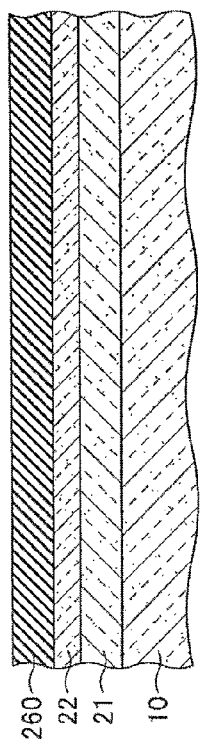

Next, as illustrated in FIGS. 63A through 63C, the element isolation region 60 is formed in the nitride semiconductor layers at the opening part 265a of the resist pattern 265. Further, the resist pattern 265 is removed and an insulation film 260 for forming the first gate insulation film 261 and the second gate insulation film 262 is formed, and a resist pattern 266 is formed on the insulation film 260. Here, FIG. 63A is a cross-sectional view of the semiconductor apparatus when cut along the dashed-dotted line 58A-58B of FIG. 58. FIG. 63B is a cross-sectional view of the semiconductor apparatus when cut along the dashed-dotted line 58C-58D of FIG. 58. FIG. 63C is a cross-sectional view of the semiconductor apparatus when cut along the dashed-dotted line 58E-58F of FIG. 58.

Specifically, the element isolation region 60 is formed by performing ion implantation of Ar ions, B ions or the like at a predetermined acceleration voltage into the nitride semiconductor layer at the opening part 265a of the resist pattern 265, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 265 is removed with an organic solvent or the like.

The insulation film 260 for forming the first gate insulation film 261 and the second gate insulation film 262 is formed by forming SiN or the like by CVD or ALD. Then, the resist pattern 266 is formed in the region where the second gate electrode 52 is to be formed by applying a photoresist on the formed insulation film 260 made of SiN or the like and exposing and developing the photoresist by an exposure device.

Figure 64A:
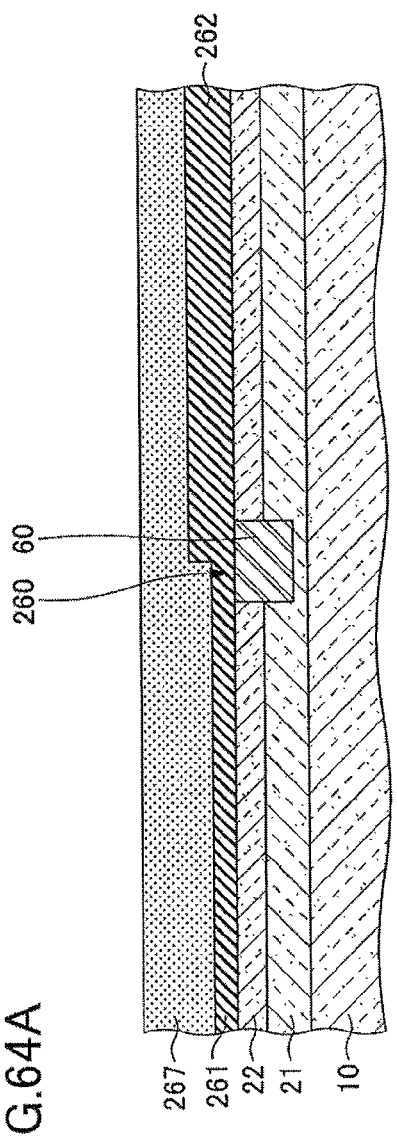
FIGS. 64A through 64C are third cross-sectional views illustrating the method of manufacturing the semiconductor apparatus according to the seventh embodiment.
Figure 64C:
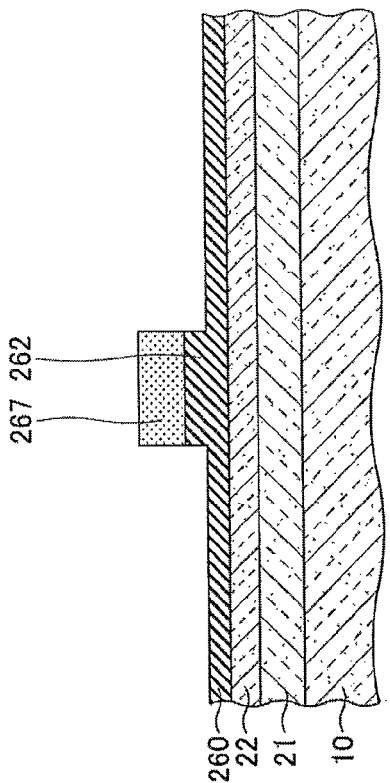
Figure 64B:
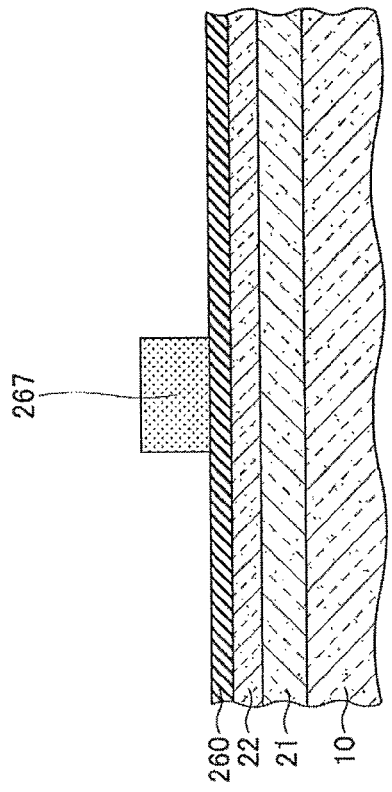

Next, as illustrated in FIGS. 64A through 64C, the insulation film 260 is partially removed in the region where the resist pattern 266 is not formed. Further, the resist pattern 266 is removed with an organic solvent or the like, and a resist pattern 267 is formed on the insulation film 260. Here, FIG. 64A is a cross-sectional view of the semiconductor apparatus when cut along the dashed-dotted line 58A-58B of FIG. 58. FIG. 64B is a cross-sectional view of the semiconductor apparatus when cut along the dashed-dotted line 58C-58D of FIG. 58. FIG. 64C is a cross-sectional view of the semiconductor apparatus when cut along the dashed-dotted line 58E-58F of FIG. 58.

By partially removing the insulation film 260 in the region where the resist pattern 266 is not formed, the insulation film 260 in the region where the resist pattern 266 is not formed becomes thinner. The insulation film 260 in the region where the resist pattern 266 is not formed may be removed by dry etching such as RIE or wet etching.

After the resist pattern 266 is removed, a resist pattern 267 is formed in the regions where the first gate electrode 51 and the second gate electrode 52 are to be formed by applying a photoresist on the partially-removed insulation film 260 and exposing and developing the photoresist by an exposure device.

Next, as illustrated in FIGS. 65A through 65C, the insulation film 260 in the region where the resist pattern 267 is not formed is removed. Then, the resist pattern 267 is removed with an organic solvent or the like. Then, the first gate electrode 51 and the second gate electrode 52 are formed. Here, FIG. 65A is a cross-sectional view of the semiconductor apparatus when cut along the dashed-dotted line 58A-58B of FIG. 58. FIG. 65B is a cross-sectional view of the semiconductor apparatus when cut along the dashed-dotted line 58C-58D of FIG. 58. FIG. 65C is a cross-sectional view of the semiconductor apparatus when cut along the dashed-dotted line 58E-58F of FIG. 58.

By removing the insulation film 260 in the region where the resist pattern 267 is not formed, the first gate electrode 51 and the second gate electrode 52 are formed in the regions where the insulation film 260 is formed. Namely, in the region where the resist pattern 267 is formed, the first gate insulation film 261 is formed in the region where the first gate electrode 51 is to be formed and the second gate insulation film 262 is formed in the region where the second gate electrode 52 is to be formed. The insulation film 260 in the region where the resist pattern 267 is not formed may be removed by dry etching such as RIE or wet etching.

To form the first gate electrode 51 and the second gate electrode 52, first, a resist pattern (not shown) is formed, the resist pattern having opening parts in the regions where the first gate electrode 51 and the second gate electrode 52 are to be formed. After that, a metal film for forming the first gate electrode 51 and the second gate electrode 52 is formed on the surface where the resist pattern is formed by, for example, vacuum deposition, and is dipped into an organic solvent or the like. By doing this, the metal film formed on the resist film and the resist pattern are removed by lift-off, so that the first gate electrode 51 and the second gate electrode 52 are formed based on the remaining metal film.

By doing this, the first gate electrode 51 is formed on the gate insulation film 261 in the region where the first transistor 111 is to be formed. The second gate electrode 52 is formed on the gate insulation film 262 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Figure 66A:
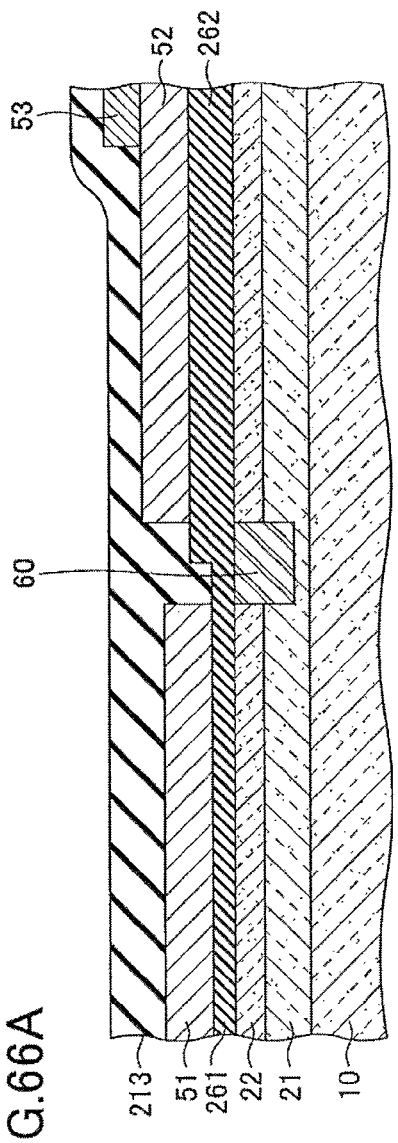
FIGS. 66A through 66C are fifth cross-sectional views illustrating the method of manufacturing the semiconductor apparatus according to the seventh embodiment.
Figure 66C:
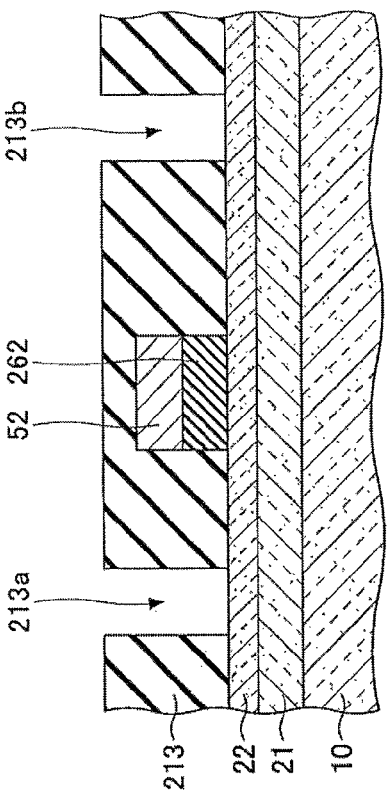
Figure 66B:
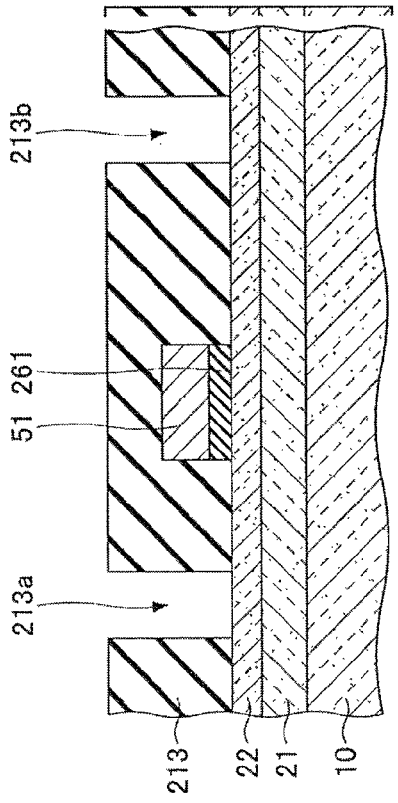

Next, as illustrated in FIGS. 66A through 66C, the interlayer insulation film 213 is formed on the electron supply layer 22, the first gate electrode 51, and the second gate electrode 52. Further, the opening parts 213a and 213b are formed on the interlayer insulation film 213 in the regions where the source electrode 32 and the drain electrode 33 are to be formed. Here, FIG. 66A is a cross-sectional view of the semiconductor apparatus when cut along the dashed-dotted line 58A-58B of FIG. 58. FIG. 66B is a cross-sectional view of the semiconductor apparatus when cut along the dashed-dotted line 58C-58D of FIG. 58. FIG. 66C is a cross-sectional view of the semiconductor apparatus when cut along the dashed-dotted line 58E-58F of FIG. 58.

Specifically, first, the interlayer insulation film 213 is formed on the electron supply layer 22, the first gate electrode 51, and the second gate electrode 52 by forming a $SiO_2$ or SiN layer or a laminated layer of SiO₂ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Figure 67A:
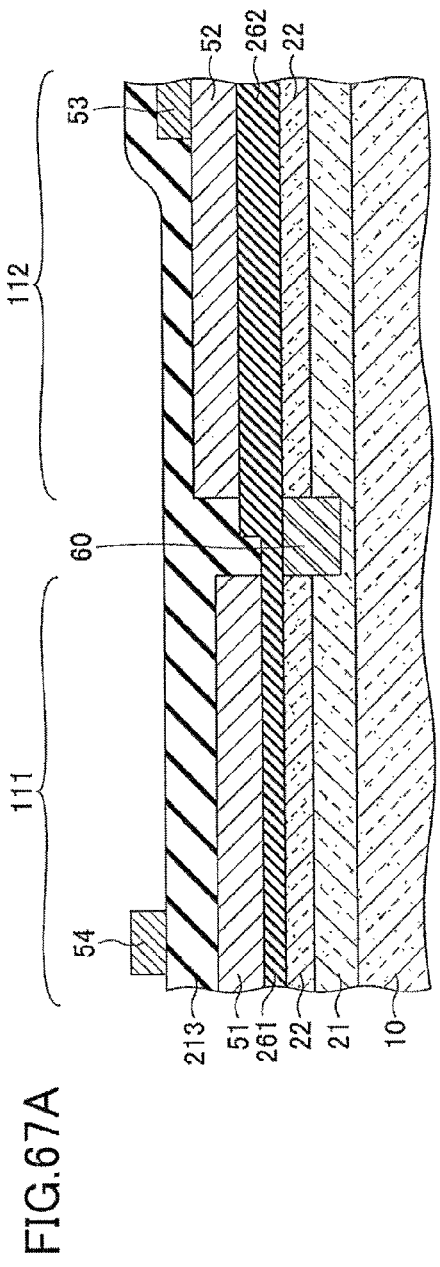
FIGS. 67A through 67C are sixth cross-sectional views illustrating the method of manufacturing the semiconductor apparatus according to the seventh embodiment.
Figure 67C:
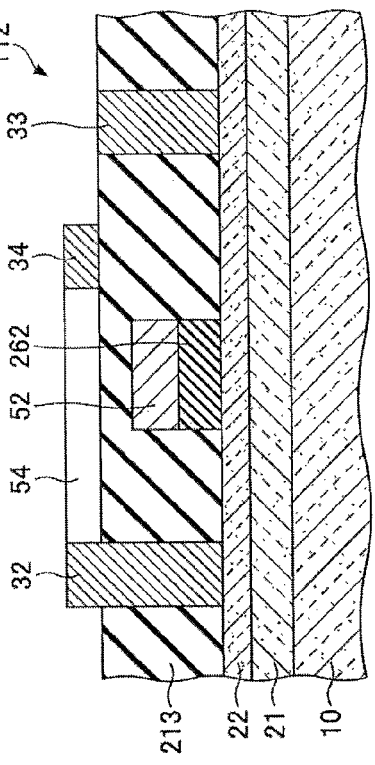
Figure 67B:
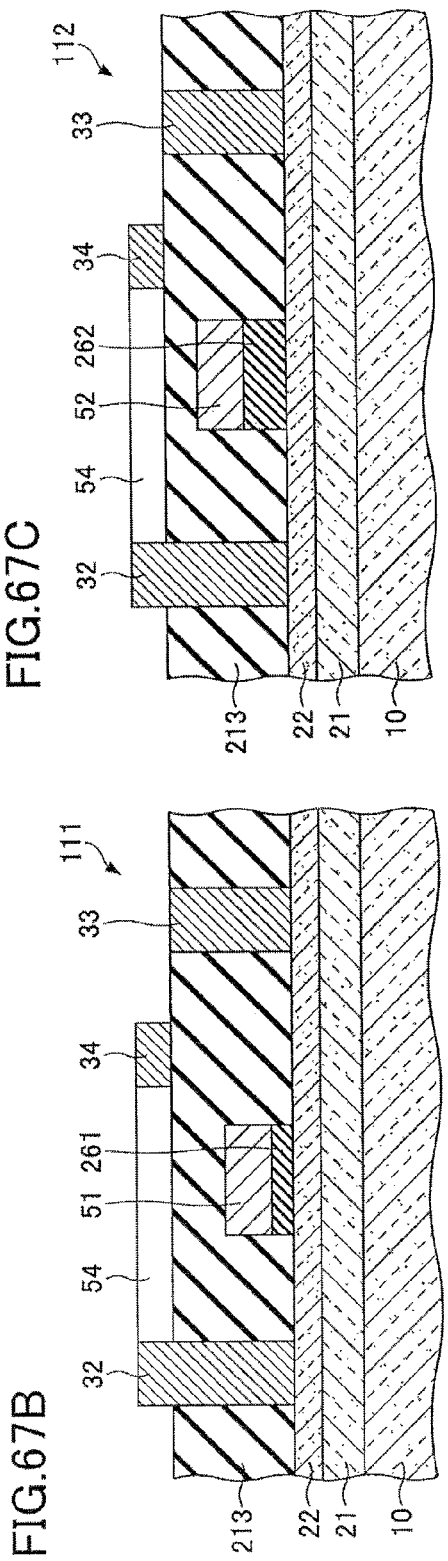

Next, as illustrated in FIG. 67A through 67C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 67A is a cross-sectional view of the semiconductor apparatus when cut along the dashed-dotted line 58A-58B of FIG. 58. FIG. 67B is a cross-sectional view of the semiconductor apparatus when cut along the dashed-dotted line 58C-58D of FIG. 58. FIG. 67C is a cross-sectional view of the semiconductor apparatus when cut along the dashed-dotted line 58E-58F of FIG. 58.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 is to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

Eighth Embodiment

Semiconductor Apparatus

Figure 68:
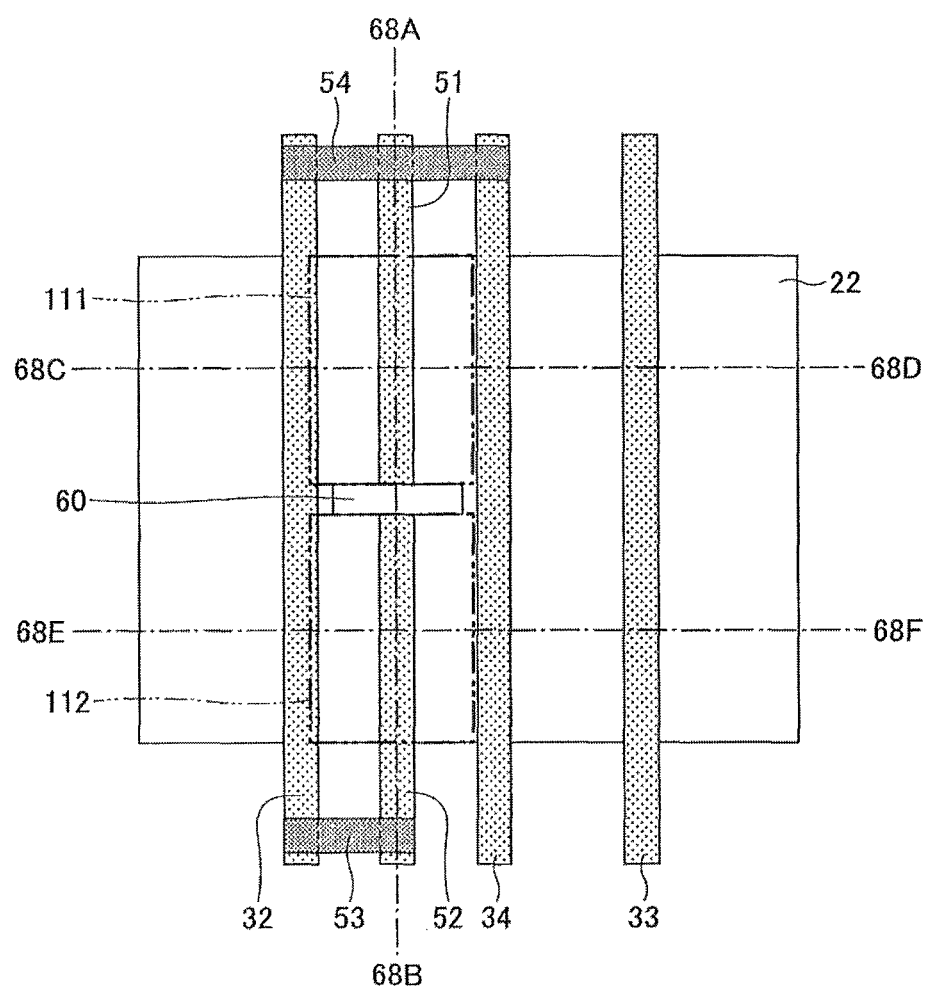
FIG. 68 is a top view of a semiconductor apparatus according to an eighth embodiment.
Figure 69:
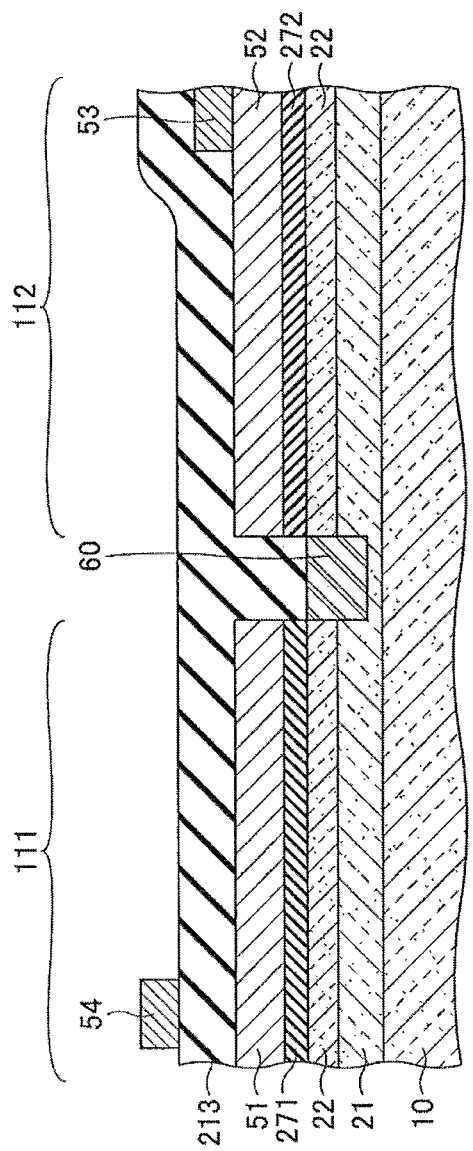
FIG. 69 is a first cross-sectional view of the semiconductor apparatus according to the eighth embodiment.
Figure 70:
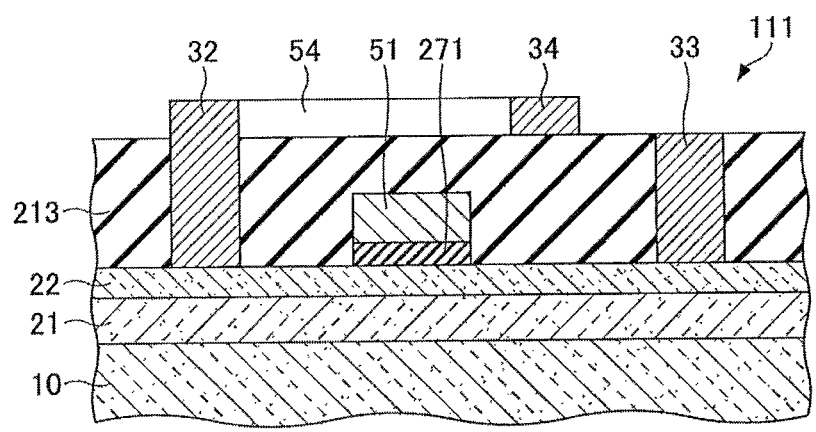
FIG. 70 is a second cross-sectional view of the semiconductor apparatus according to the eighth embodiment.
Figure 71:
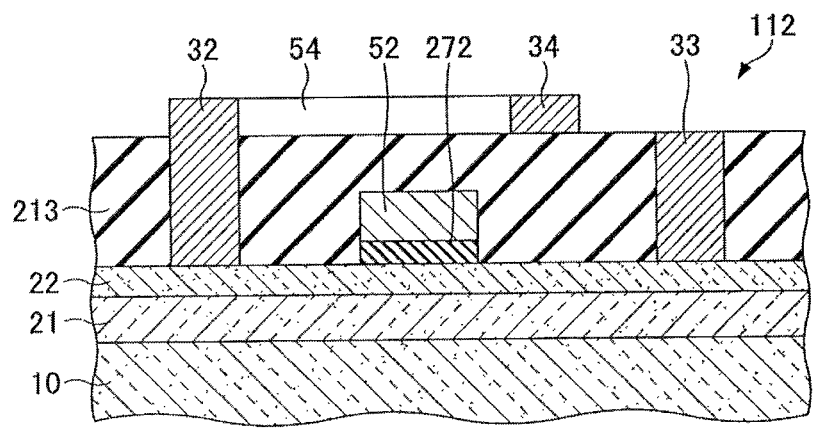
FIG. 71 is a third cross-sectional view of the semiconductor apparatus according to the eighth embodiment.

Next, a seventh embodiment is described. In a semiconductor apparatus according to this embodiment, the material of the gate insulation film in the first transistor is different from the material of the gate insulation film in the second transistor, so that the gate threshold value voltage of the first transistor is greater than that of the second transistor. The semiconductor according to this embodiment is described with reference to FIGS. 68 through 71. FIG. 68 is a top view of the semiconductor apparatus according to this embodiment. Further, in FIG. 68, the interlayer insulation films are not shown. FIG. 69 is a cross-sectional view of the semiconductor apparatus when cut along the dashed-dotted line 68A-68B of FIG. 68. FIG. 70 is a cross-sectional view of the semiconductor apparatus when cut along the dashed-dotted line 68C-68D of FIG. 68. FIG. 71 is a cross-sectional view of the semiconductor apparatus when cut along the dashed-dotted line 68E-68F of FIG. 68.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21.

Further, a first gate insulation film 271 is formed on the electron supply layer 22 in the region where the first transistor 111 is to be formed, and the first gate electrode 51 is formed on the first gate insulation film 271. Further, a second gate insulation film 272 is formed on the electron supply layer 22 in the region where the second transistor 112 is to be formed, and the second gate electrode 52 is formed on the second gate insulation film 272. In this embodiment, the first gate insulation film 271 is made of a material having higher relative permittivity than the relative permittivity of the material of the second gate insulation film 272. Further, the source electrode 32 and the drain electrode 33 are formed on the electron supply layer 22. The interlayer insulation film 213 is formed on the electron supply layer 22, the first gate electrode 51 and the second gate electrode 52. The field plate (FP) 34 is formed in a predetermined region on the interlayer insulation film 213.

The substrate 10 is made of silicon, but may alternatively be made of SiC, sapphire or the like.

The first gate insulation film 271 and the second gate insulation film 272 are made of a High-k material such as nitride silicon (SiN), silicon oxide (SiO), aluminum nitride (AlN), aluminum oxide ($Al_2O_3$), zirconium oxide ($ZrO_x$), or hafnium oxide ($HfO_x$). Specifically, the first gate insulation film 271 and the second gate insulation film 272 are formed by using any one of the materials or by laminating some of the materials. In this embodiment, the first gate insulation film 271 is made of a material having higher relative permittivity than the relative permittivity of the material of the second gate insulation film 272. The relative permittivity values of some insulation materials are illustrated in Table 2 below.

TABLE 2

| MATERIAL | RELATIVE PERMITTIVITY |
| --- | --- |
| $SiO_2$ | 3.8 |
| SiN | 7.0 |
| $Al_2O_3$ | 8.5 |
| AlN | 8.8 |
| $HfO_2$ | 25 |

Specifically, in a semiconductor apparatus according to this embodiment, for example, the first gate insulation film 271 is made of $Al_2O_3$ whose relative permittivity is 8.5, and the second gate insulation film 272 is made of $SiO_2$ whose relative permittivity is 3.8.

The first gate electrode 51 and the second gate electrode 52 are formed of, for example, TiN, TaN, W, Pt, Al, polysilicon, or amorphous silicon in which an impurity element is doped.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the first gate insulation film 271 is made of a material having higher relative permittivity than the relative permittivity of the material of the second gate insulation film 272. By doing this, the gate threshold value voltage of the first transistor 111 becomes greater than that of the second transistor 112.

As illustrated in FIG. 68, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 72A through 77C.

First, as illustrated in FIGS. 72A through 72C, a nitride semiconductor layer is formed on the substrate 10 made of silicon or the like, and a resist pattern 275 having an opening part 275a is formed on a predetermined region of the nitride semiconductor layer. Here, FIG. 72A is a cross-sectional view of the semiconductor apparatus when cut along the dashed-dotted line 68A-68B of FIG. 68. FIG. 72B is a cross-sectional view of the semiconductor apparatus when cut along the dashed-dotted line 68C-68D of FIG. 68. FIG. 72C is a cross-sectional view of the semiconductor apparatus when cut along the dashed-dotted line 68E-68F of FIG. 68.

Specifically, nitride semiconductor layers such as the buffer layer (not shown) made of AlN, AlGaN or the like, the electron transit layer 21, and the electron supply layer 22 and the like are laminated by epitaxial growth on the substrate 10. The electron transit layer 21 is made of GaN and has a film thickness of approximately 1 μm. The electron supply layer 22 is made of AlGaN, more specifically $Al_xGa_{1-x}N$ where x value is in a range of 0.15 to 0.25, so that the film thickness thereof is in a range of 15 nm to 25 nm.

The resist pattern 275 is formed by applying a photoresist on the electron supply layer 22 and exposing and developing the photoresist by an exposure device. The resist pattern 275 formed by this way has the opening part 275a in the region where the element isolation region 60 is to be formed.

Next, as illustrated in FIGS. 73A through 73C, the element isolation region 60 is formed in the nitride semiconductor layers at the opening part 275a of the resist pattern 275. Further, the resist pattern 275 is removed, and an insulation film 271a for forming the first gate insulation film 271 is formed. A resist pattern 276 is formed on the formed insulation film 271a. Here, FIG. 73A is a cross-sectional view of the semiconductor apparatus when cut along the dashed-dotted line 68A-68B of FIG. 68. FIG. 73B is a cross-sectional view of the semiconductor apparatus when cut along the dashed-dotted line 68C-68D of FIG. 68. FIG. 73C is a cross-sectional view of the semiconductor apparatus when cut along the dashed-dotted line 68E-68F of FIG. 68.

Specifically, the element isolation region 60 is formed by performing ion implantation of Ar ions, B ions or the like at a predetermined acceleration voltage into the nitride semiconductor layer at the opening part 275a of the resist pattern 275, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 265 is removed with an organic solvent or the like.

The insulation film 271a for forming the first gate insulation film 271 is formed on the electron supply layer 22 and the element isolation region 60 by forming $Al_2O_3$ by CVD or ALD. After that, the resist pattern 276 is formed in the region where the first transistor 111 is to be formed by applying a photoresist on the insulation film 271a and exposing and developing the photoresist by an exposure device.

Figure 74A:
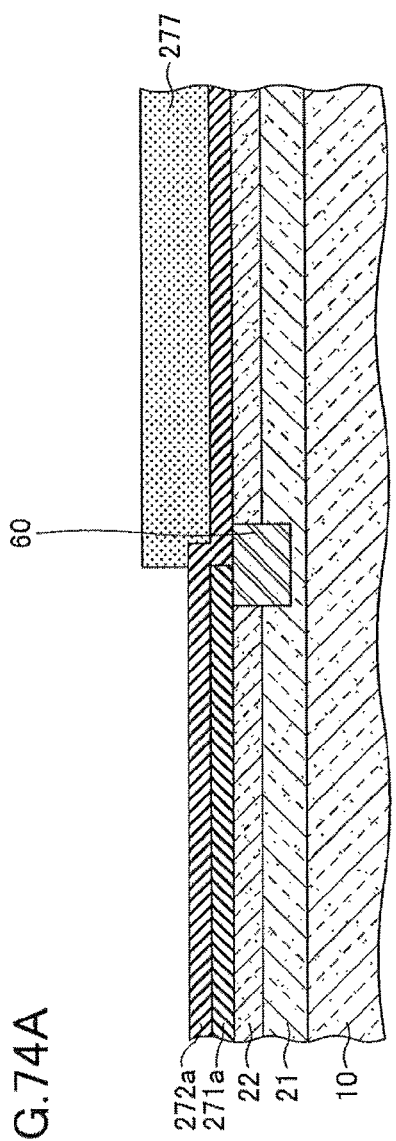
FIGS. 74A through 74C are third cross-sectional views illustrating the method of manufacturing the semiconductor apparatus according to the eighth embodiment.
Figure 74C:
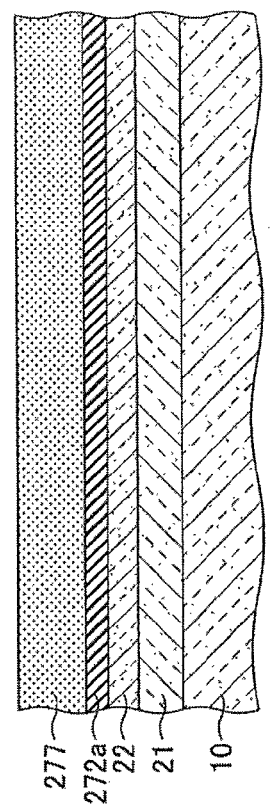
Figure 74B:
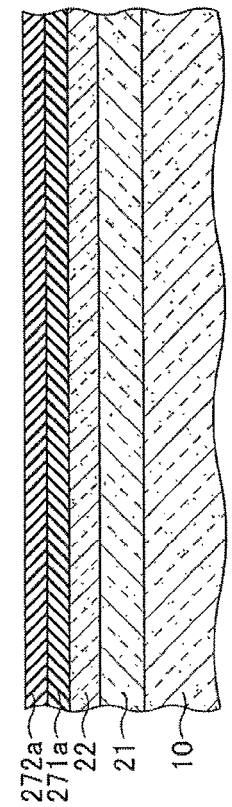

Next, as illustrated in FIGS. 74A through 74C, the insulation film 271a is removed in the region where the resist pattern 276 is not formed. Further, the resist pattern 276 is removed with an organic solvent or the like, and an insulation film 272a for forming the second gate insulation film 272 is formed on the remaining insulation film 271a and the electron supply layer 22. A resist pattern 277 is formed on the formed insulation film 272a. Here, FIG. 74A is a cross-sectional view of the semiconductor apparatus when cut along the dashed-dotted line 68A-68B of FIG. 68. FIG. 74B is a cross-sectional view of the semiconductor apparatus when cut along the dashed-dotted line 68C-68D of FIG. 68. FIG. 74C is a cross-sectional view of the semiconductor apparatus when cut along the dashed-dotted line 68E-68F of FIG. 68.

By removing the insulation film 271a in the region where the resist pattern 276 is not formed, the insulation film 271a remains in the region where the first transistor 111 is to be formed. The insulation film 271a may be removed by dry etching such as RIE or wet etching.

After the resist pattern 276 is removed, the insulation film 272a for forming the second gate insulation film 272 is formed by forming $SiO_2$ on the electron supply layer 22 and the insulation film 271a by CVD or ALD. The resist pattern 277 is formed in the region where the second transistor 112 is to be formed by applying a photoresist on the formed insulation film 272a and exposing and developing the photoresist by an exposure device.

Figure 75A:
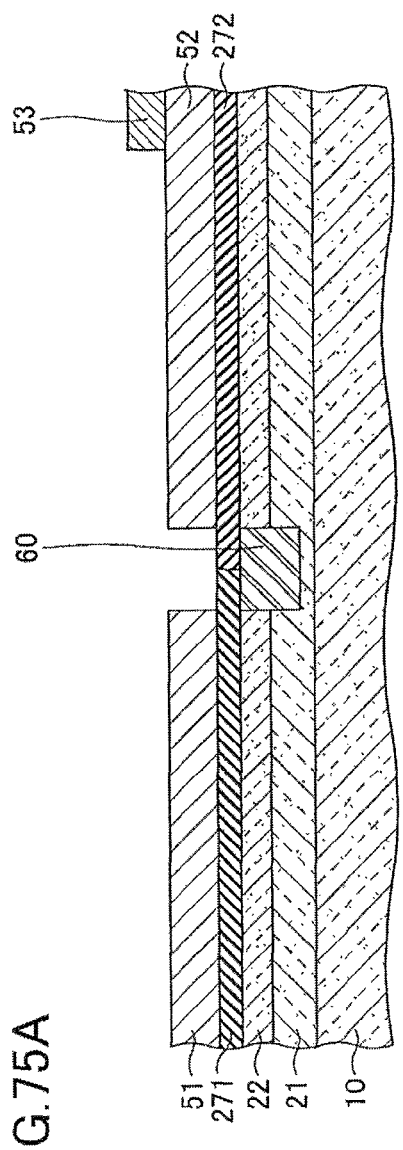
FIGS. 75A through 75C are fourth cross-sectional views illustrating the method of manufacturing the semiconductor apparatus according to the eighth embodiment.
Figure 75C:
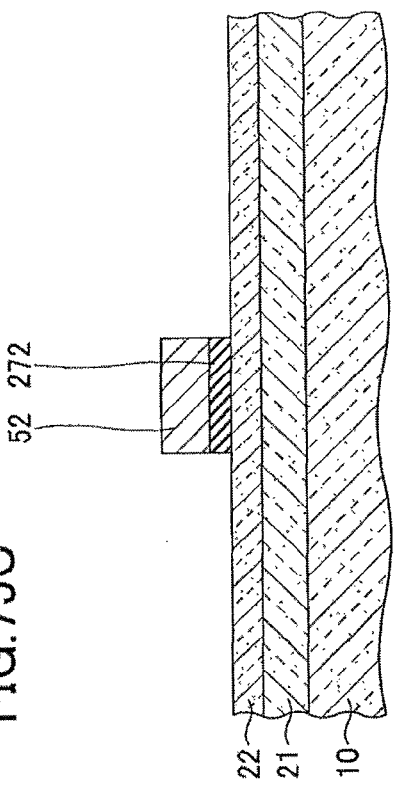
Figure 75B:
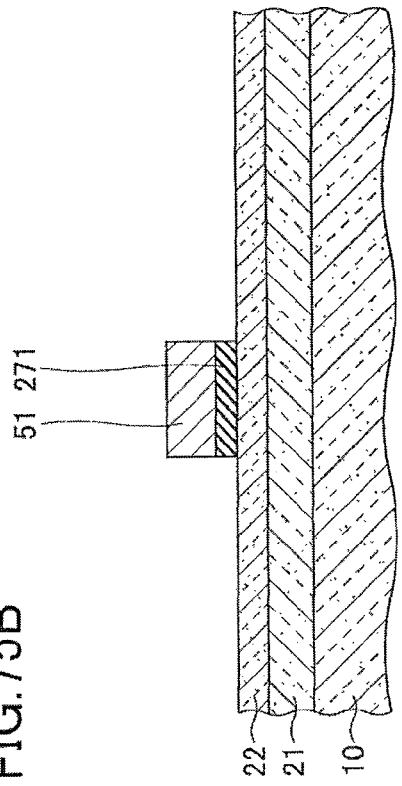

Next, as illustrated in FIGS. 75A through 75C, the insulation film 272a in the region where the resist pattern 277 is not formed is removed. Then, the resist pattern 277 is removed with an organic solvent or the like. Then, the first gate electrode 51 and the second gate electrode 52 are formed. Here, FIG. 75A is a cross-sectional view of the semiconductor apparatus when cut along the dashed-dotted line 68A-68B of FIG. 68. FIG. 75B is a cross-sectional view of the semiconductor apparatus when cut along the dashed-dotted line 68C-68D of FIG. 68. FIG. 75C is a cross-sectional view of the semiconductor apparatus when cut along the dashed-dotted line 68E-68F of FIG. 68.

By removing the insulation film 272a in the region where the resist pattern 277 is not formed, the insulation film 272a remains in the region where the resist pattern 277 is formed and the second transistor 112 is to be formed. After that, the resist pattern 277 is removed with an organic solvent or the like.

After that, a metal film for forming the first gate electrode 51 and the second gate electrode 52 on the insulation films 271a and 272a is formed by vacuum deposition or sputtering. After that, a resist pattern (not shown) is formed on the metal film in the regions where the first gate electrode 51 and the second gate electrode 52 are to be formed. Then, the metal film in the region where the resist pattern is not formed, the first gate insulation film 271, and the second gate insulation film 272 are removed by dry etching such as RIE and wet etching. By doing this, a part where the first gate insulation film 271 and the first gate electrode 51 are laminated and a part where the second gate insulation film 272 and the second gate electrode 52 are laminated are formed based on the remaining metal film, the first gate insulation film 271, and the second gate insulation film 272. Namely, the part where the first gate insulation film 271 and the first gate electrode 51 are laminated is formed in the region where the first transistor 111 is to be formed. The part where the second gate insulation film 272 and the second gate electrode 52 are laminated is formed in the region where the second transistor 112 is to be formed.

By doing this, the first gate electrode 51 is formed on the first gate insulation film 271 in the region where the first transistor 111 is to be formed, and the second gate electrode 52 is formed on the second gate insulation film 272 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Next, as illustrated in FIGS. 76A through 76C, the interlayer insulation film 213 is formed on the electron supply layer 22, the first gate electrode 51, and the second gate electrode 52. Further, the opening parts 213a and 213b are formed on the interlayer insulation film 213 in the regions where the source electrode 32 and the drain electrode 33 are to be formed. Here, FIG. 76A is a cross-sectional view of the semiconductor apparatus when cut along the dashed-dotted line 68A-68B of FIG. 68. FIG. 76B is a cross-sectional view of the semiconductor apparatus when cut along the dashed-dotted line 68C-68D of FIG. 68. FIG. 76C is a cross-sectional view of the semiconductor apparatus when cut along the dashed-dotted line 68E-68F of FIG. 68.

Specifically, first, the interlayer insulation film 213 is formed on the electron supply layer 22, the first gate electrode 51, and the second gate electrode 52 by forming a $SiO_2$ or SiN layer or a laminated layer of $SiO_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Figure 77A:
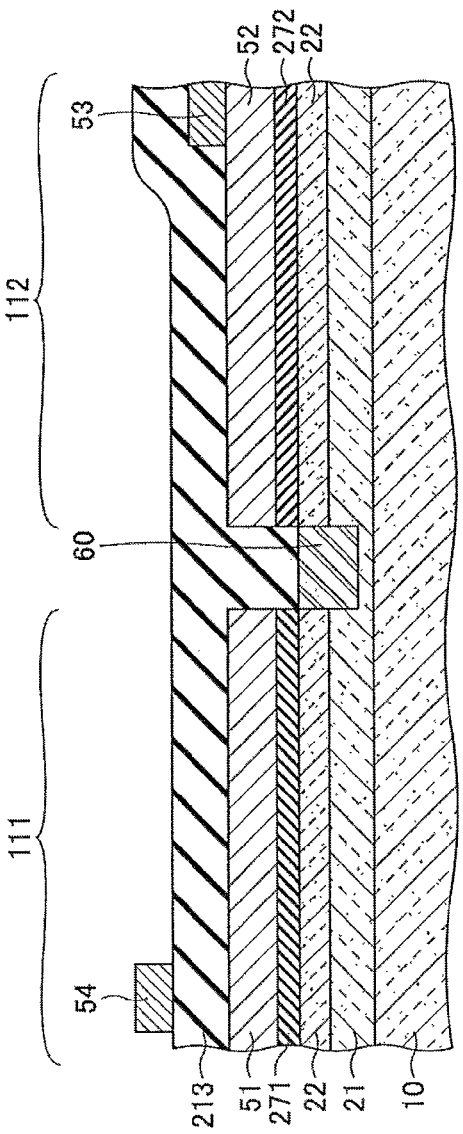
FIGS. 77A through 77C are sixth cross-sectional views illustrating the method of manufacturing the semiconductor apparatus according to the eighth embodiment.
Figure 77C:
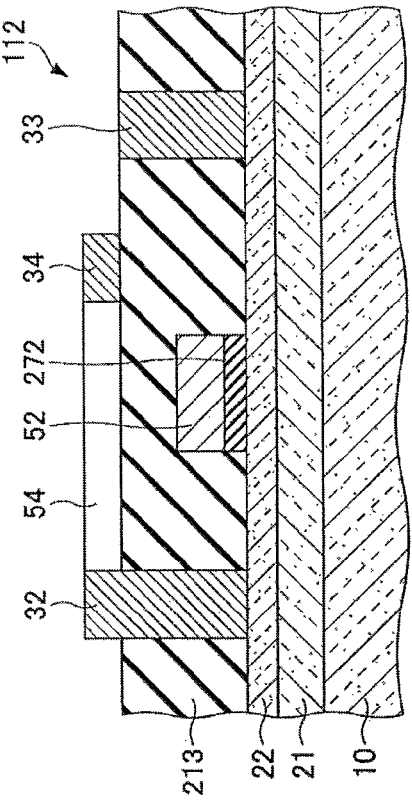
Figure 77B:
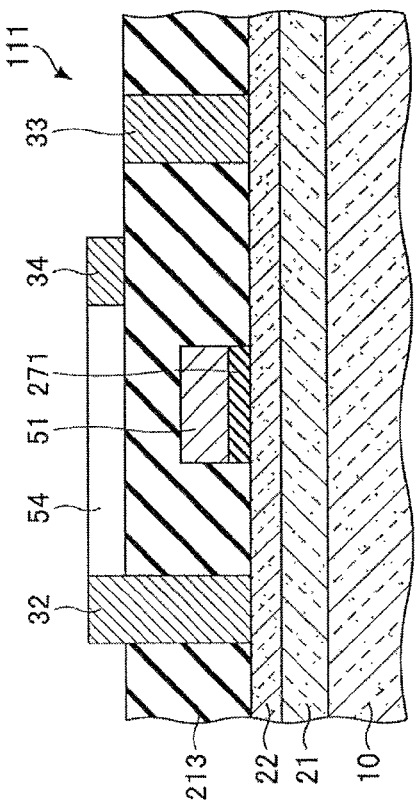

Next, as illustrated in FIG. 77A through 77C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 77A is a cross-sectional view of the semiconductor apparatus when cut along the dashed-dotted line 68A-68B of FIG. 68. FIG. 77B is a cross-sectional view of the semiconductor apparatus when cut along the dashed-dotted line 68C-68D of FIG. 68. FIG. 77C is a cross-sectional view of the semiconductor apparatus when cut along the dashed-dotted line 68E-68F of FIG. 68.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 is to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the seventh embodiments.

Ninth Embodiment

Semiconductor Apparatus

Figure 78:
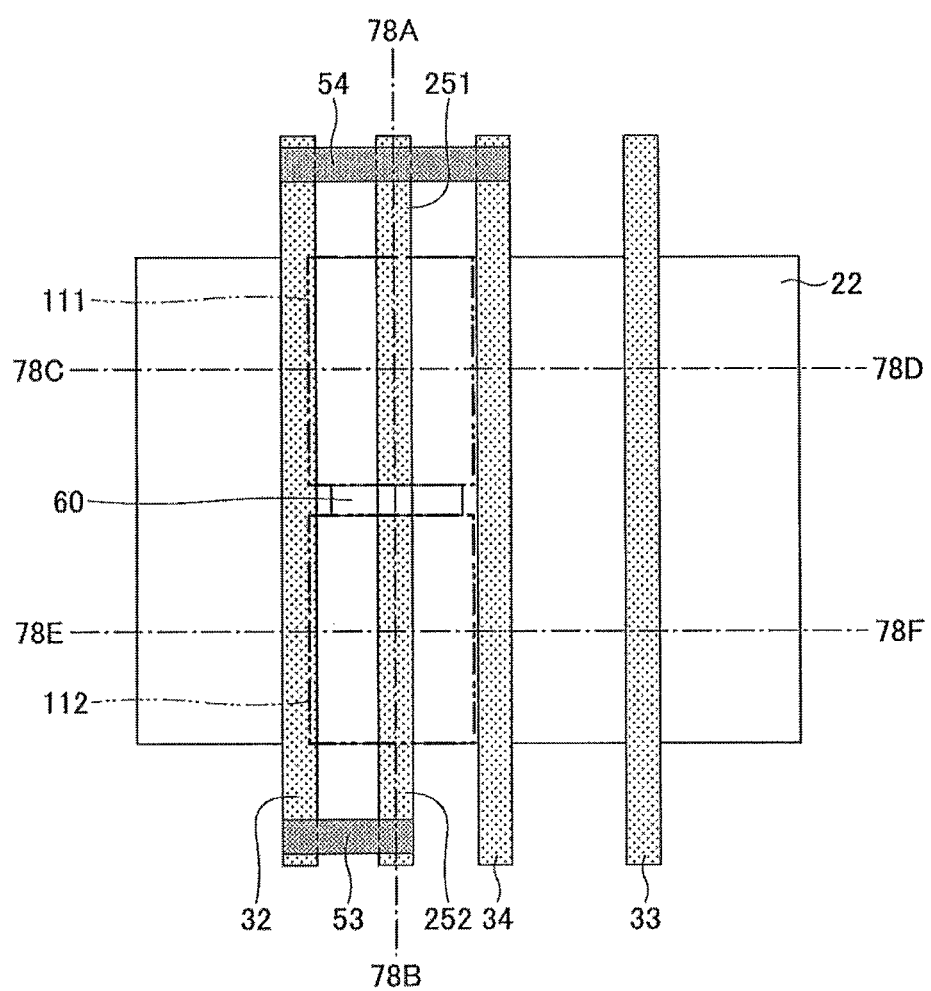
FIG. 78 is a top view of a semiconductor apparatus according to a ninth embodiment.
Figure 79:
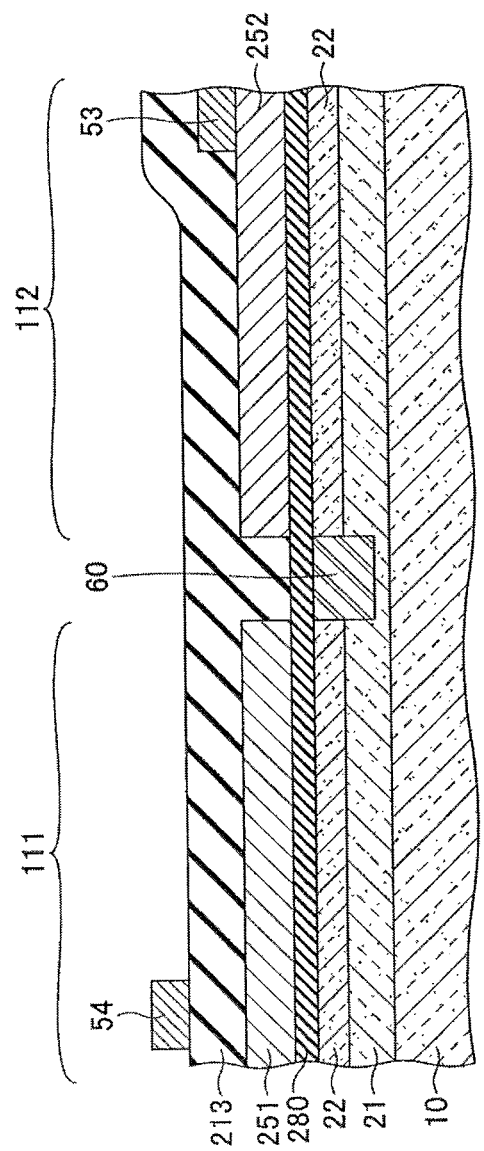
FIG. 79 is a first cross-sectional view of the semiconductor apparatus according to the ninth embodiment.
Figure 80:
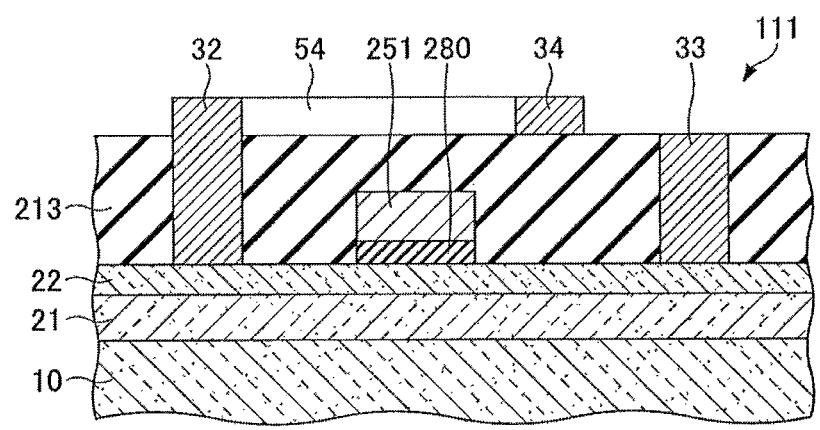
FIG. 80 is a second cross-sectional view of the semiconductor apparatus according to the ninth embodiment.
Figure 81:
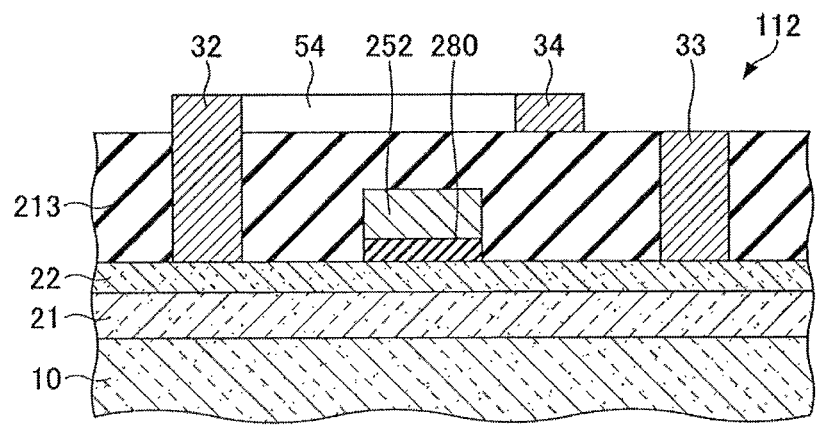
FIG. 81 is a third cross-sectional view of the semiconductor apparatus according to the ninth embodiment.

Next, a ninth embodiment is described. In a semiconductor apparatus according to this embodiment, the material of the first gate electrode in the first transistor has a higher work function than that of the material of the second gate electrode in the second transistor. By doing this, the gate threshold value voltage of the first transistor is greater than that of the second transistor. The semiconductor according to this embodiment is described with reference to FIGS. 78 through 81. FIG. 78 is a top view of the semiconductor apparatus according to this embodiment. Further, in FIG. 78, the interlayer insulation films are not shown. FIG. 79 is a cross-sectional view of the semiconductor apparatus when cut along the dashed-dotted line 78A-78B of FIG. 78. FIG. 80 is a cross-sectional view of the semiconductor apparatus when cut along the dashed-dotted line 78C-78D of FIG. 78. FIG. 81 is a cross-sectional view of the semiconductor apparatus when cut along the dashed-dotted line 78E-78F of FIG. 78.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21. Further, a gate insulation film 280 is formed on the electron supply layer 22 in the regions where the first gate electrode 251 and the second gate electrode 252 are to be formed. The first gate electrode 251 is formed on the gate insulation film 280 in the region where the first transistor 111 is to be formed. The second gate electrode 252 is formed on the gate insulation film 280 in the region where the second transistor 112 is to be formed. Further, the source electrode 32 and the drain electrode 33 are formed on the electron supply layer 22. The interlayer insulation film 213 is formed on the electron supply layer 22, the first gate electrode 251, and the second gate electrode 252. The field plate (FP) 34 and the connection electrode 54 are formed in predetermined regions on the interlayer insulation film 213.

The substrate 10 is made of silicon, but may alternatively be made of SiC, sapphire or the like.

The gate insulation film 280 is made of a High-k material such as nitride silicon (SiN), silicon oxide (SiO), aluminum nitride (AlN), aluminum oxide ($Al_2O_3$), zirconium oxide ($ZrO_x$), or hafnium oxide ($HfO_x$). Specifically, the gate insulation film 280 is formed by using any one of the materials or by laminating some of the materials.

The first gate electrode 251 and the second gate electrode 252 are formed of, for example, TiN, TaN, W, Pt, Al, polysilicon, or amorphous silicon in which an impurity element is doped. The first gate electrode 251 is formed of a material different from a material of the formed second gate electrode 252. Namely, the material of the first gate electrode 251 has a higher work function than that of the material of the second gate electrode 252. The work functions of the materials are illustrated in Table 1 described above.

In this embodiment, for example, the first gate electrode 251 is formed of Pt whose work function is 5.65 eV and the second gate electrode 252 is formed of Al whose work function is 4.28 eV.

By doing this, in the semiconductor apparatus in this embodiment, three transistors are formed. Namely, the three transistors are the first transistor 111 using the first gate electrode 251 as the gate electrode thereof, the second transistor 112 using the second gate electrode 252 as the gate electrode thereof, and the third transistor using the field plate (FP) 34 as the gate electrode thereof.

In the semiconductor apparatus according to this embodiment, the second gate electrode 252 is connected to the source electrode 32 through the connection electrode 53, so that voltage equal to the voltage applied to the source electrode 32 is applied to the second gate electrode 252. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the first gate electrode 251 is formed of the material whose work function is greater than the work function of the material of which the second gate electrode 252 is formed. By doing this, the gate threshold value voltage of the first transistor 111 becomes greater than that of the second transistor 112.

As illustrated in FIG. 78, in the semiconductor apparatus according to the embodiment, the first gate electrode 251, the second gate electrode 252, and the element isolation region 60 are formed between the source electrode 32 and the drain electrode 33. The field plate (FP) 34 is formed between the first gate electrode 251, the second gate electrode 252, and the element isolation region 60, and the drain electrode 33. The element isolation region 60 is formed between the first gate electrode 251 and the second gate electrode 252.

Method of Manufacturing Semiconductor Apparatus

Next, a method of manufacturing the semiconductor apparatus according to this embodiment is described with reference to FIGS. 82A through 86C.

First, as illustrated in FIGS. 82A through 82C, a nitride semiconductor layer is formed on the substrate 10 made of silicon or the like, and a resist pattern 285 having an opening part 285a is formed on the nitride semiconductor layer. Here, FIG. 82A is a cross-sectional view of the semiconductor apparatus when cut along the dashed-dotted line 78A-78B of FIG. 48. FIG. 82B is a cross-sectional view of the semiconductor apparatus when cut along the dashed-dotted line 78C-78D of FIG. 78. FIG. 82C is a cross-sectional view of the semiconductor apparatus when cut along the dashed-dotted line 78E-78F of FIG. 78.

Specifically, nitride semiconductor layers such as the buffer layer (not shown) made of AlN, AlGaN or the like, the electron transit layer 21, the electron supply layer 22, the p-type layer 250 and the like are laminated by epitaxial growth on the substrate 10. The electron transit layer 21 is made of GaN and has a film thickness of approximately 1 μm. The electron supply layer 22 is made of AlGaN, more specifically $Al_xGa_{1-x}N$ where x value is in a range of 0.15 to 0.25, so that the film thickness thereof is in a range of 15 nm to 25 nm.

The resist pattern 285 is formed by applying a photoresist on the electron supply layer 22 and exposing and developing the photoresist by an exposure device. The resist pattern 285 formed by this way has the opening part 285a in the region where the element isolation region 60 is to be formed.

Figure 83A:
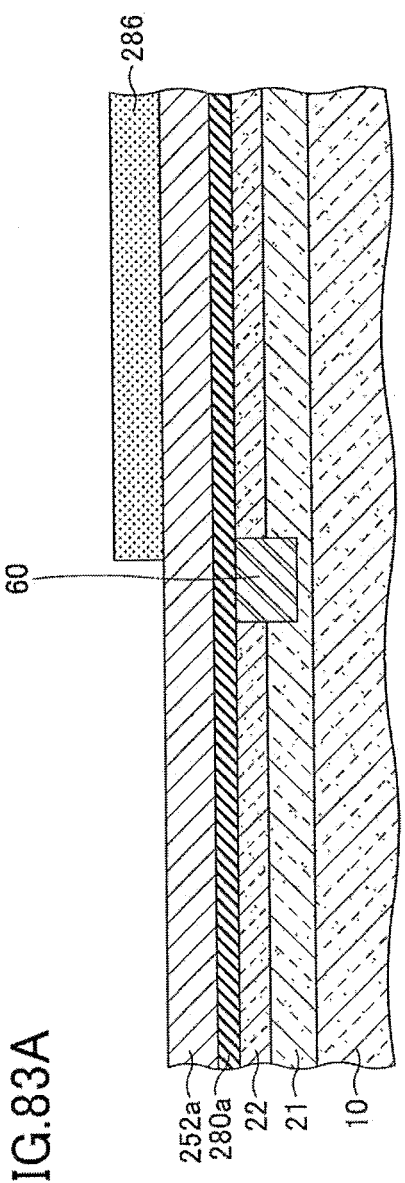
FIGS. 83A through 83C are second cross-sectional views illustrating the method of manufacturing the semiconductor apparatus according to the ninth embodiment.
Figure 83C:
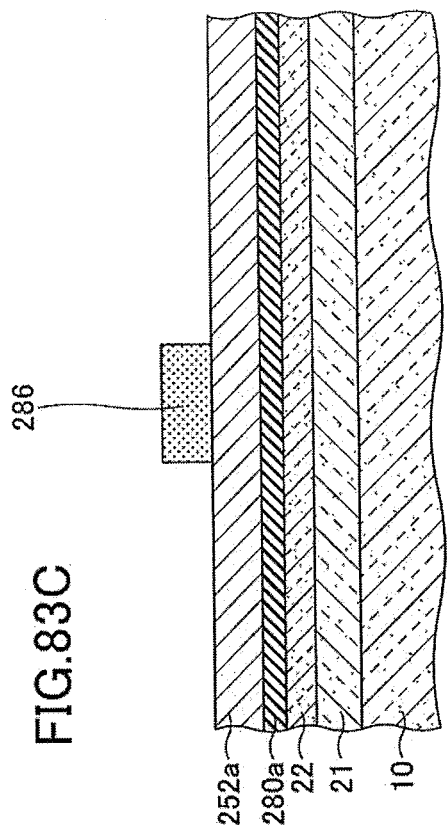
Figure 83B:
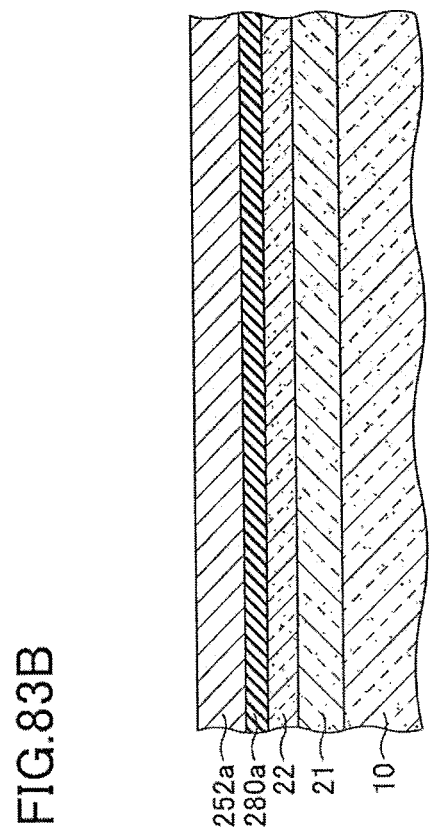

Next, as illustrated in FIGS. 83A through 83C, the element isolation region 60 is formed in the nitride semiconductor layer at the opening part 285a of the resist pattern 285. Then, the resist pattern 285 is removed and an insulation film 280a for forming the gate insulation film 280 is formed. The conductive film 252a for forming the second gate electrode 252 is formed on the insulation film 280a. Then, a resist pattern 286 is formed on the conductive film 252a. Here, FIG. 83A is a cross-sectional view of the semiconductor apparatus when cut along the dashed-dotted line 78A-78B of FIG. 78. FIG. 83B is a cross-sectional view of the semiconductor apparatus when cut along the dashed-dotted line 78C-78D of FIG. 78. FIG. 83C is a cross-sectional view of the semiconductor apparatus when cut along the dashed-dotted line 78E-78F of FIG. 78.

Specifically, the element isolation region 60 is formed by performing ion implantation of Ar ions, B ions or the like at a predetermined acceleration voltage into the nitride semiconductor layer at the opening part 285a of the resist pattern 285, so as to have a predetermined concentration of the doped ions. By doing this, the element isolation region 60 is formed between the first gate electrode 251 and the second gate electrode 252. For example, the element isolation region 60 to be formed may be formed by ion implantation of Ar, B or the like performed on a part of the electron transit layer 21 and the electron supply layer 22. The resist pattern 285 is removed with an organic solvent or the like.

The insulation film 280a for forming the gate insulation film 280 is formed by forming a film of $Al_2O_3$ by CVD or ALD. The conductive film 252a made of Al or the like for forming the second gate electrode 252 is formed on the insulation film 280a by vacuum deposition, sputtering or the like. After that, by applying a photoresist on the conductive film 252a and exposing and developing the photoresist by an exposure device, the resist pattern 286 is formed in the region where the second gate electrode 252 is to be formed.

Figure 84A:
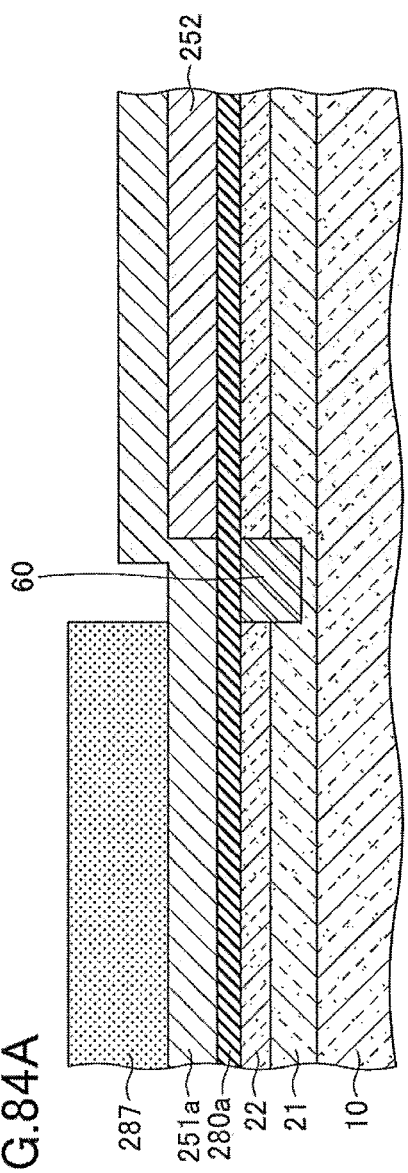
FIGS. 84A through 84C are third cross-sectional views illustrating the method of manufacturing the semiconductor apparatus according to the ninth embodiment.
Figure 84C:
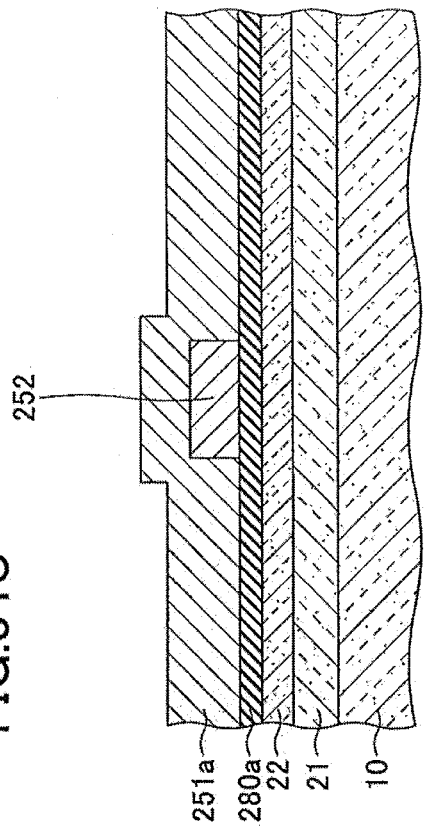
Figure 84B:
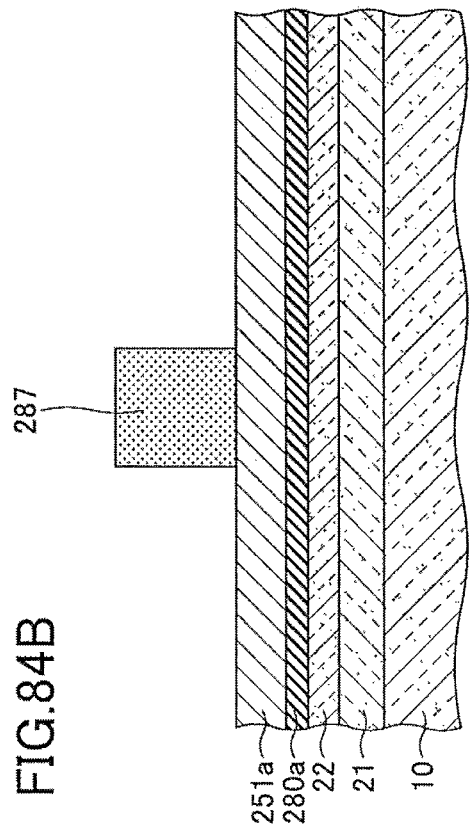

Next, as illustrated in FIGS. 84A through 84C, the conductive film 252a in the region where the resist pattern 286 is not formed is removed by RIE or the like to form the second gate electrode 252. Further, the resist pattern 286 is removed with an organic solvent or the like. After the conductive film 251a for forming the first gate electrode 251 is formed on the second gate electrode 252 and the insulation film 280a, a resist pattern 287 is formed. Here, FIG. 84A is a cross-sectional view of the semiconductor apparatus when cut along the dashed-dotted line 78A-78B of FIG. 78. FIG. 84B is a cross-sectional view of the semiconductor apparatus when cut along the dashed-dotted line 78C-78D of FIG. 78. FIG. 84C is a cross-sectional view of the semiconductor apparatus when cut along the dashed-dotted line 78E-78F of FIG. 78.

A conductive film 251a made of Pt or the like for forming the first gate electrode 251 is formed by forming a film on the second gate electrode 252 and the insulation film 280a by vacuum deposition, sputtering or the like. After that, by applying a photoresist on the conductive film 251a and exposing and developing the photoresist by an exposure device, the resist pattern 287 is formed in the region where the first gate electrode 251 is to be formed.

Figure 85A:
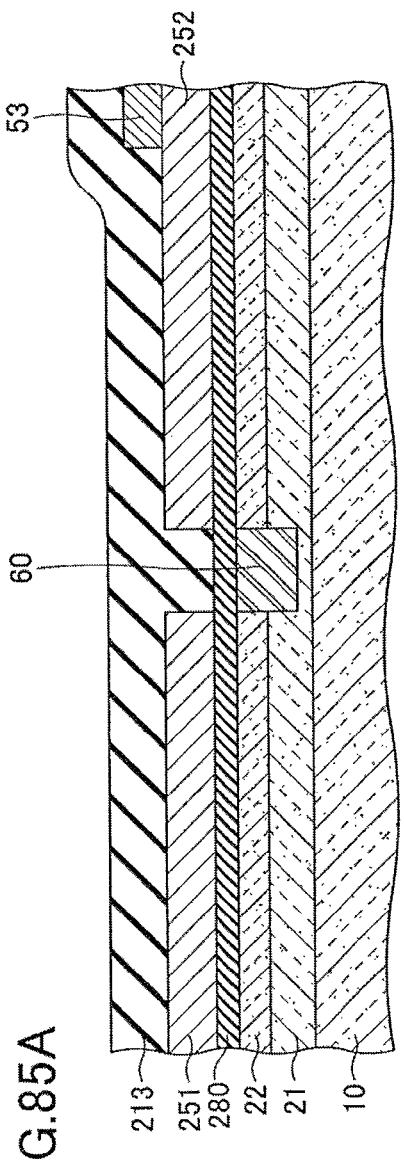
FIGS. 85A through 85C are fourth cross-sectional views illustrating the method of manufacturing the semiconductor apparatus according to the ninth embodiment.
Figure 85C:
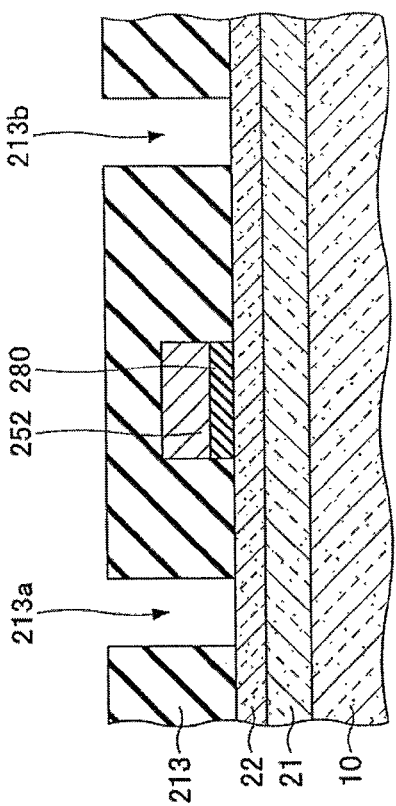
Figure 85B:
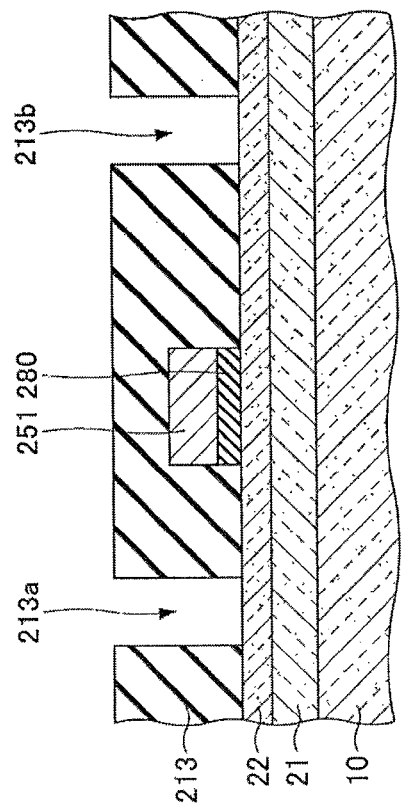

Next, as illustrated in FIGS. 85A through 85C, the conductive film 251a and the insulation film 280a in the region where the resist pattern 287 is not formed are removed by dry etching such as RIE or wet etching to form the first gate electrode 251 and the gate insulation film 280. Further, during the etching, it is assumed that the second gate electrode 252 is not etched. The resist pattern 287 is removed with an organic solvent or the like. After that, the interlayer insulation film 213 is formed on the electron supply layer 22, the first gate electrode 251, and the second gate electrode 252. Further, the openings 213a and 213b are formed in the interlayer insulation film 213 in the regions where the source electrode 32 and the drain electrode 33 are to be formed. Here, FIG. 85A is a cross-sectional view of the semiconductor apparatus when cut along the dashed-dotted line 78A-78B of FIG. 78. FIG. 85B is a cross-sectional view of the semiconductor apparatus when cut along the dashed-dotted line 78C-78D of FIG. 78. FIG. 85C is a cross-sectional view of the semiconductor apparatus when cut along the dashed-dotted line 78E-78F of FIG. 78.

As described above, the first gate electrode 251 is formed on the gate insulation film 280 in the region where the first transistor 111 is formed, and the second gate electrode 252 is formed on the gate insulation film 280 in the region where the second transistor 112 is formed. Further, in this embodiment, the connection electrode 53, which connects the second gate electrode 252 with the source electrode 32 described below, may be formed at the same time when the first gate electrode 251 and the second gate electrode 252 are formed, or may be separately formed after the first gate electrode 251 and the second gate electrode 252 are formed or after the source electrode 32 described below is formed.

After that, the interlayer insulation film 213 is formed on the electron supply layer 22, the first gate electrode 251, and the second gate electrode 252 by forming a $SiO_2$ or SiN layer or a laminated layer of $SiO_2$ and SiN by CVD or ALD. Then, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that the resist pattern (not shown) is removed with an organic solvent or the like.

Next, as illustrated in FIG. 86A through 86C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 86A is a cross-sectional view of the semiconductor apparatus when cut along the dashed-dotted line 78A-78B of FIG. 78. FIG. 86B is a cross-sectional view of the semiconductor apparatus when cut along the dashed-dotted line 78C-78D of FIG. 78. FIG. 86C is a cross-sectional view of the semiconductor apparatus when cut along the dashed-dotted line 78E-78F of FIG. 78.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the sixth embodiments.

Tenth Embodiment

Semiconductor Apparatus

Figure 87:
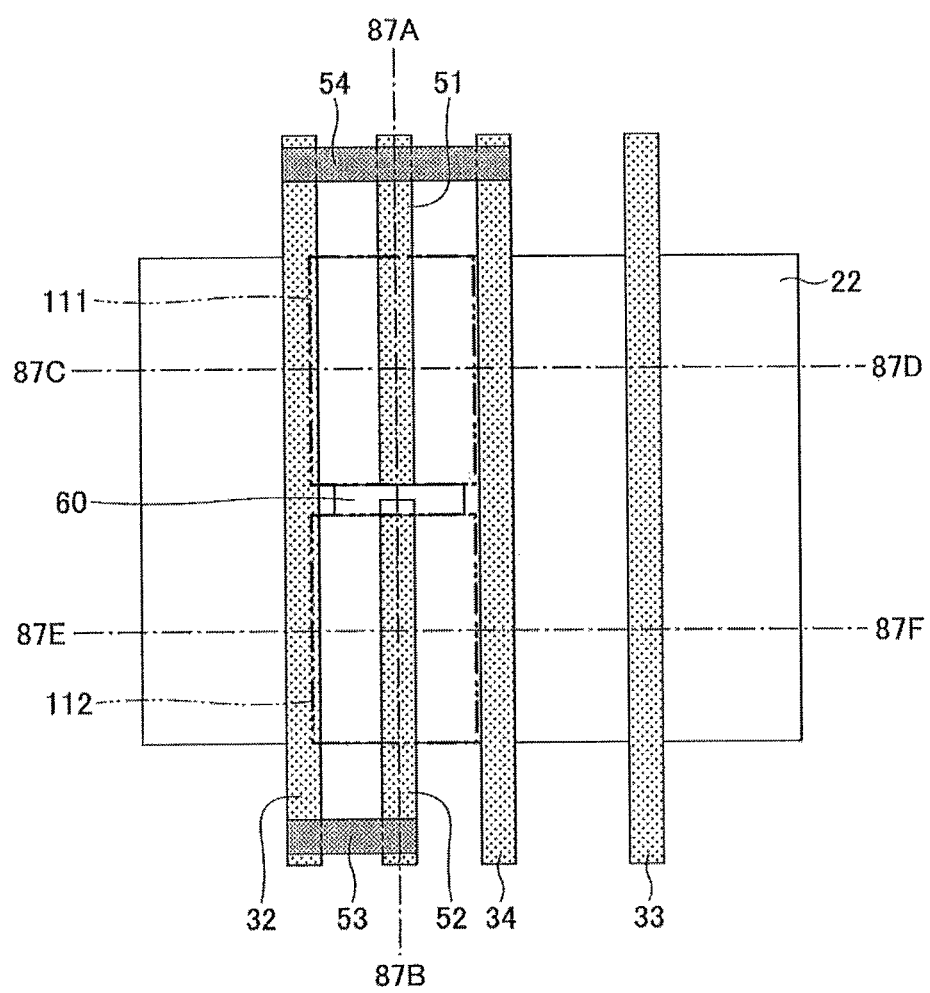
FIG. 87 is a top view of a semiconductor apparatus according to a tenth embodiment.
Figure 88:
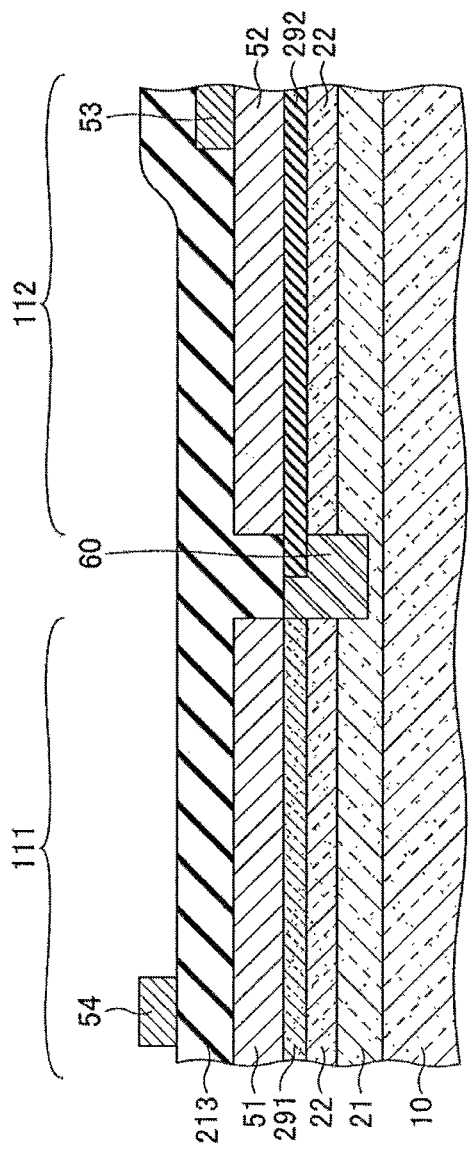
FIG. 88 is a first cross-sectional view of the semiconductor apparatus according to the tenth embodiment.
Figure 89:
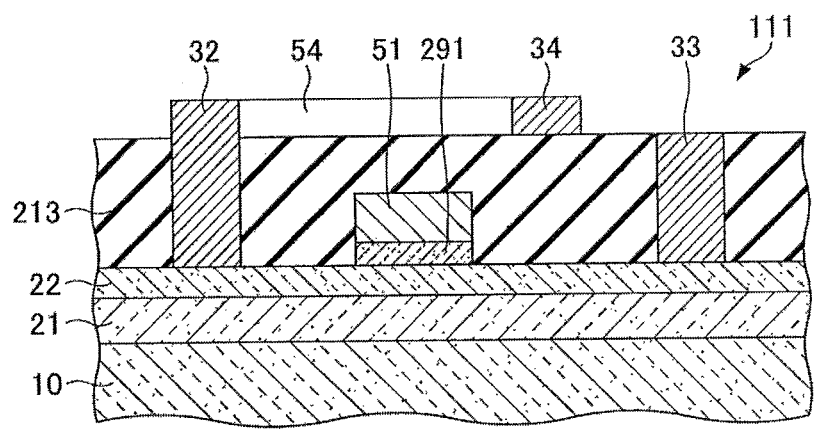
FIG. 89 is a second cross-sectional view of the semiconductor apparatus according to the tenth embodiment.
Figure 90:
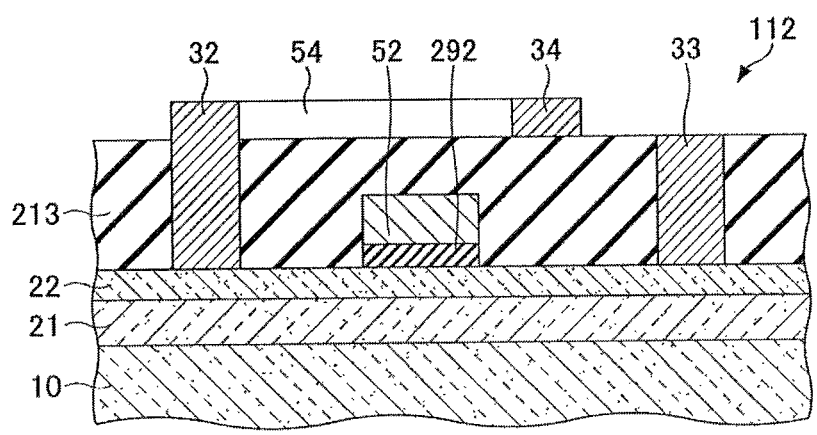
FIG. 90 is a third cross-sectional view of the semiconductor apparatus according to the tenth embodiment.

Next, a tenth embodiment is described. In a semiconductor apparatus according to this embodiment, a p-type layer is formed in the first transistor and a gate insulation film is formed in the second transistor, so that the gate threshold value voltage of the first transistor is greater than that of the second transistor. The semiconductor according to this embodiment is described with reference to FIGS. 87 through 90. FIG. 87 is a top view of the semiconductor apparatus according to this embodiment. Further, in FIG. 87, the interlayer insulation films are not shown. FIG. 88 is a cross-sectional view of the semiconductor apparatus when cut along the dashed-dotted line 87A-87B of FIG. 87. FIG. 89 is a cross-sectional view of the semiconductor apparatus when cut along the dashed-dotted line 87C-87D of FIG. 87. FIG. 90 is a cross-sectional view of the semiconductor apparatus when cut along the dashed-dotted line 87E-87F of FIG. 87.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21. In a region where the first transistor 111 is to be formed, a p-type layer 291 is formed on the electron supply layer 22 in the region where the first gate electrode 51 is to be formed. The first gate electrode 51 is to be formed on the p-type layer 291 formed as described above. Further, in a region where the second transistor 112 is to be formed, a gate insulation film 292 is formed on the electron supply layer 22 in the region where the second gate electrode 52 is to be formed. Further, the source electrode 32 and the drain electrode 33 are formed on the electron supply layer 22. The interlayer insulation film 213 is formed on the electron supply layer 22, the first gate electrode 51, and the second gate electrode 52. The field plate (FP) 34 and the connection electrode 54 are formed in predetermined regions on the interlayer insulation film 213.

The substrate 10 is made of silicon, but may alternatively be made of SiC, sapphire or the like.

The first gate electrode 51 and the second gate electrode 52 are formed of, for example, TiN, TaN, W, Pt, Al, polysilicon, or amorphous silicon in which an impurity element is doped.

The p-type layer 291 is formed of GaN in which Mg is doped as a p-type impurity element.

The gate insulation film 292 is made of a High-k material such as nitride silicon (SiN), silicon oxide (SiO), aluminum nitride (AlN), aluminum oxide ($Al_2O_3$), zirconium oxide (ZrO$_x$), or hafnium oxide (HfO$_x$). Specifically, the gate insulation film 292 is formed by using any one of the materials or by laminating some of the materials.

By doing this, in the semiconductor apparatus in this embodiment, three transistors are formed. Namely, the three transistors are the first transistor 111 using the first gate electrode 51 as the gate electrode thereof, the second transistor 112 using the second gate electrode 52 as the gate electrode thereof, and the third transistor using the field plate (FP) 34 as the gate electrode thereof.

In the semiconductor apparatus according to this embodiment, the second gate electrode 52 is connected to the source electrode 32 through the connection electrode 53, so that voltage equal to the voltage applied to the source electrode 32 is applied to the second gate electrode 52. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, the p-type layer 291 is formed under the first gate electrode 51 in the first transistor 111, and the gate insulation film 292 is formed under the second gate electrode 52 in the second transistor 112. By doing this, the gate threshold value voltage of the first transistor 111 becomes greater than that of the second transistor 112.

As illustrated in FIG. 87, in the semiconductor apparatus according to the embodiment, the first gate electrode 51, the second gate electrode 52, and the element isolation region 60 are formed between the source electrode 32 and the drain electrode 33. The field plate (FP) 34 is formed between the first gate electrode 51, the second gate electrode 52, and the element isolation region 60, and the drain electrode 33. The element isolation region 60 is formed between the first gate electrode 51 and the second gate electrode 52.

Method of Manufacturing Semiconductor Apparatus

Next, a method of manufacturing the semiconductor apparatus according to this embodiment is described with reference to FIGS. 91A through 96C.

Figure 91A:
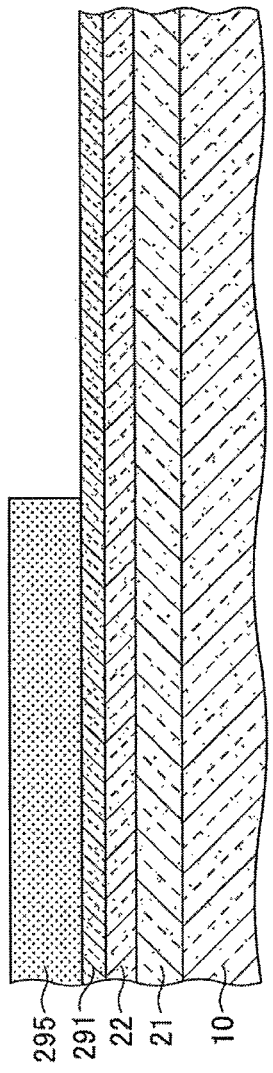
FIGS. 91A through 91C are first cross-sectional views illustrating a method of manufacturing the semiconductor apparatus according to the tenth embodiment.
Figure 91C:
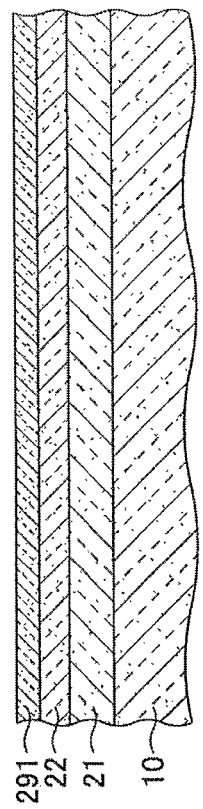
Figure 91B:
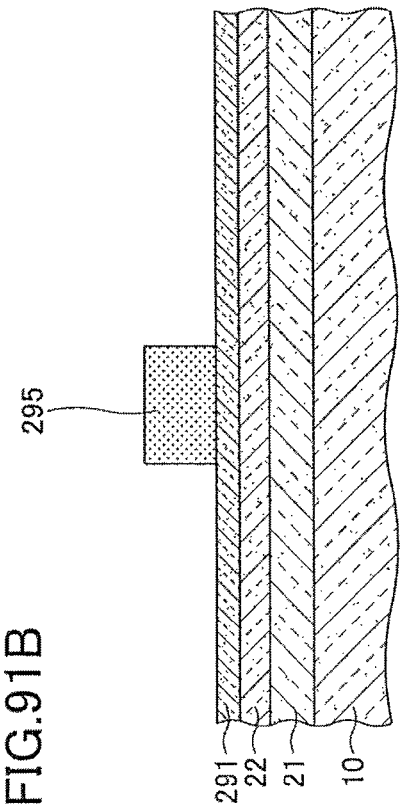

First, as illustrated in FIGS. 91A through 91C, a nitride semiconductor layer is formed on the substrate 10 made of silicon or the like, and a resist pattern 295 is formed on a predetermined region of the nitride semiconductor layer. Here, FIG. 91A is a cross-sectional view of the semiconductor apparatus when cut along the dashed-dotted line 87A-87B of FIG. 87. FIG. 91B is a cross-sectional view of the semiconductor apparatus when cut along the dashed-dotted line 87C-87D of FIG. 87. FIG. 91C is a cross-sectional view of the semiconductor apparatus when cut along the dashed-dotted line 87E-87F of FIG. 87.

Specifically, nitride semiconductor layers such as the buffer layer (not shown) made of AlN, AlGaN or the like, the electron transit layer 21, the electron supply layer 22, and the p-type layer 291 and the like are sequentially laminated by epitaxial growth on the substrate 10. The electron transit layer 21 is made of GaN and has a film thickness of approximately 1 μm. The electron supply layer 22 is made of AlGaN, more specifically Al$_x$Ga$_{1-x}$N where x value is in a range of 0.15 to 0.25, so that the film thickness thereof is in a range of 15 nm to 25 nm. The p-type layer 291 is made of p-GaN and has a film thickness in a range of 40 nm to 80 nm. As a p-type impurity element, Mg is doped so that the impurity concentration is in a range of $1\times10^{19}$ cm$^{-3}$ to $3\times10^{19}$ cm$^{-3}$.

The resist pattern 295 is formed in the region where the first gate electrode 51 is to be formed by applying a photoresist on the p-type layer 291 and exposing and developing the photoresist by an exposure device.

Figure 92A:
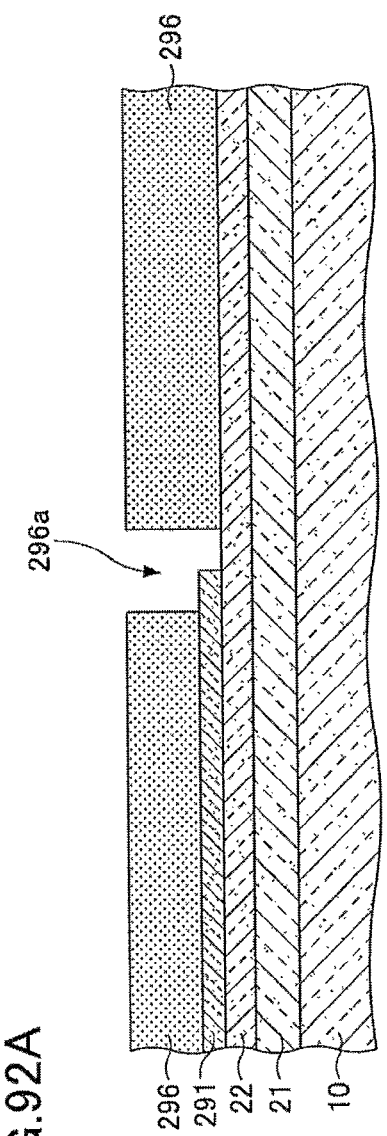
FIGS. 92A through 92C are second cross-sectional views illustrating the method of manufacturing the semiconductor apparatus according to the tenth embodiment.
Figure 92C:
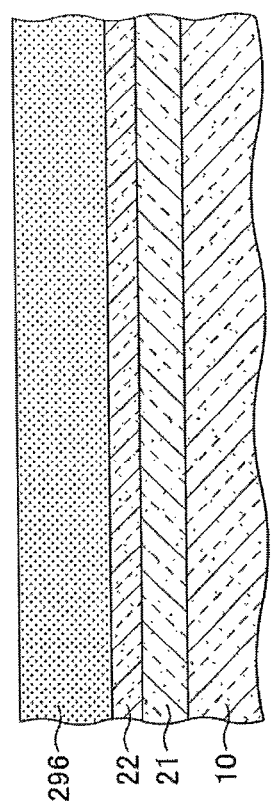
Figure 92B:
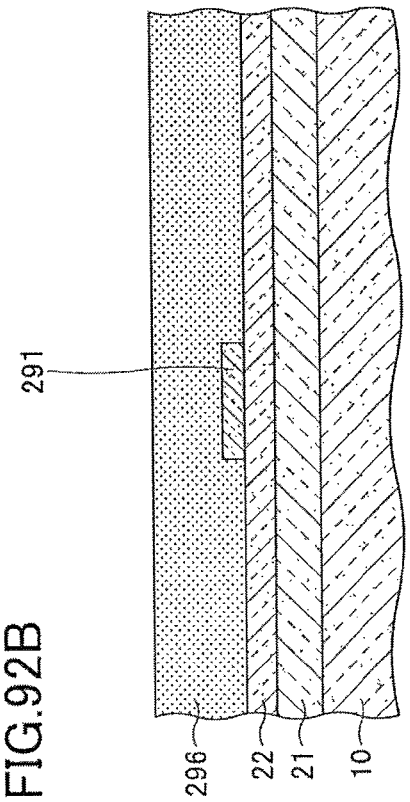

Next, as illustrated in FIGS. 92A through 92C, the p-type layer 291 is formed in the region where the first gate electrode 51 is to be formed by removing the p-type layer 291 in the region where the resist pattern 295 is not formed. After that, the resist pattern 295 is removed with an organic solvent or the like, and a resist pattern 296 is formed, the resist pattern 296 having an opening part 296a at the region where the element isolation region 60 is to be formed. Here, FIG. 92A is a cross-sectional view of the semiconductor apparatus when cut along the dashed-dotted line 87A-87B of FIG. 87. FIG. 92B is a cross-sectional view of the semiconductor apparatus when cut along the dashed-dotted line 87C-87D of FIG. 87. FIG. 92C is a cross-sectional view of the semiconductor apparatus when cut along the dashed-dotted line 87E-87F of FIG. 87.

When the p-type layer 291 in the region where the resist pattern 295 is not formed is partially removed by RIE or the like, chlorine-based gas, SF$_x$-based gas or the like is used. The resist pattern 296 is formed by removing the resist pattern 295 with an organic solvent or the like and applying a photoresist on the electron supply layer 22 and exposing and developing the photoresist by an exposure device.

Figure 93A:
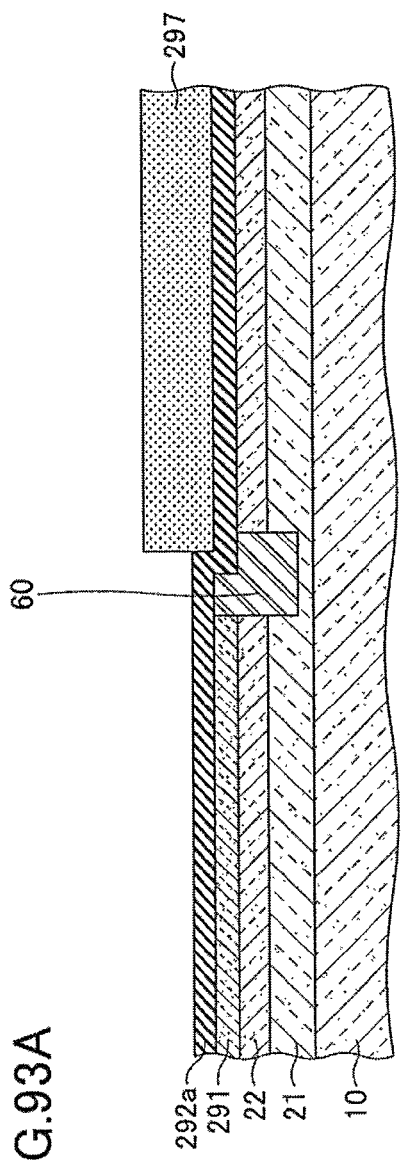
FIGS. 93A through 93C are third cross-sectional views illustrating the method of manufacturing the semiconductor apparatus according to the tenth embodiment.
Figure 93C:
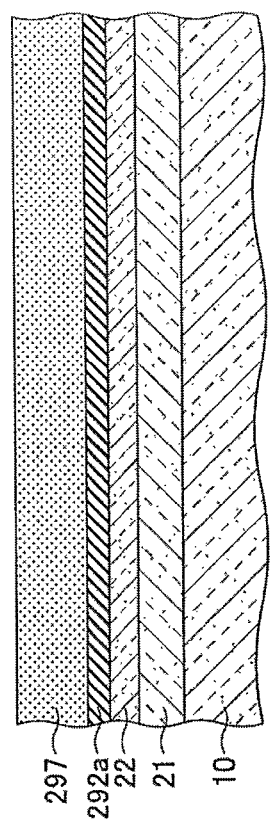
Figure 93B:
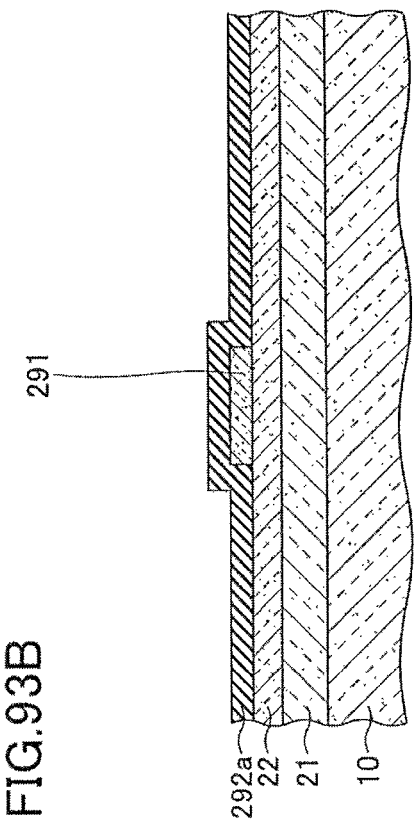

Next, as illustrated in FIGS. 93A through 93C, the element isolation region 60 is formed in the nitride semiconductor layer at an opening part 296a of the resist pattern 296. Further, the resist pattern 296 is removed and an insulation film 292a for forming the gate insulation film 292 is formed. A resist pattern 297 is formed on the insulation film 292a. Here, FIG. 93A is a cross-sectional view of the semiconductor apparatus when cut along the dashed-dotted line 87A-87B of FIG. 87. FIG. 93B is a cross-sectional view of the semiconductor apparatus when cut along the dashed-dotted line 87C-87D of FIG. 87. FIG. 93C is a cross-sectional view of the semiconductor apparatus when cut along the dashed-dotted line 87E-87F of FIG. 87.

Specifically, the element isolation region 60 is formed by performing ion implantation of Ar ions, B ions or the like at a predetermined acceleration voltage into the nitride semiconductor layer at the opening part 296a of the resist pattern 296, so as to have a predetermined concentration of the doped ions. By doing this, the element isolation region 60 is formed between the first gate electrode 51 and the second gate electrode 52. For example, the element isolation region 60 to be formed may be formed by ion implantation of Ar, B or the like performed on a part of the electron transit layer 21 and the electron supply layer 22. The resist pattern 296 is removed with an organic solvent or the like.

The insulation film 292a for forming the gate insulation film 292 is formed by forming Al$_2$O$_3$ by CVD or ALD on the electron supply layer 22 and the p-type layer 291. After that, the resist pattern 297 is formed in the region where the second transistor 112 is to be formed by applying a photoresist on the insulation film 292a and exposing and developing the photoresist by an exposure device.

Figure 94A:
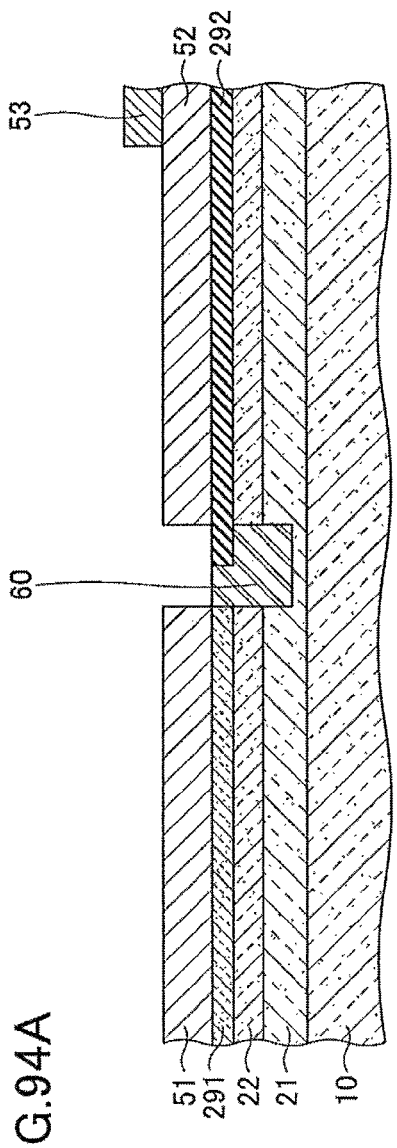
FIGS. 94A through 94C are fourth cross-sectional views illustrating the method of manufacturing the semiconductor apparatus according to the tenth embodiment.
Figure 94C:
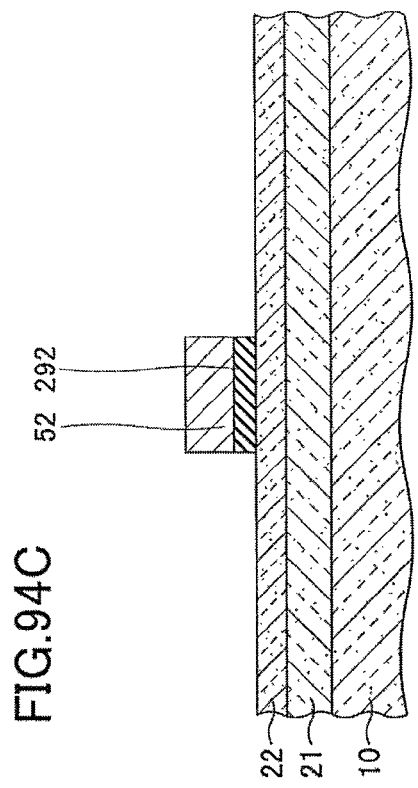
Figure 94B:
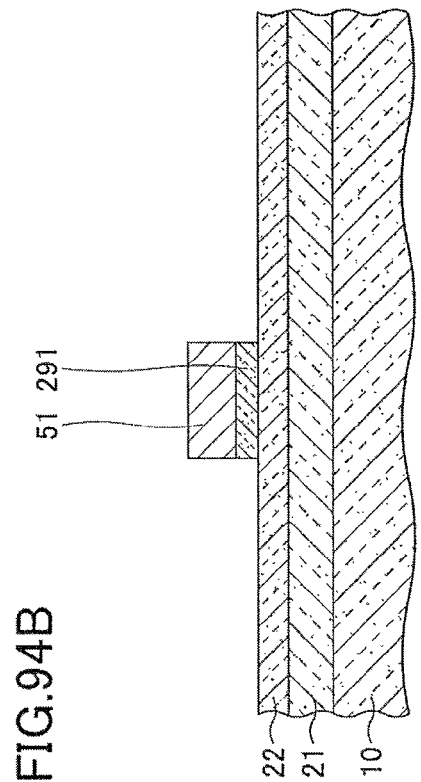

Next, as illustrated in FIGS. 94A through 94C, the insulation film 292a is removed in the region where the resist pattern 297 is not formed. Further, the resist pattern 297 is removed and an insulation film for forming the first gate electrode 51 and the second gate electrode 52 is formed. Further, after that, in the formed insulation film, a resist pattern (not shown) is formed on the regions where the first gate electrode 51 and the second gate electrode 52 is to be formed. Then, the insulation film and the insulation film 292a are removed in the region where the resist pattern is not formed. After that, the resist pattern (not shown) is removed. Here, FIG. 94A is a cross-sectional view of the semiconductor apparatus when cut along the dashed-dotted line 87A-87B of FIG. 87. FIG. 94B is a cross-sectional view of the semiconductor apparatus when cut along the dashed-dotted line 87C-87D of FIG. 87. FIG. 94C is a cross-sectional view of the semiconductor apparatus when cut along the dashed-dotted line 87E-87F of FIG. 87.

The insulation film 292a in the region where the resist pattern 297 is not formed is removed by dry etching such as RIE or wet etching. During the etching, it is assumed that the nitride semiconductor is not etched. After that, the resist pattern 297 is removed with an organic solvent or the like.

After the resist pattern 297 is removed, the metal film for forming the first gate electrode 51 and the second gate electrode 52 in the region where the resist pattern 297 is not formed is formed on the electron supply layer 22, the p-type layer 291, and the gate insulation film 292 by vacuum deposition or sputtering.

After that, a photoresist is applied on the formed metal film and exposed and developed by an exposure device to form a resist pattern in the regions where the first gate electrode 51 and the second gate electrode 52 are to be formed. After that dry etching such as RIE or wet etching is performed to remove the insulation film and the gate insulation film 292 in the region where the resist pattern is not formed to expose the electron supply layer 22. By doing this, the first gate electrode 51 and the second gate electrode 52 are formed based on the remaining metal film, and the gate insulation film 292 is formed based on the remaining insulation film 292a.

By doing this, the first gate electrode 51 is formed on the p-type layer 291 in the region where the first transistor 111 is to be formed, and the second gate electrode 52 is formed on the gate insulation film 292 in the region where the second transistor 112 is to be formed. Further, in this embodiment, the connection electrode 53, which connects the second gate electrode 52 with the source electrode 32 described below, may be formed at the same time when the first gate electrode 51 and the second gate electrode 52 are formed, or may be separately formed after the first gate electrode 51 and the second gate electrode 52 are formed or after the source electrode 32 described below is formed.

Figure 95A:
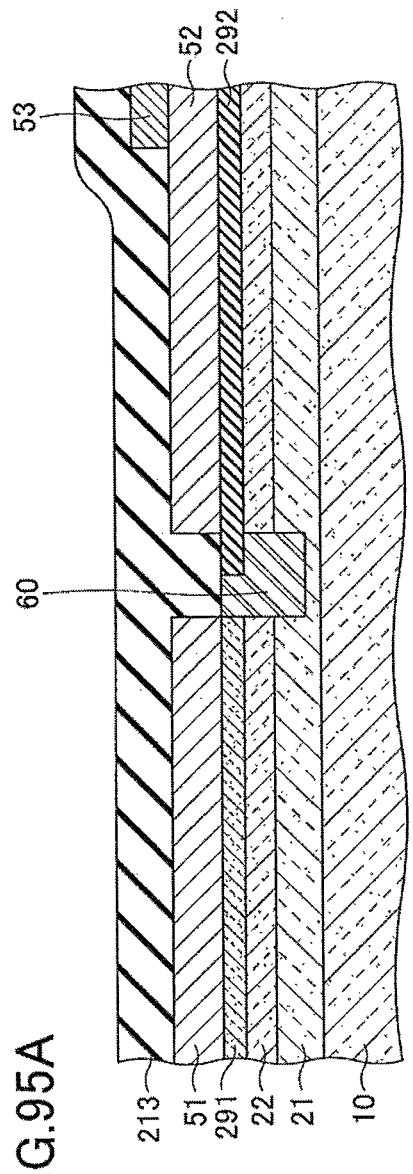
FIGS. 95A through 95C are fifth cross-sectional views illustrating the method of manufacturing the semiconductor apparatus according to the tenth embodiment.
Figure 95C:
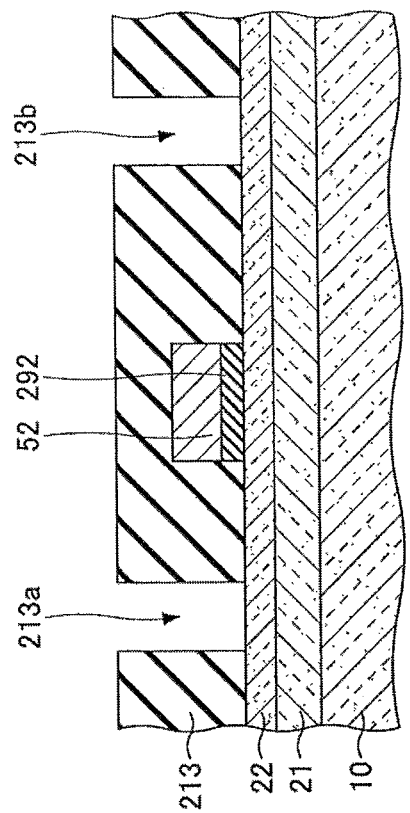
Figure 95B:
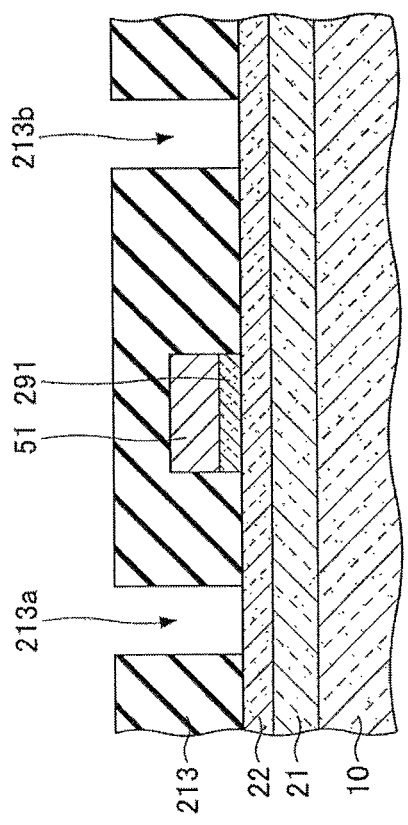

Next, as illustrated in FIGS. 95A through 95C, the interlayer insulation film 213 is formed on the electron supply layer 22, the first gate electrode 51, and the second gate electrode 52. Further, opening parts 213a and 213b are formed in the interlayer insulation film 213 in the regions where the source electrode 32 and the drain electrode 33 are to be formed. Here, FIG. 95A is a cross-sectional view of the semiconductor apparatus when cut along the dashed-dotted line 87A-87B of FIG. 87. FIG. 95B is a cross-sectional view of the semiconductor apparatus when cut along the dashed-dotted line 87C-87D of FIG. 87. FIG. 95C is a cross-sectional view of the semiconductor apparatus when cut along the dashed-dotted line 87E-87F of FIG. 87.

Specifically, first, the interlayer insulation film 213 is formed on the electron supply layer 22, the first gate electrode 51, and the second gate electrode 52 by forming a SiO$_2$ or SiN layer or a laminated layer of SiO$_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that, the resist pattern (not shown) is removed with an organic solvent or the like.

Next, as illustrated in FIG. 96A through 96C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 96A is a cross-sectional view of the semiconductor apparatus when cut along the dashed-dotted line 87A-87B of FIG. 87. FIG. 96B is a cross-sectional view of the semiconductor apparatus when cut along the dashed-dotted line 87C-87D of FIG. 87. FIG. 96C is a cross-sectional view of the semiconductor apparatus when cut along the dashed-dotted line 87E-87F of FIG. 87.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

Eleventh Embodiment

Semiconductor Apparatus

Figure 97:
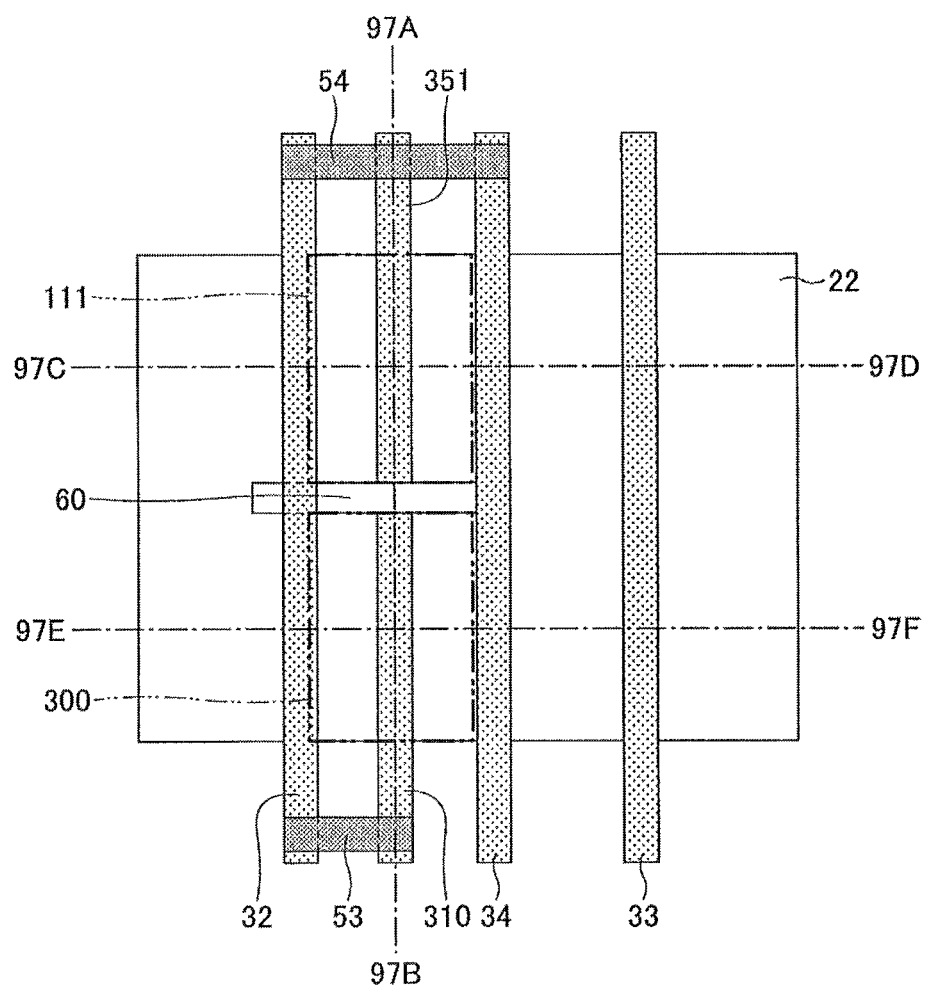
FIG. 97 is a top view of a semiconductor apparatus according to an eleventh embodiment.
Figure 98:
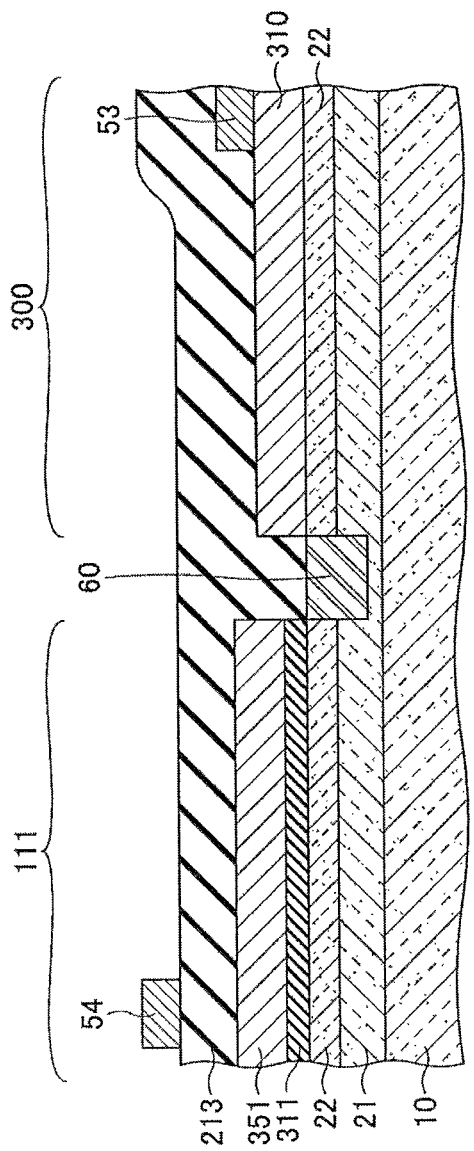
FIG. 98 is a first cross-sectional view of the semiconductor apparatus according to the eleventh embodiment.
Figure 99:
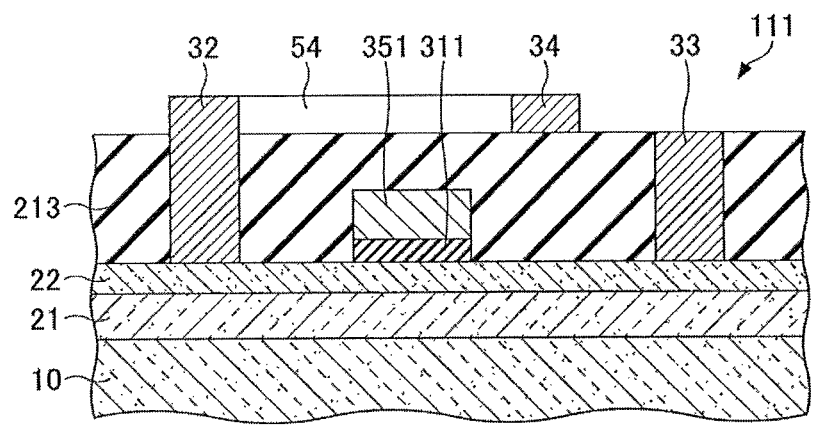
FIG. 99 is a second cross-sectional view of the semiconductor apparatus according to the eleventh embodiment.
Figure 100:
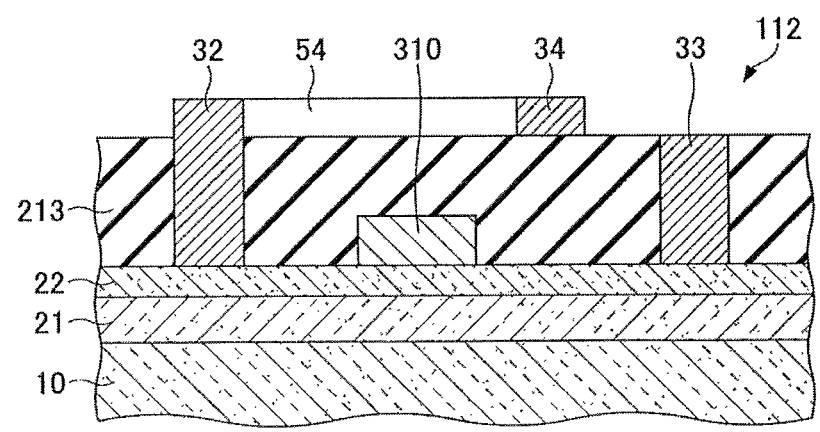
FIG. 100 is a third cross-sectional view of the semiconductor apparatus according to the eleventh embodiment.
Figure 101:
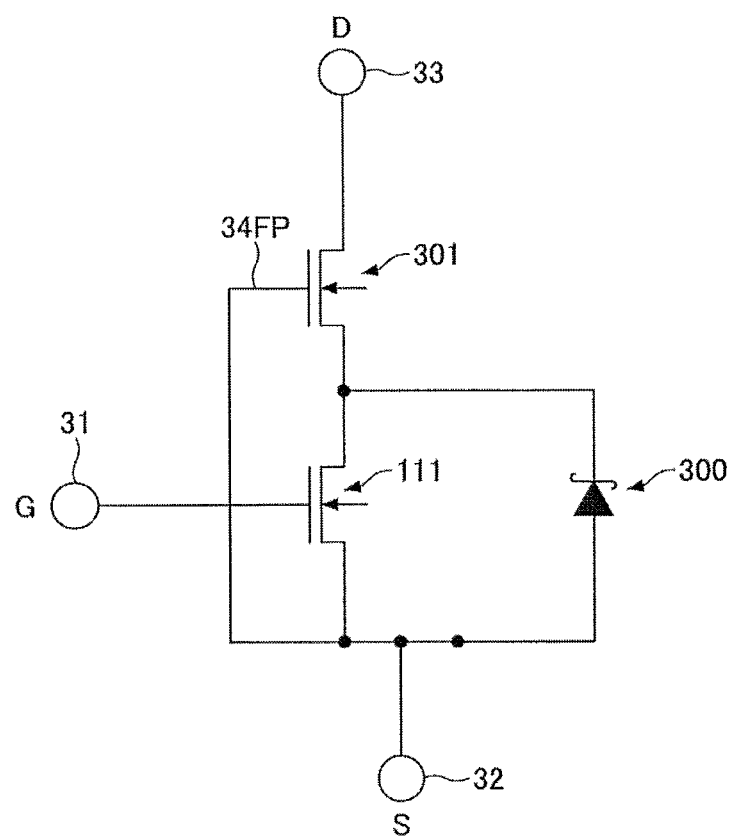
FIG. 101 is an equivalent circuit diagram of the semiconductor apparatus such as the HEMT using the nitride semiconductor according to the eleventh embodiment.

Next, a semiconductor apparatus according to an eleventh embodiment is described with reference to FIGS. 97 through 101. FIG. 97 is a top view of the semiconductor apparatus according to this embodiment. Further, in FIG. 97, the interlayer insulation films are not not shown. FIG. 98 is a cross-sectional view of the semiconductor apparatus when cut along the dashed-dotted line 97A-97B of FIG. 97. FIG. 99 is a cross-sectional view of the semiconductor apparatus when cut along the dashed-dotted line 97C-97D of FIG. 97. FIG. 100 is a cross-sectional view of the semiconductor apparatus when cut along the dashed-dotted line 87E-97F of FIG. 97. FIG. 101 is an equivalent circuit diagram of the semiconductor apparatus according to this embodiment.

As illustrated in FIG. 97, in the semiconductor apparatus according to this embodiment, the first transistor 111 and a Schottky diode 300 are formed. In the region where the first transistor 111 is formed, the gate electrode 351 is formed between the source electrode 32 and the field plate (FP) 34. Further, in the region where the Schottky diode 300 is formed, a diode electrode 310 is formed between the source electrode 32 and the field plate (FP) 34. The element isolation region 60 is formed between the gate electrode 351 and the diode electrode 310 by ion implantation of Ar or the like into a part of the electron transit layer 21 and the electron supply layer 22. Besides the forming method using the ion implantation of Ar or the like, the element isolation region 60 may have a structure formed by, for example, the nitride semiconductor layer in the region where the element isolation region 60 is to be formed is removed by etching and an insulation body is buried in the region that is removed by etching.

In the semiconductor apparatus according to this embodiment, a buffer layer (not shown) is formed on the substrate 10 made of silicon or the like. The electron transit layer 21 made of GaN or the like is formed on the buffer layer. The electron supply layer 22 made of AlGaN or the like is formed on the electron transit layer 21.

In a region where the first transistor 111 is to be formed, a gate insulation film 311 is formed in the region where the gate electrode 351 is to be formed. The gate electrode 351 is formed on the gate insulation film 311. Further, a diode electrode 310 is formed on the electron supply layer 22 in the region where the Schottky diode 300 is to be formed. Further, the source electrode 32 and the drain electrode 33 are formed on the electron supply layer 22. The interlayer insulation film 213 is formed on the electron supply layer 22, the gate electrode 351, and the diode electrode 310. The field plate (FP) 34 and the connection electrode 54 are formed in predetermined regions on the interlayer insulation film 213.

The substrate 10 is made of silicon, but may alternatively be made of SiC, sapphire or the like.

The gate insulation film 311 is made of a High-k material such as nitride silicon (SiN), silicon oxide (SiO), aluminum nitride (AlN), aluminum oxide ($Al_2O_3$), zirconium oxide ($ZrO_x$), or hafnium oxide ($HfO_x$). Specifically, the gate insulation film 311 is formed by using any one of the materials or by laminating some of the materials.

The gate electrode 351 and the diode electrode 310 are formed of, for example, TiN, TaN, W, Pt, Al, polysilicon, or amorphous silicon in which an impurity element is doped.

By doing this, in the semiconductor apparatus in this embodiment, as illustrated in FIG. 101, two transistors and one Schottky diode are formed. Namely, the formed two transistors are the first transistor 111 using the first gate electrode 351 as the gate electrode thereof and a second transistor 301 using the field plate (FP) 34 as the gate electrode thereof. The formed Schottky diode is the Schottky diode 300 using the diode electrode 310 and the field plate (FP) 34 as the both terminals.

In the semiconductor apparatus according to this embodiment, the diode electrode 310 is connected to the source electrode 32 through the connection electrode 53. Further, the field plate (FP) 34 is connected to the source electrode 32 through the connection electrode 54, so that voltage equal to the voltage applied to the source electrode 32 is applied to the field plate (FP) 34.

In the semiconductor apparatus according to this embodiment, as illustrated in FIG. 97, the gate electrode 351 and the diode electrode 310 are formed between the source electrode 32 and the drain electrode 33. The field plate (FP) 34 is formed between the gate electrode 351 and the diode electrode 310, and the drain electrode 33. Further, the element isolation region 60 is formed between the gate electrode 351 and the diode electrode 310

Method of Manufacturing Semiconductor Apparatus

Next, a method of manufacturing the semiconductor apparatus according to this embodiment is described with reference to FIGS. 102A through 107C.

Figure 102A:
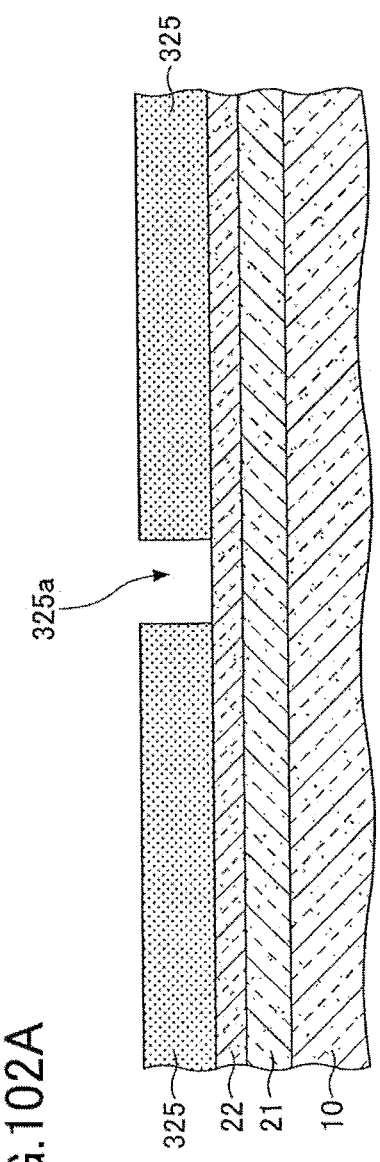
FIGS. 102A through 102C are first cross-sectional views illustrating a method of manufacturing the semiconductor apparatus according to the eleventh embodiment.
Figure 102C:
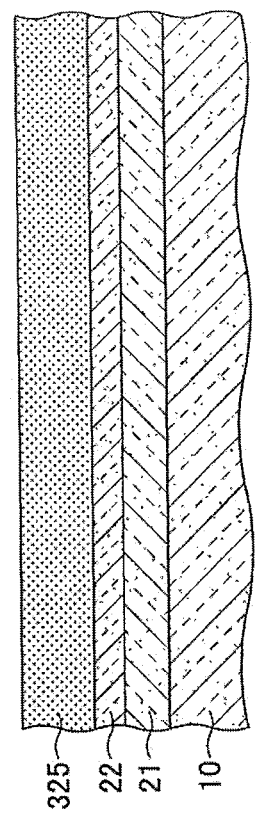
Figure 102B:
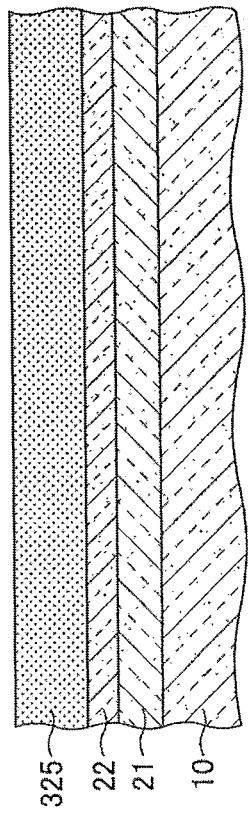

First, as illustrated in FIGS. 102A through 102C, a nitride semiconductor layer is formed on the substrate 10 made of silicon or the like, and a resist pattern 325 is formed on a predetermined region of the nitride semiconductor layer. Here, FIG. 102A is a cross-sectional view of the semiconductor apparatus when cut along the dashed-dotted line 97A-97B of FIG. 97. FIG. 102B is a cross-sectional view of the semiconductor apparatus when cut along the dashed-dotted line 97C-97D of FIG. 97. FIG. 102C is a cross-sectional view of the semiconductor apparatus when cut along the dashed-dotted line 97E-97F of FIG. 97.

Specifically, nitride semiconductor layers such as the buffer layer (not shown) made of AlN, AlGaN or the like, the electron transit layer 21, the electron supply layer 22 and the like are laminated by epitaxial growth on the substrate 10. The electron transit layer 21 is made of GaN and has a film thickness of approximately 1 μm. The electron supply layer 22 is made of AlGaN, more specifically $Al_xGa_{1-x}N$ where x value is in a range of 0.15 to 0.25, so that the film thickness thereof is in a range of 15 nm to 25 nm.

The resist pattern 325 is formed by applying a photoresist on the electron supply layer 22 and exposing and developing the photoresist by an exposure device. The resist pattern 325 formed described above has an opening part 325a in the region where the element isolation region 60 is to be formed.

Figure 103A:
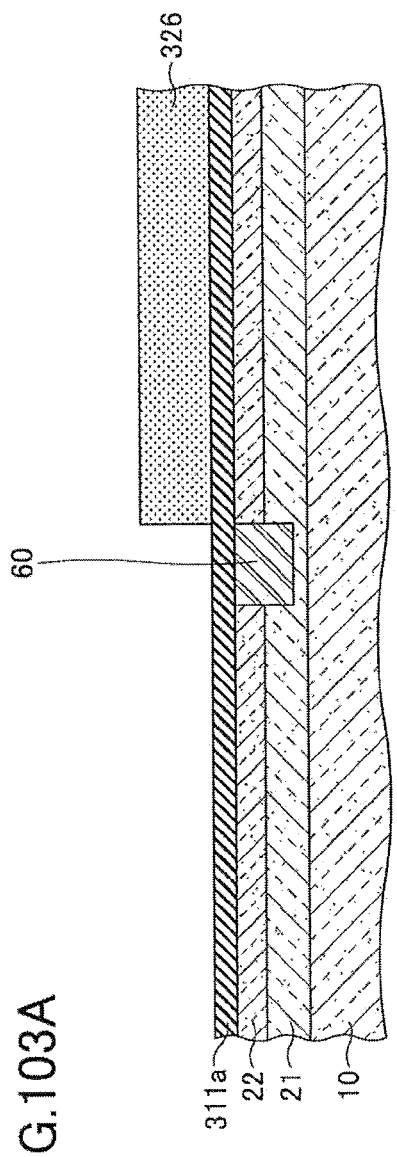
FIGS. 103A through 103C are second cross-sectional views illustrating the method of manufacturing the semiconductor apparatus according to the eleventh embodiment.
Figure 103C:
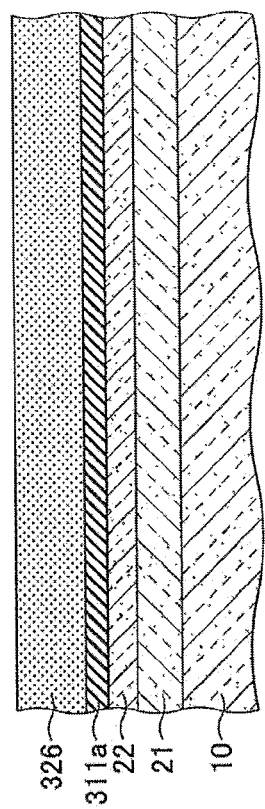
Figure 103B:
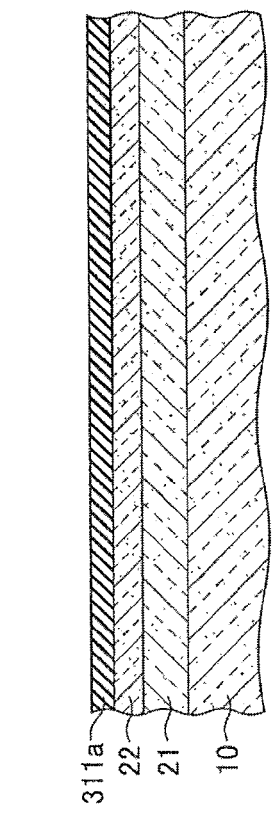

Next, as illustrated in FIGS. 103A through 103C, the element isolation region 60 is formed in the nitride semiconductor layer at the opening part 325a of the resist pattern 325. Further, the resist pattern 325 is removed, an insulation film 311a for forming the gate insulation film 311 is formed, and a resist pattern 326 is formed. Here, FIG. 103A is a cross-sectional view of the semiconductor apparatus when cut along the dashed-dotted line 97A-97B of FIG. 97. FIG. 103B is a cross-sectional view of the semiconductor apparatus when cut along the dashed-dotted line 97C-97D of FIG. 97. FIG. 103C is a cross-sectional view of the semiconductor apparatus when cut along the dashed-dotted line 97E-97F of FIG. 97.

Specifically, the element isolation region 60 is formed by performing ion implantation of Ar ions, B ions or the like at a predetermined acceleration voltage into the nitride semiconductor layer at the opening part 325a of the resist pattern 325, so as to have a predetermined concentration of the doped ions. By doing this, the element isolation region 60 is formed between the gate electrode 351 and the diode electrode 310. For example, the element isolation region 60 to be formed may be formed by ion implantation of Ar, B or the like performed on a part of the electron transit layer 21 and the electron supply layer 22. The resist pattern 325 is removed with an organic solvent or the like.

The insulation film 311a for forming the gate insulation film 311 is formed by forming SiN or the like by CVD or ALD. After that, the resist pattern 326 is formed in the region where the first transistor 111 is to be formed by applying a photoresist on the insulation film 311a and exposing and developing the photoresist by an exposure device.

Next, as illustrated in FIGS. 104A through 104C, the insulation film 311a is removed in the region where the resist pattern 326 is not formed. Further, after the resist pattern 326 is removed with an organic solvent or the like, a metal film 327 for forming the gate electrode 351 and the diode electrode 310 on the insulation film 311a and the electron supply layer 22, and a resist pattern 328 is formed on the metal film 327. Here, FIG. 104A is a cross-sectional view of the semiconductor apparatus when cut along the dashed-dotted line 97A-97B of FIG. 97. FIG. 104B is a cross-sectional view of the semiconductor apparatus when cut along the dashed-dotted line 97C-97D of FIG. 97. FIG. 104C is a cross-sectional view of the semiconductor apparatus when cut along the dashed-dotted line 97E-97F of FIG. 97.

By removing the insulation film 311a in the region where the resist pattern 326 is not formed, the insulation film 311a remains in the region where the first transistor 111 is to be formed. The insulation film 311a in the region where the resist pattern 326 is not formed may be removed by dry etching such as RIE or wet etching.

After the resist pattern 326 is removed, the metal film 327 for forming the gate electrode 351 and the diode electrode 310 on the insulation film 311a and the electron supply layer 22 is formed by vacuum deposition or sputtering. After that, the resist pattern 328 is formed in the regions where the gate electrode 351 and the diode electrode 310 are to be formed. The resist pattern 328 is formed in the regions where the gate electrode 351 and the diode electrode 310 are to be formed by applying a photoresist on the electron supply layer 22 and the insulation film 311a and exposing and developing the photoresist by an exposure device.

Next, as illustrated in FIGS. 105A through 105C, the gate electrode 351 and the diode electrode 310 are formed by removing the metal film 327 and the insulation film 311a in the region where the resist pattern 328 is not formed and removing the resist pattern 328 with an organic solvent or the like. Here, FIG. 105A is a cross-sectional view of the semiconductor apparatus when cut along the dashed-dotted line 97A-97B of FIG. 97. FIG. 105B is a cross-sectional view of the semiconductor apparatus when cut along the dashed-dotted line 97C-97D of FIG. 97. FIG. 105C is a cross-sectional view of the semiconductor apparatus when cut along the dashed-dotted line 97E-97F of FIG. 97.

Specifically, the gate electrode 351 and the diode electrode 310 are formed by removing the metal film 327 and the insulation film 311a in the region where the resist pattern 328 is not formed by RIE or the like to expose the surface of the electron supply layer 22. By doing this, a part where the gate insulation film 311 and the gate electrode 351 are laminated and the diode electrode 310 are formed based on the remaining metal film 327 and the insulation film 311a.

By doing this, the gate electrode 351 is formed on the gate insulation film 311 in the region where the first transistor 111 is to be formed, and the diode electrode 310 is formed in the region where the Schottky diode 300 is to be formed. Further, in this embodiment, the connection electrode 53, which connects the diode electrode 310 with the source electrode 32 described below, may be formed at the same time when the gate electrode 351 and the diode electrode 310 are formed, or may be separately formed after the gate electrode 351 and the diode electrode 310 are formed or after the source electrode 32 described below is formed.

Figure 106A:
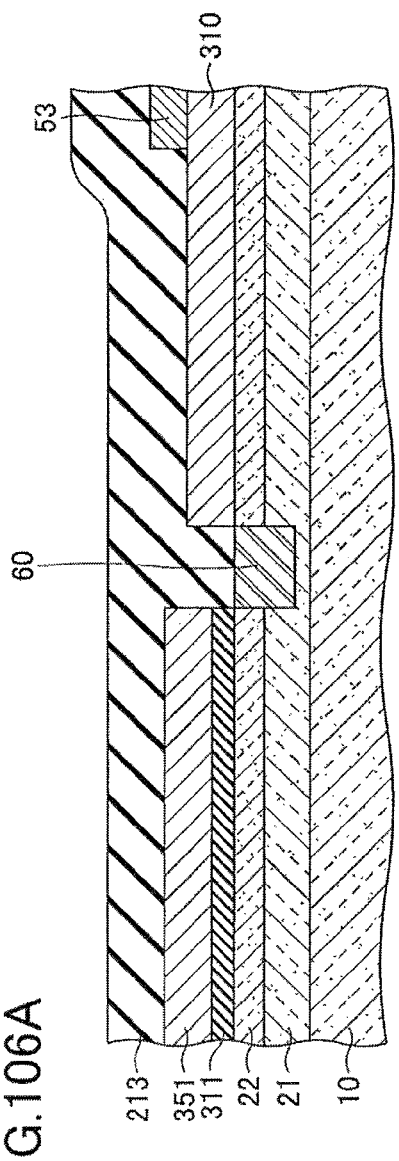
FIGS. 106A through 106C are fifth cross-sectional views illustrating the method of manufacturing the semiconductor apparatus according to the eleventh embodiment.
Figure 106B:
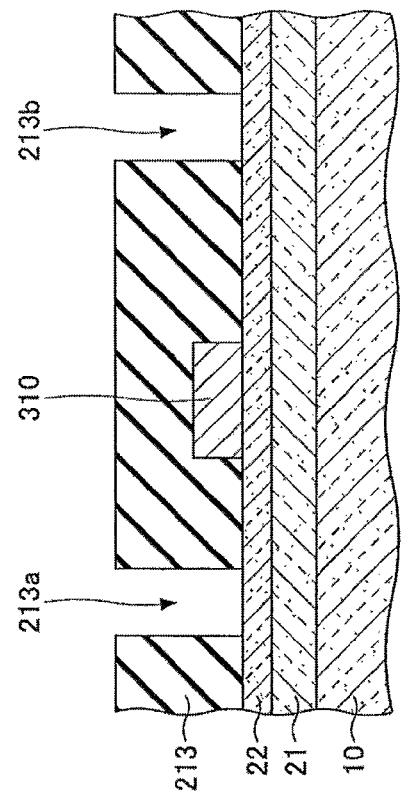
Figure 106C:
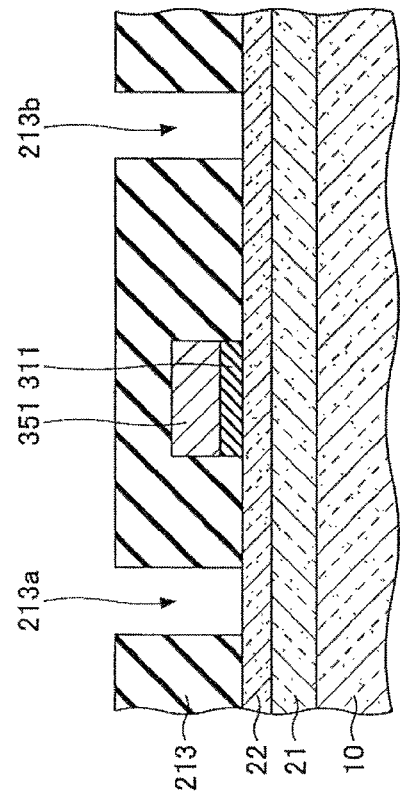

Next, as illustrated in FIGS. 106A through 106C, the interlayer insulation film 213 is formed on the electron supply layer 22, the gate electrode 351, and the diode electrode 310. Further, opening parts 213a and 213b are formed in the interlayer insulation film 213 in the regions where the source electrode 32 and the drain electrode 33 are to be formed. Here, FIG. 106A is a cross-sectional view of the semiconductor apparatus when cut along the dashed-dotted line 97A-97B of FIG. 97. FIG. 106B is a cross-sectional view of the semiconductor apparatus when cut along the dashed-dotted line 97C-97D of FIG. 97. FIG. 106C is a cross-sectional view of the semiconductor apparatus when cut along the dashed-dotted line 97E-97F of FIG. 97.

Specifically, first, the interlayer insulation film 213 is formed on the electron supply layer 22, the gate electrode 351, and the diode electrode 310 by forming a SiO$_2$ or SiN layer or a laminated layer of SiO$_2$ and SiN by CVD or ALD. After that, a resist pattern (not shown) is formed having opening parts at the regions where openings 213a and 213b in the interlayer insulation film 213 are to be formed. The interlayer insulation film 213 at the opening parts of the resist pattern is removed by RIE or the like. As described above, the openings 213a and 213b are formed in the interlayer insulation film 213 by removing the interlayer insulation film 213 at the openings of the resist pattern and exposing the surface of the electron supply layer 22. After that, the resist pattern (not shown) is removed with an organic solvent or the like.

Figure 107A:
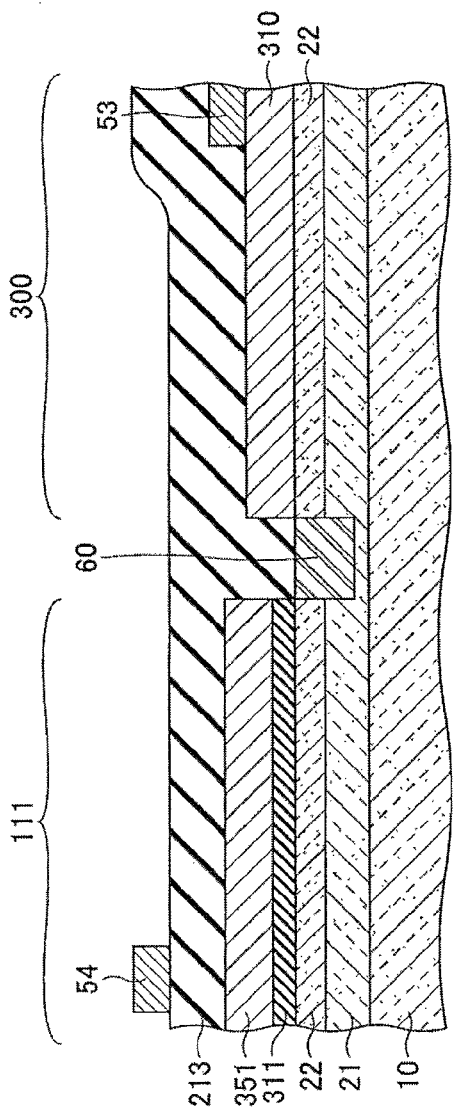
FIGS. 107A through 107C are sixth cross-sectional views illustrating the method of manufacturing the semiconductor apparatus according to the eleventh embodiment.
Figure 107C:
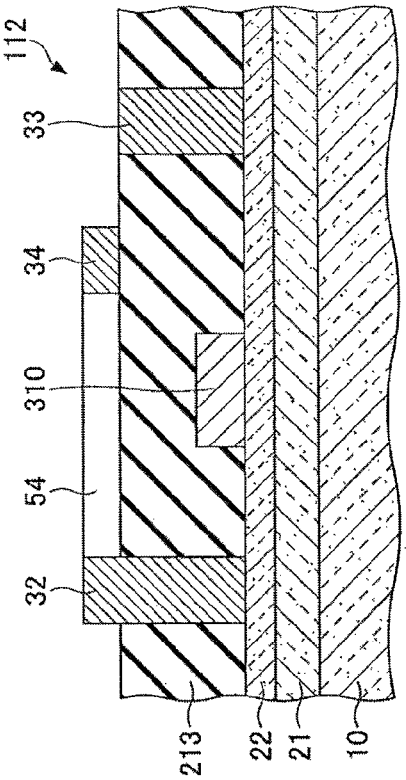
Figure 107B:
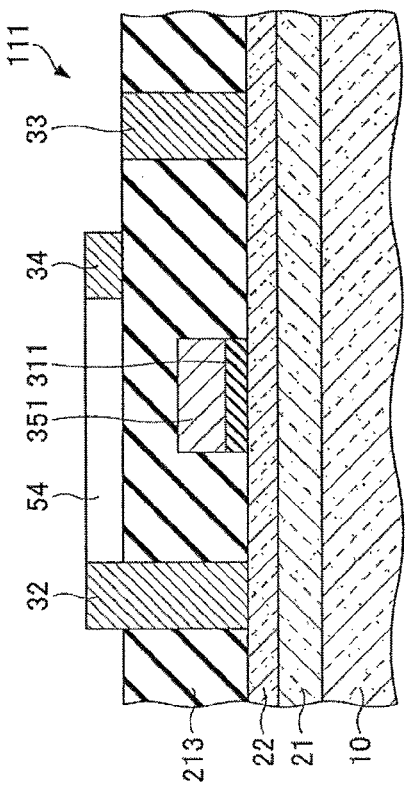

Next, as illustrated in FIG. 107A through 107C, the source electrode 32 and the drain electrode 33 are formed at the openings 213a and 213b formed in the interlayer insulation film 213. Further, the field plate (FP) 34 and the connection electrode 54 are formed at predetermined positions of the interlayer insulation film 213. Here, FIG. 107A is a cross-sectional view of the semiconductor apparatus when cut along the dashed-dotted line 97A-97B of FIG. 97. FIG. 107B is a cross-sectional view of the semiconductor apparatus when cut along the dashed-dotted line 97C-97D of FIG. 97. FIG. 107C is a cross-sectional view of the semiconductor apparatus when cut along the dashed-dotted line 97E-97F of FIG. 97.

Specifically, first, a metal film for forming the source electrode 32, the drain electrode 33, the field plate (FP) 34, and the connection electrode 54 is formed by CVD or the like so as to bury the openings 213a and 213b formed in the interlayer insulation film 213. The formed metal film may be, for example, a Ti/TiN/TaN/Al multilayer film. After that, a resist pattern (not shown) is formed in the regions where the source electrode 32, the drain electrode 33, the field plate (FP) 34, and the connection electrode 54 are to be formed, by applying a photoresist on the formed metal film and exposing and developing the photoresist by an exposure device. After that, the source electrode 32, the drain electrode 33, the field plate (FP) 34, and the connection electrode 54 are formed by removing the metal film in the region where the resist pattern is not formed by RIE or the like. The source electrode 32 and the field plate (FP) 34 formed as described above are connected to each other with the connection electrode 54. The resist pattern (not shown) is removed with an organic solvent or the like.

As described above, the semiconductor apparatus according to this embodiment is manufactured. The contents other than those described above are similar to those in the first and the second embodiments.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of superiority or inferiority of the invention. Although the embodiments of the present inventions have been described in detail, it is to be understood that various changes, substitutions, and alterations could be made hereto without departing from the spirit and scope of the invention.

What is claimed is:
1. A semiconductor apparatus comprising:
a substrate;
a first semiconductor layer formed on the substrate and formed of a nitride semiconductor;
a second semiconductor layer formed on the first semiconductor layer and formed of a nitride semiconductor;
a first gate electrode and a second gate electrode, a source electrode, and a drain electrode formed on the second semiconductor layer;
an interlayer insulation film formed on the second semiconductor layer; and
a field plate formed on the interlayer insulation film, wherein the first gate electrode and the second gate electrode are formed between a region where the source electrode is formed and a region where the field plate is formed, wherein an element isolation region is formed in the first and the second semiconductor layers between the first and the second gate electrodes, thereby forming, as part of the semiconductor apparatus,
- a first high electron mobility transistor (HEMT) having the first gate electrode as a gate electrode thereof,
- a second HEMT having the second gate electrode as a gate electrode thereof, the source electrode being common between the first HEMT and the second HEMT, and
- a third transistor having the field plate as a gate electrode thereof, wherein a gate recess is formed under the first gate electrode by partially removing the second semiconductor layer, the gate recess causing a gate threshold value voltage of the first HEMT to be greater than a gate threshold value voltage of the second HEMT, wherein the source electrode is electrically connected to the field plate to cause a gate voltage of the third transistor to be the same as a source voltage of the first HEMT and the second HEMT, and wherein the second gate electrode is electrically connected to the source electrode to cause a gate voltage of the second HEMT to be the same as the source voltage.

2. A semiconductor apparatus according to claim 1, further comprising:
a gate insulation film formed in the gate recess and between the second gate electrode and the second semiconductor layer.

3. A semiconductor apparatus according to claim 1, further comprising:
a p-type layer to which a p-type impurity element is doped formed between the first gate electrode and the second semiconductor layer.

4. A semiconductor apparatus according to claim 1, further comprising:
a p-type layer to which a p-type impurity element is doped formed between the first gate electrode and the second semiconductor layer and between the second gate electrode and the second semiconductor layer,
wherein the p-type layer formed between the first gate electrode and the second semiconductor layer is thicker than the p-type layer formed between the second gate electrode and the second semiconductor layer.

5. A semiconductor apparatus according to claim 1,
wherein the first gate electrode is made of a material having a higher work function than the work function of a material of the second gate electrode.

6. A semiconductor apparatus according to claim 5, further comprising:
a p-type layer to which a p-type impurity element is doped formed between the first gate electrode and the second semiconductor layer and between the second gate electrode and the second semiconductor layer.

7. A semiconductor apparatus according to claim 5, further comprising:
a gate insulation film formed between the first gate electrode and the second semiconductor layer and between the second gate electrode and the second semiconductor layer.

8. A semiconductor apparatus according to claim 1, further comprising:
a gate insulation film formed between the first gate electrode and the second semiconductor layer and between the second gate electrode and the second semiconductor layer,
wherein the gate insulation film formed between the first gate electrode and the second semiconductor layer is thinner than the gate insulation film formed between the second gate electrode and the second semiconductor layer.

9. A semiconductor apparatus according to claim 1, further comprising:
a gate insulation film formed between the first gate electrode and the second semiconductor layer and between the second gate electrode and the second semiconductor layer,
wherein the gate insulation film formed between the first gate electrode and the second semiconductor layer is formed of a material having a higher relative permittivity than the relative permittivity of the material of the gate insulation film formed between the second gate electrode and the second semiconductor layer.

10. A semiconductor apparatus according to claim 1, further comprising:
a p-type layer to which a p-type impurity element is doped formed between the first gate electrode and the second semiconductor layer; and
a gate insulation film formed between the second gate electrode and the second semiconductor layer.

* * * * *